(12) United States Patent
Suzuki et al.

(10) Patent No.: US 8,254,168 B2
(45) Date of Patent: Aug. 28, 2012

(54) NONVOLATILE SEMICONDUCTOR MEMORY DEVICE AND WRITE METHOD FOR THE SAME

(75) Inventors: Yuya Suzuki, Yokohama (JP); Rieko Tanaka, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 178 days.

(21) Appl. No.: 12/820,342

(22) Filed: Jun. 22, 2010

(65) Prior Publication Data

US 2010/0322012 A1 Dec. 23, 2010

(30) Foreign Application Priority Data

Jun. 23, 2009 (JP) ................................. 2009-148870

(51) Int. Cl.
*G11C 11/34* (2006.01)

(52) U.S. Cl. ......... 365/185.03; 365/185.12; 365/185.17; 365/185.18; 365/185.21; 365/185.24; 365/185.33

(58) Field of Classification Search ............. 365/185.03, 365/185.12, 185.17, 185.18, 185.21, 185.24, 365/185.33

See application file for complete search history.

(56) References Cited

U.S. PATENT DOCUMENTS

| | | | | |
|---|---|---|---|---|
| 5,583,809 | A * | 12/1996 | Noguchi et al. | 365/185.33 |
| 6,363,010 | B2 * | 3/2002 | Tanaka et al. | 365/185.03 |
| 6,850,435 | B2 * | 2/2005 | Tanaka | 365/185.03 |
| 6,859,394 | B2 | 2/2005 | Matsunaga et al. | |
| 6,885,583 | B2 * | 4/2005 | Tanaka | 365/185.17 |
| 7,088,631 | B2 * | 8/2006 | Honda | 365/185.21 |
| 7,388,790 | B2 * | 6/2008 | Maejima et al. | 365/185.17 |
| 7,405,970 | B2 | 7/2008 | Tanaka et al. | |
| 7,539,067 | B2 * | 5/2009 | Maejima | 365/189.17 |
| 7,564,713 | B2 * | 7/2009 | Morooka | 365/185.03 |
| 7,613,048 | B2 * | 11/2009 | Inoue et al. | 365/185.24 |
| 7,616,502 | B2 * | 11/2009 | Iwai | 365/185.17 |
| 7,643,350 | B2 * | 1/2010 | Sugawara | 365/185.24 |
| 7,808,821 | B2 * | 10/2010 | Ogawa et al. | 365/185.03 |
| 7,843,723 | B2 * | 11/2010 | Shibata | 365/185.03 |
| 7,907,446 | B2 * | 3/2011 | Shimizu et al. | 365/185.24 |
| 7,929,352 | B2 * | 4/2011 | Shibata | 365/185.17 |
| 7,944,756 | B2 * | 5/2011 | Ueno | 365/185.24 |
| 8,009,470 | B2 * | 8/2011 | Iwai et al. | 365/185.03 |
| 8,064,270 | B2 * | 11/2011 | Maejima | 365/189.17 |

FOREIGN PATENT DOCUMENTS

JP 2003-196988 7/2003

* cited by examiner

*Primary Examiner* — Trong Phan
(74) *Attorney, Agent, or Firm* — Oblon, Spivak, McClelland, Maier & Neustadt, L.L.P.

(57) ABSTRACT

According to one embodiment, a semiconductor device includes memory cells, bit lines, a write circuit, and sense amplifiers. The bit lines are connected to the memory cells. The sense amplifiers are configured to bias the bit line to which the selected memory cell is connected, to a first voltage until the threshold of the selected memory cell reaches the value of a first write state. Then, when the threshold of the selected memory cell reaches the value of the first write state, the bit line is biased to a second voltage higher than the first voltage. When the threshold of the selected memory cell reaches the value of a second write state, the bit line is continuously biased to a third voltage higher than the second voltage. Bit lines connected to unselected memory cells corresponding to the memory cells other than the selected one are biased to the third voltage.

21 Claims, 35 Drawing Sheets

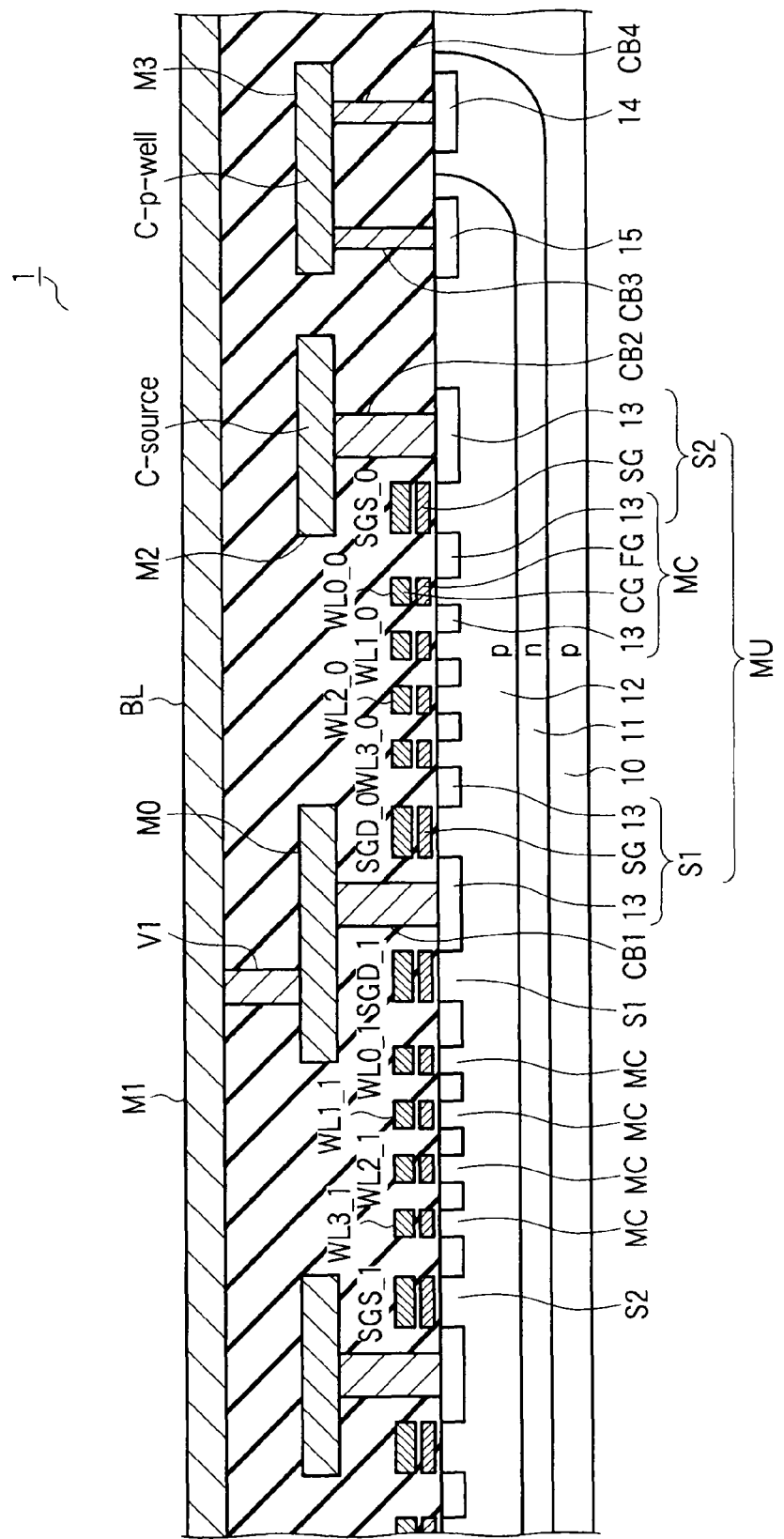
F I G. 4

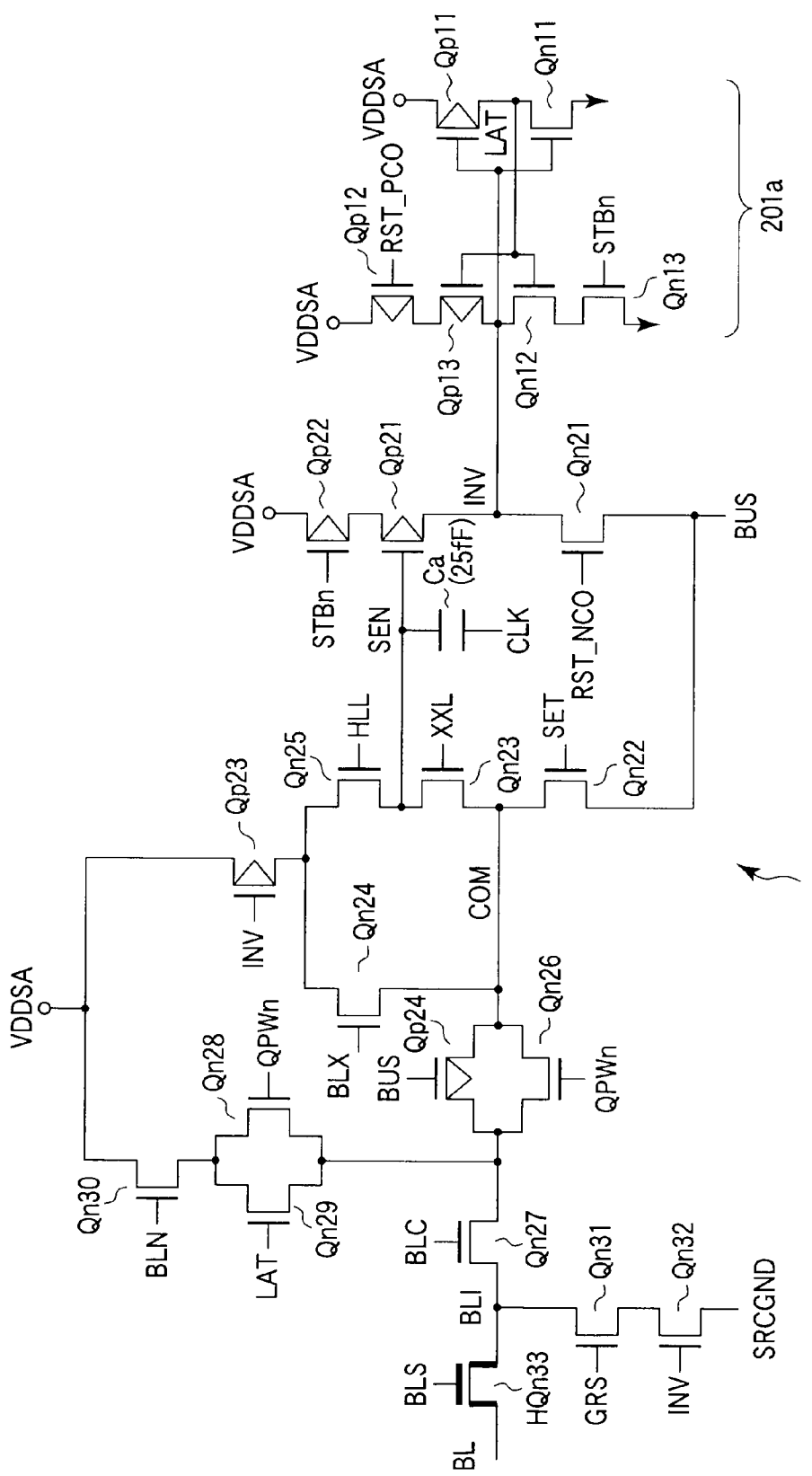
F I G. 7

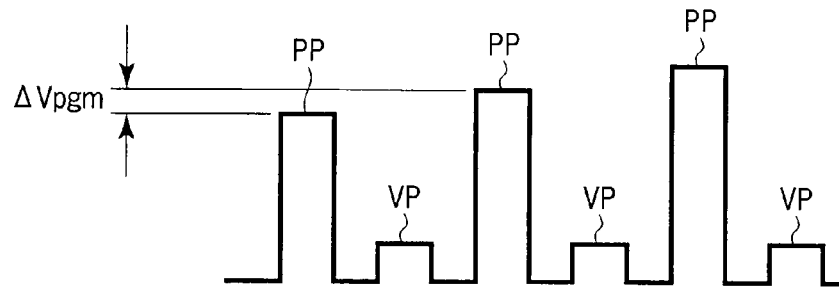
FIG. 10
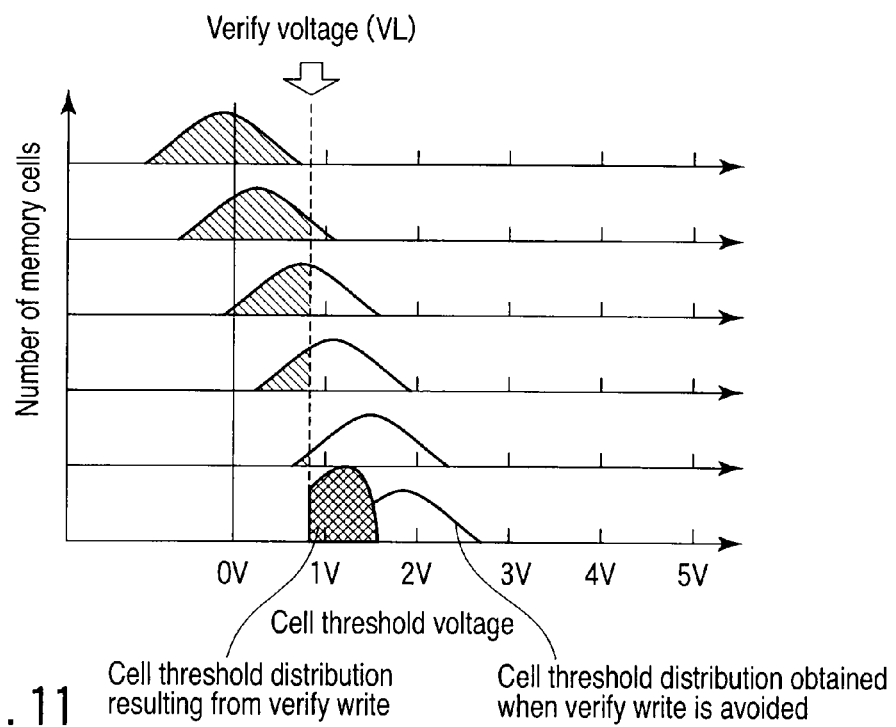
FIG. 11 Cell threshold distribution resulting from verify write  Cell threshold distribution obtained when verify write is avoided
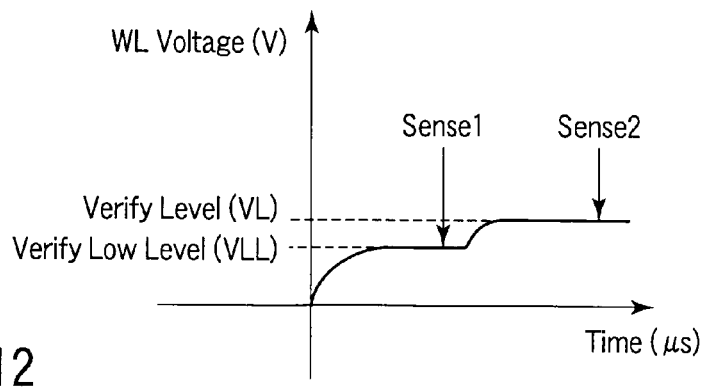
FIG. 12

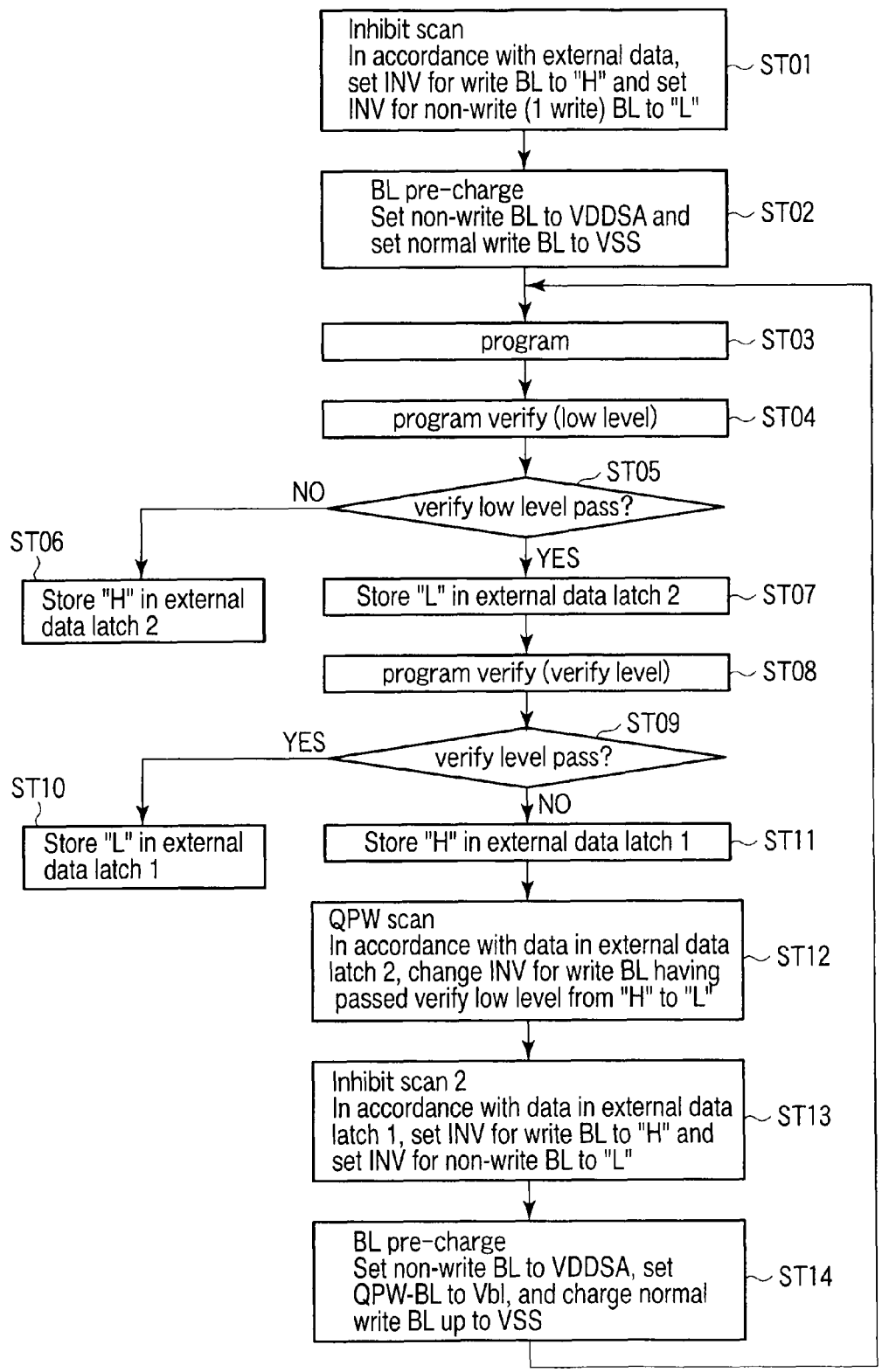
F I G. 15

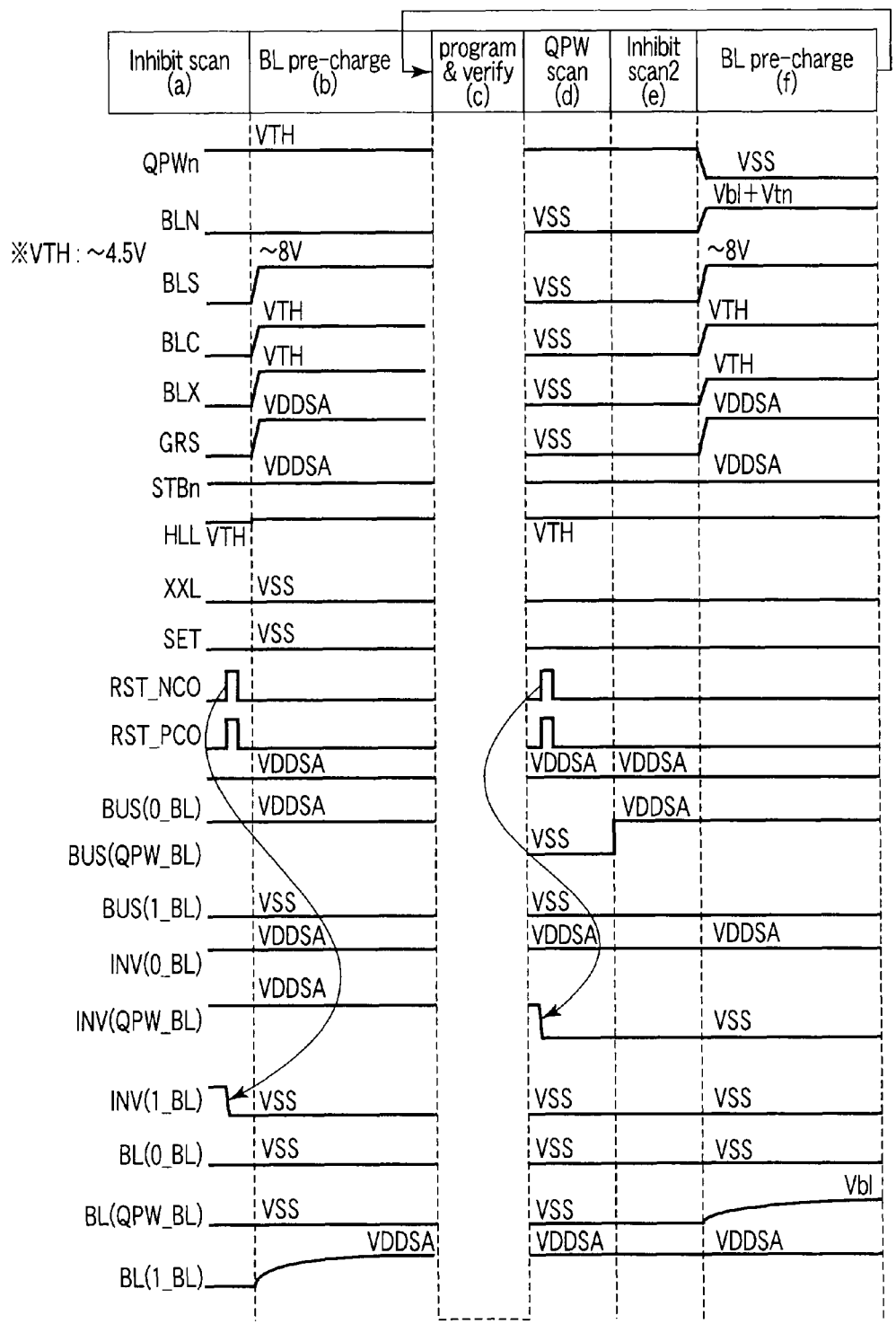
F I G. 16

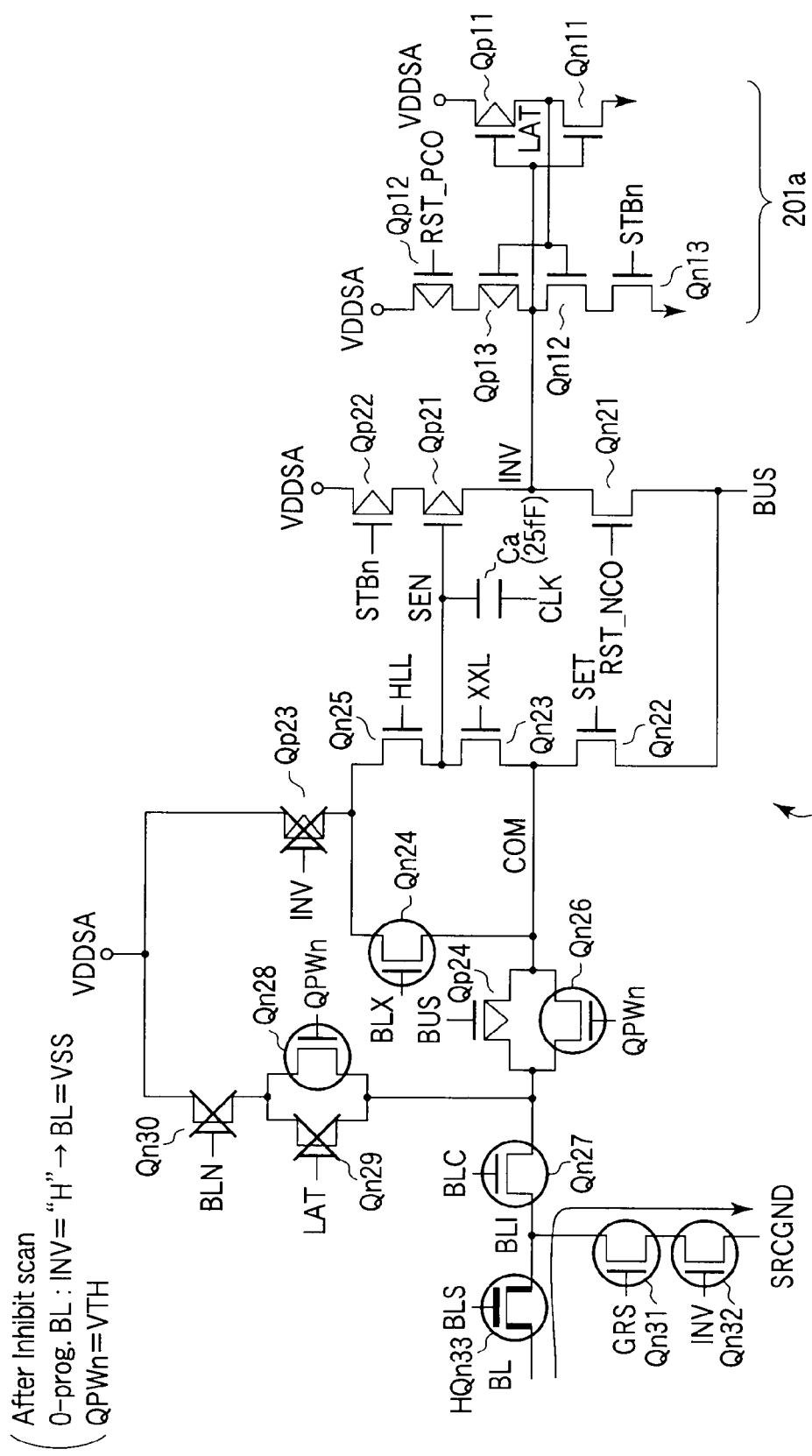
F I G. 18

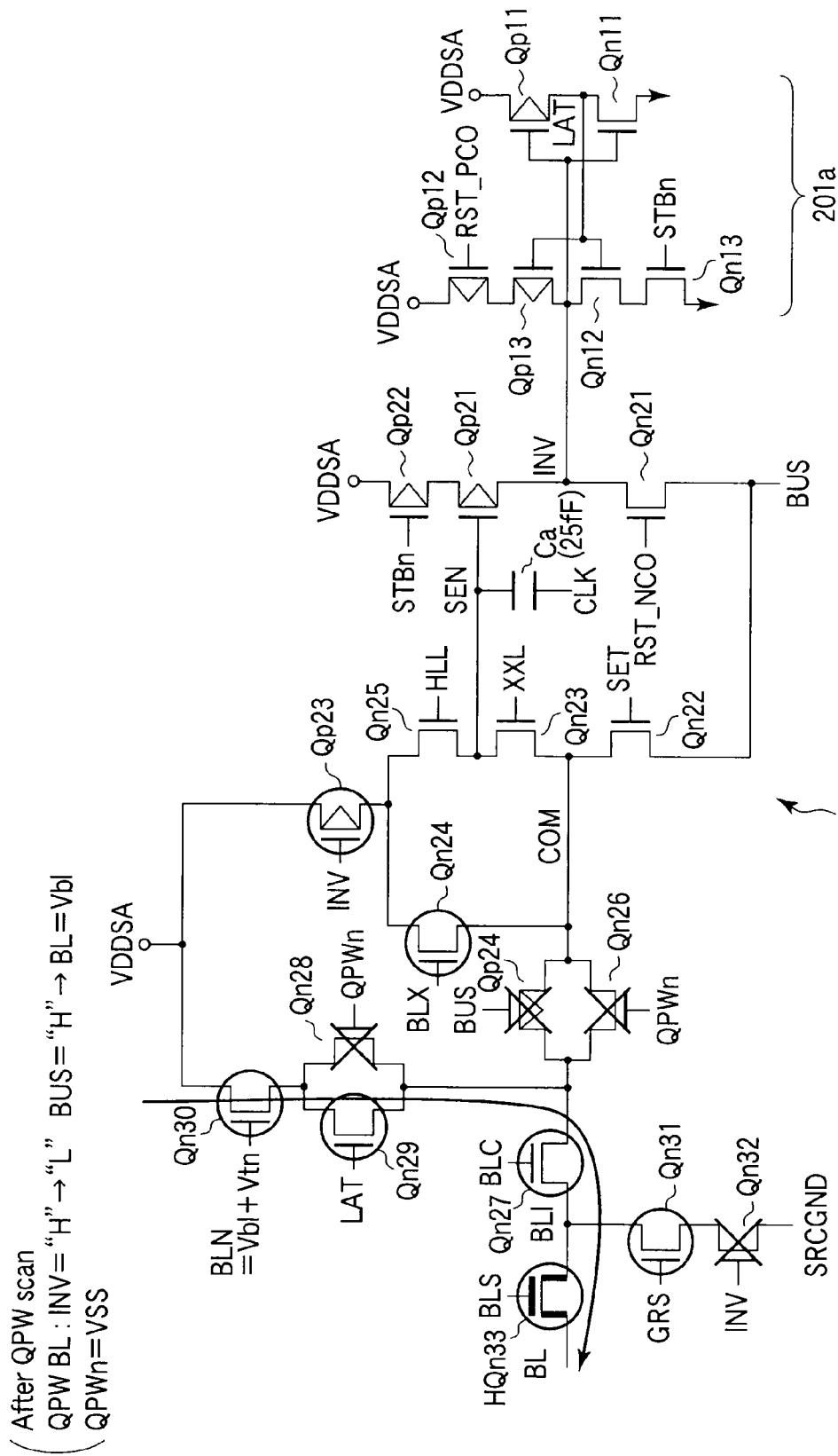
F I G. 19

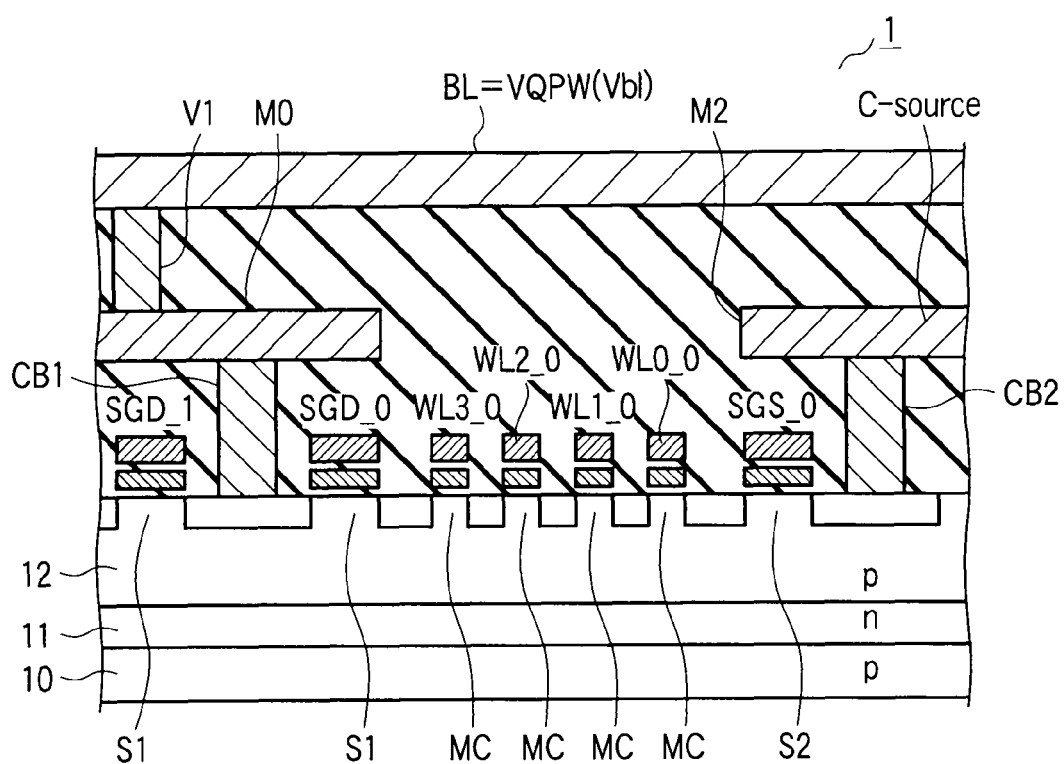
F I G. 20

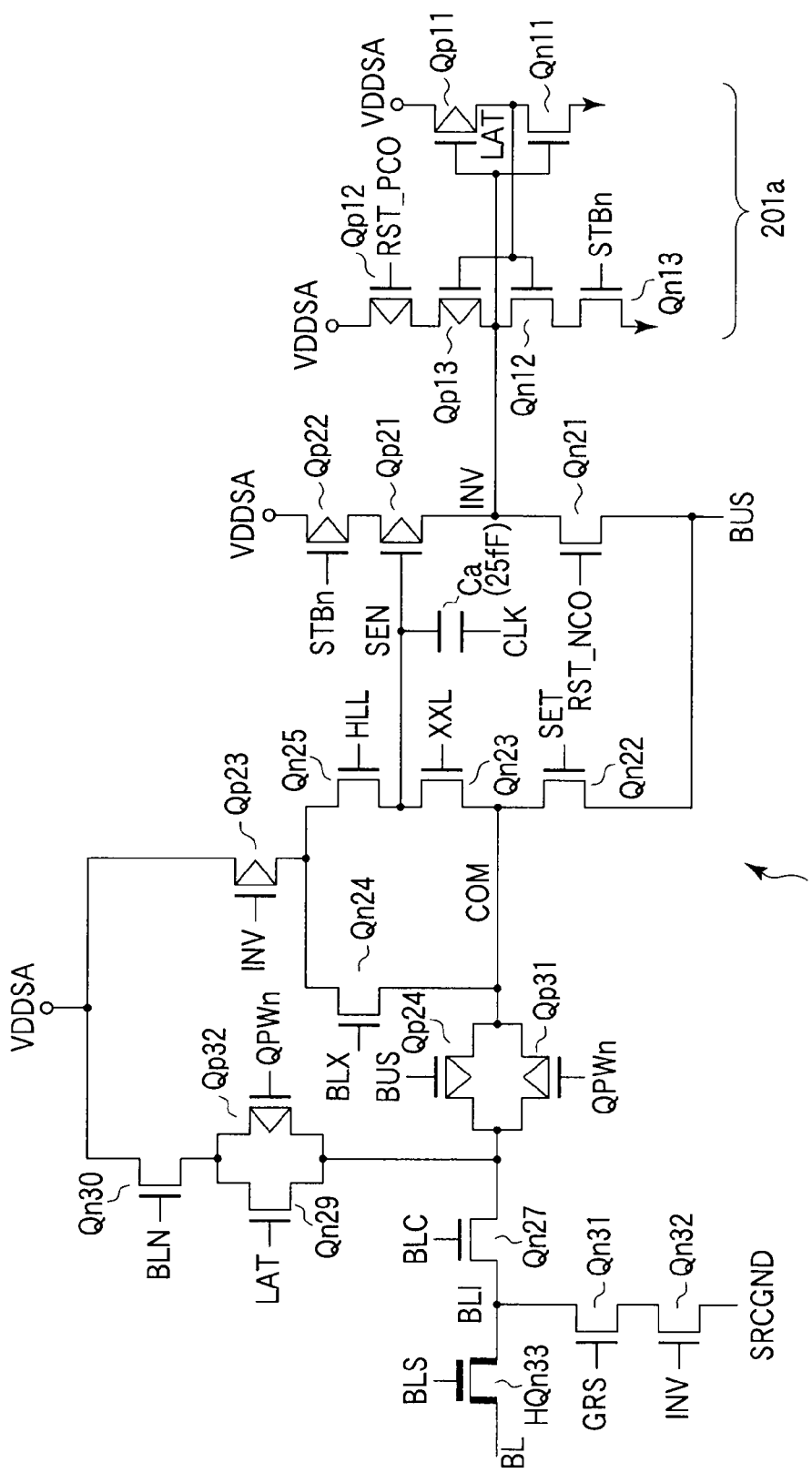
F I G. 23

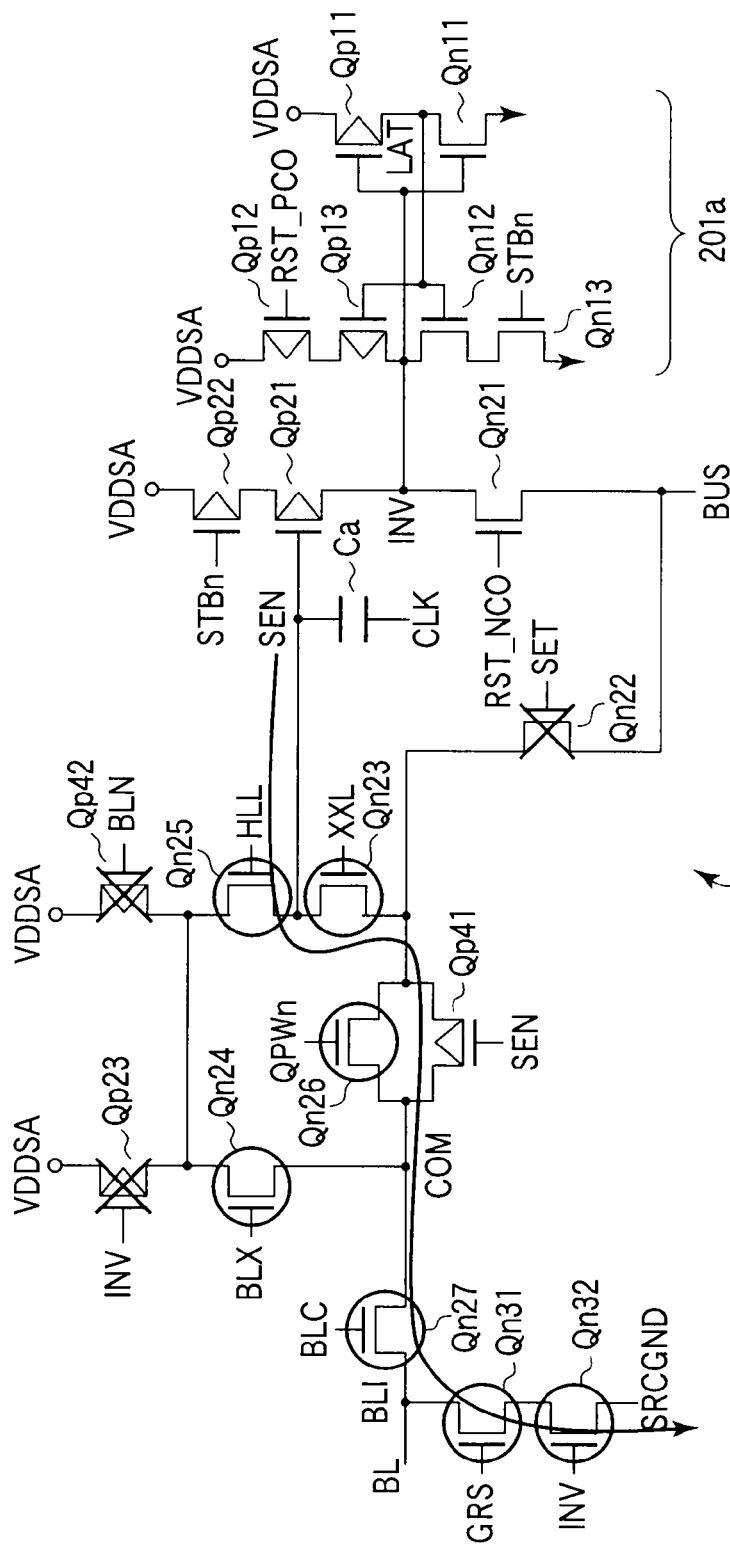
F I G. 26

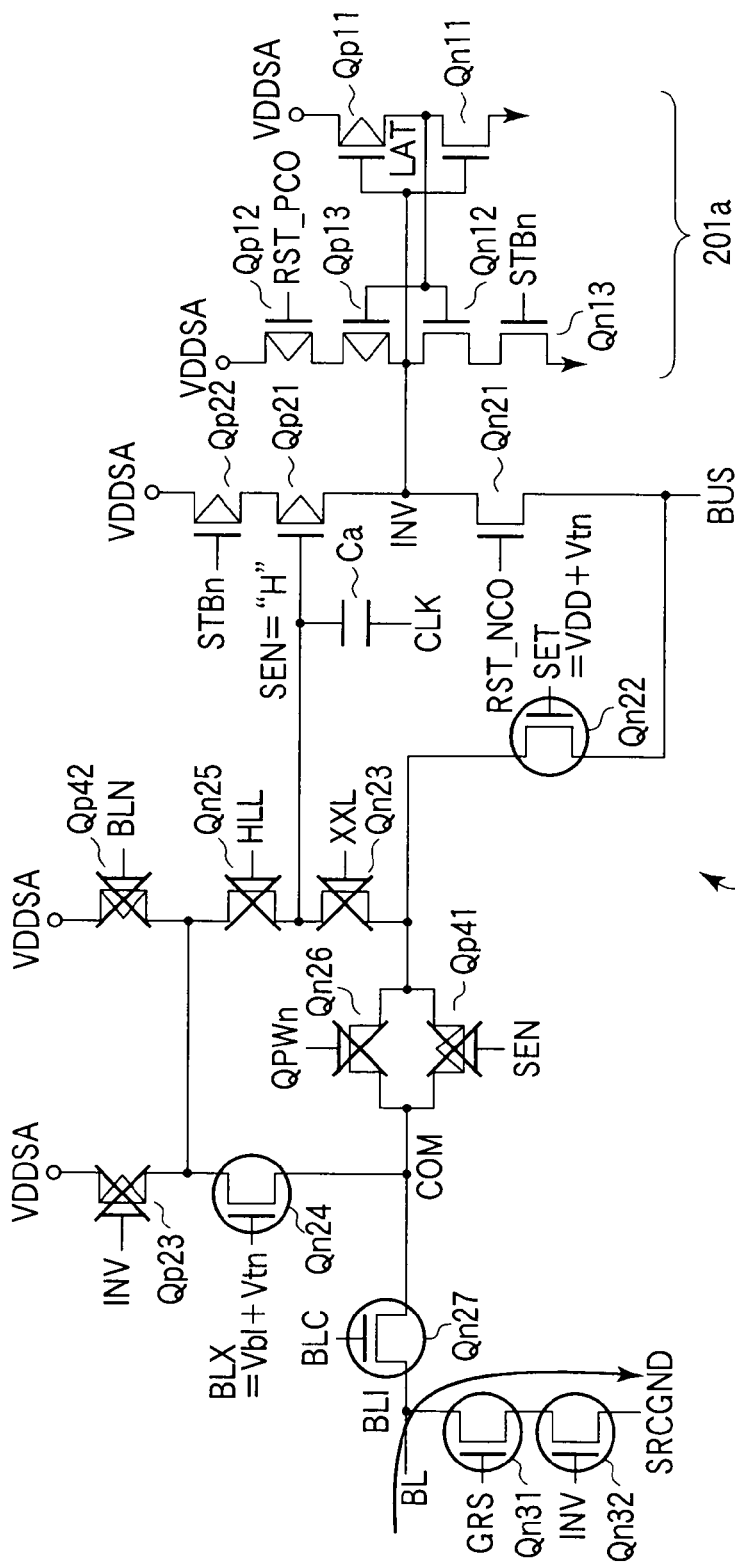
F I G. 29

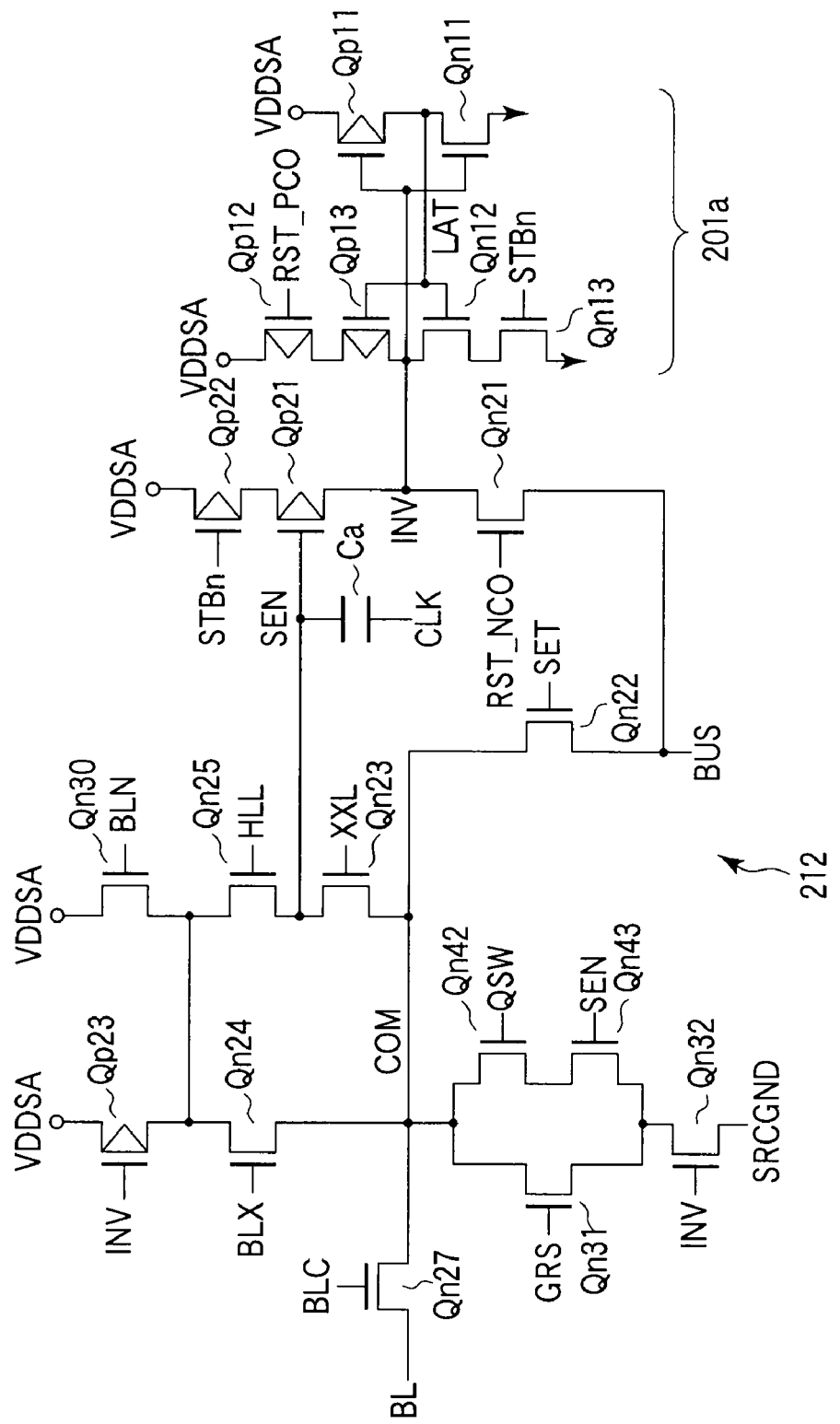
F I G. 32

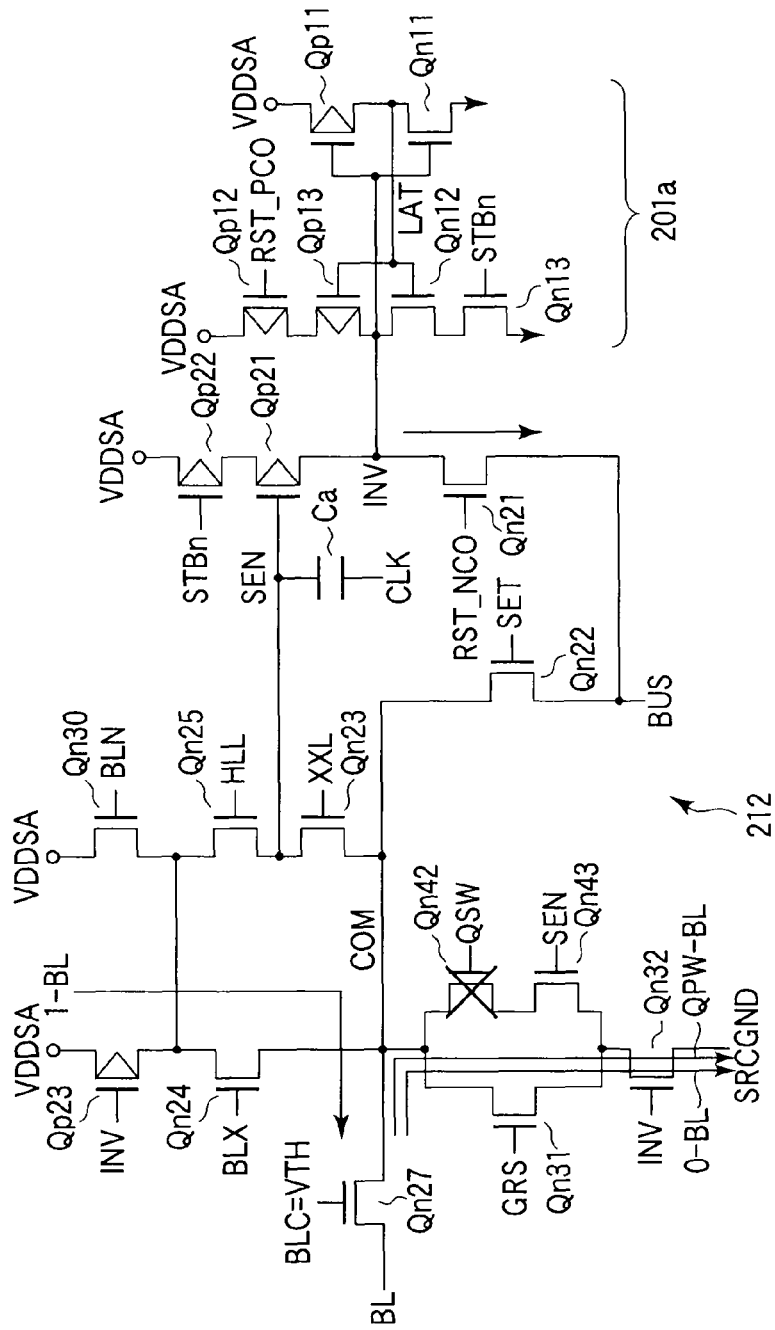
F I G. 34
BL pre-charge
(1) · set ALL INV="H"
(2) · inhibit scan (set INV="H" or "L")
(3) · BL pre-charge

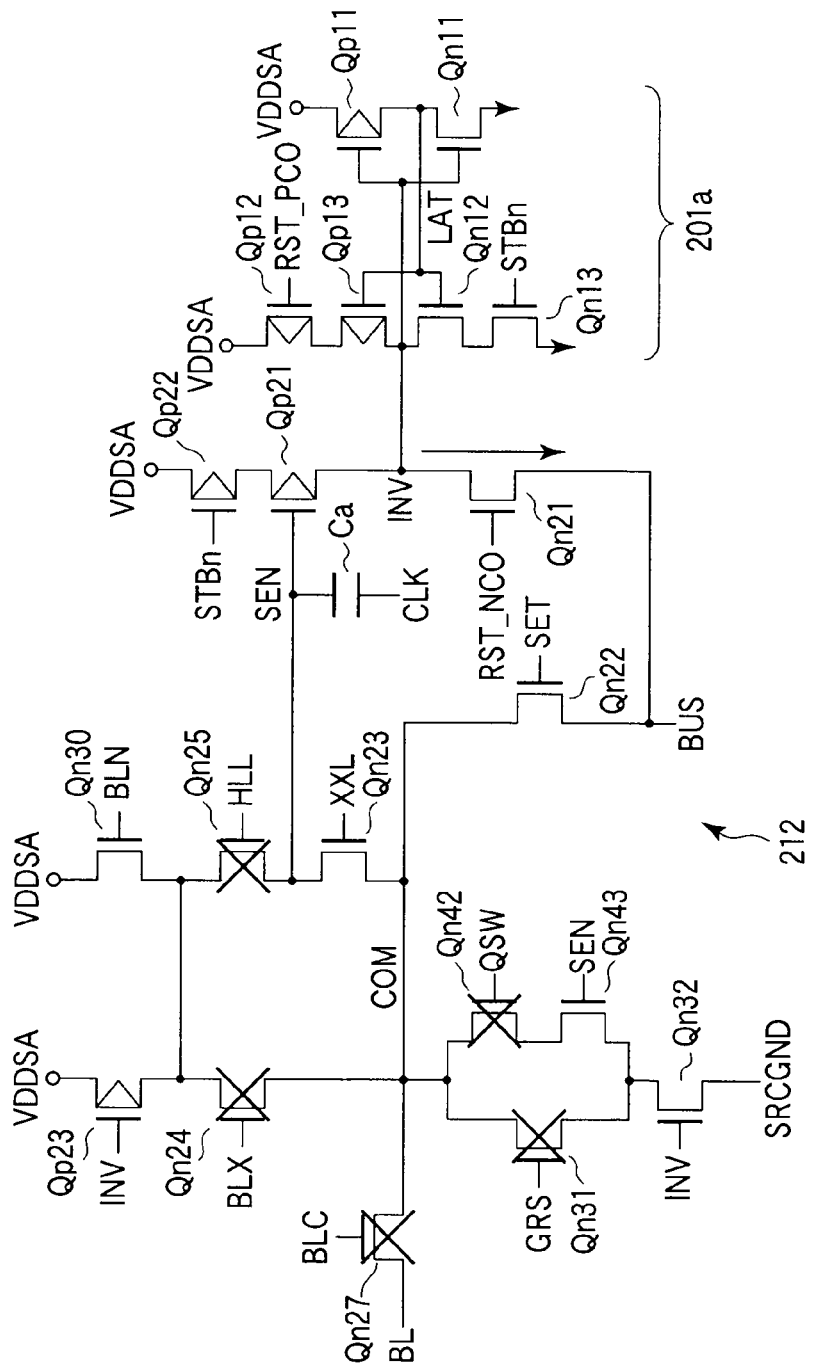
Inhibit scan again
(6) · turn off BLC, BLX, HLL and GRS
(7) · set ALL INV="H"
(8) · Inhibit scan (through NCO Tr.)
F I G. 36

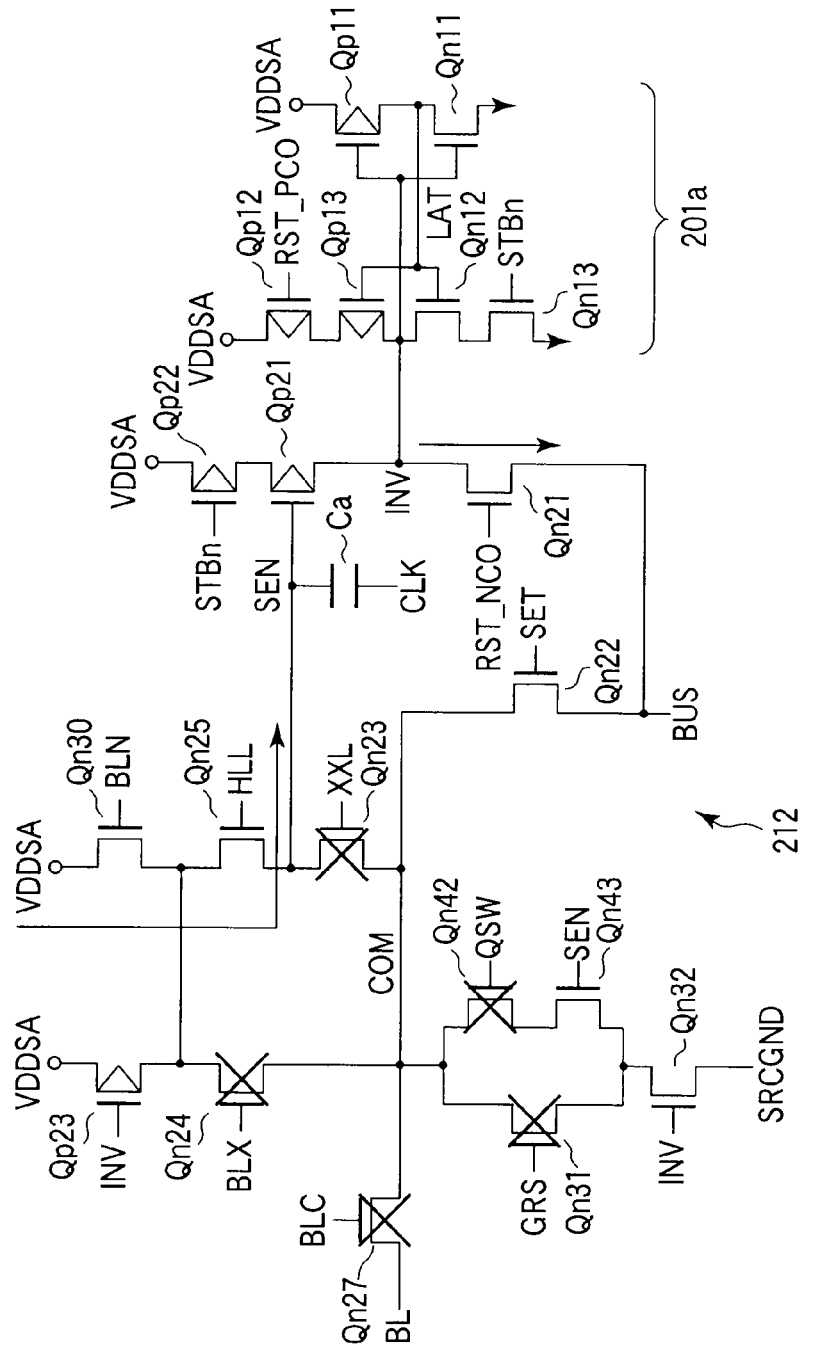
F I G. 37

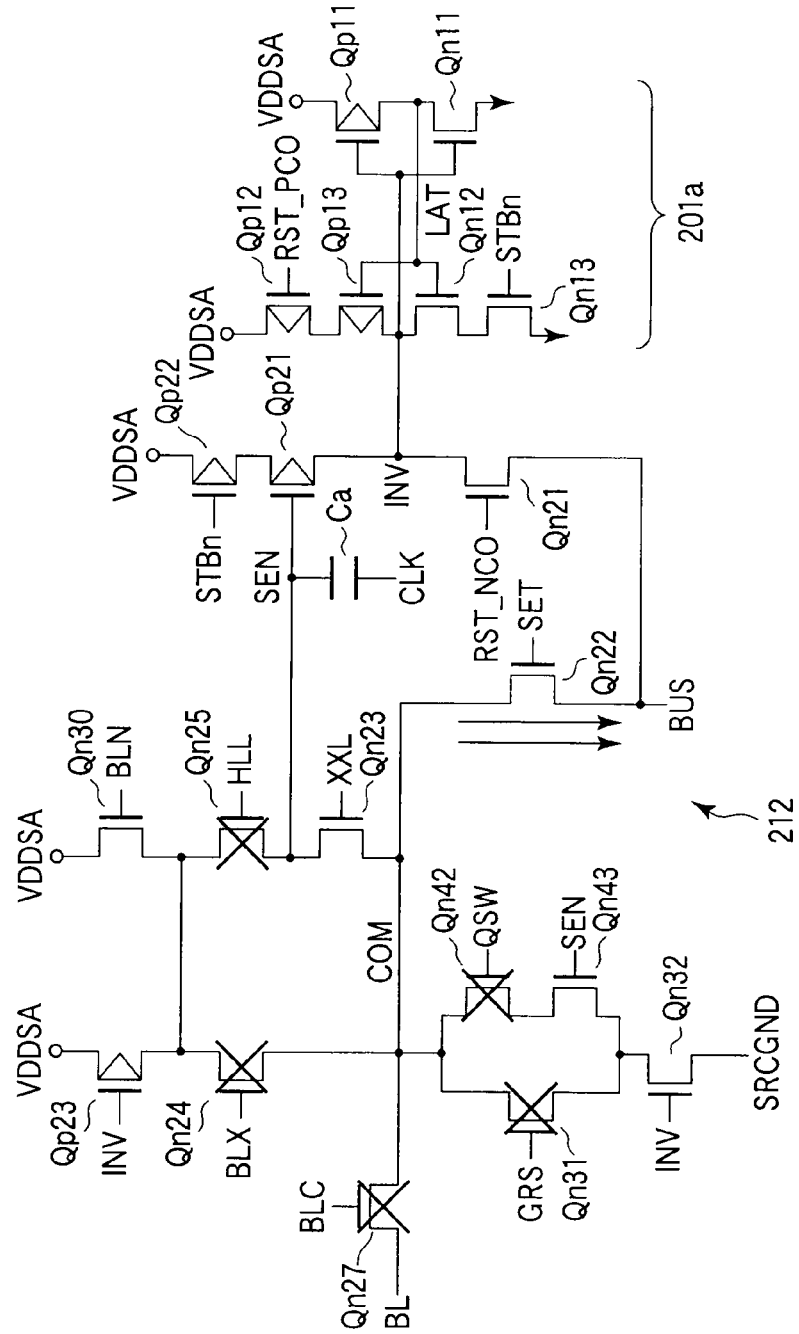
F I G. 38

NONVOLATILE SEMICONDUCTOR MEMORY DEVICE AND WRITE METHOD FOR THE SAME

CROSS-REFERENCE TO RELATED APPLICATIONS

This application is based upon and claims the benefit of priority from Japanese Patent Application No. 2009-148870, filed Jun. 23, 2009; the entire contents of which are incorporated herein by reference.

FIELD

Embodiments described herein relate generally to a nonvolatile semiconductor memory device and a write method for the nonvolatile semiconductor memory device, and for example, to a NAND cell type EEPROM (NAND flash memory) configured to enable multilevel data of at least 2 bits to be stored in one memory cell during a program (write) operation.

BACKGROUND

In a NAND flash memory configured to enable data to be electrically rewritten, MOS transistors of a stack gate structure including a stack of a charge accumulation layer (floating gate) and a control gate are used as nonvolatile memory elements (flash memory cells). For example, data is written to a flash memory cell by injecting electrons into the floating gate. Data is read (read operation) by allowing a sense amplifier to sense a cell current that varies depending on whether or not electrons are injected into the floating gate.

In recent years, in connection with NAND flash memories, much attention has been paid to multilevel flash memories configured to enable a reduction in bit unit price or an increase in memory capacity per memory chip. In a multilevel flash memory, data of a plurality of bits with different thresholds is stored in one flash memory cell. For example, if 2-bit data is stored in each flash memory cell, the flash memory cell comprises four threshold zones (voltage distribution) corresponding to the data. In order to obtain more reliable devices, it is important to accurately control the threshold of the flash memory cell.

As a technique to accurately control the threshold of the flash memory cell, a method has been proposed which involves dividing a write voltage (Vpgm) into a plurality of write pulses and repeatedly writing data with the voltage of each of the write pulses stepped up at a given rate. The threshold of the flash memory cell, which varies in response to every application of a write pulse, is checked (verified). When the threshold reaches a prescribed verify level, the application of the write pulse is stopped to terminate the write. For example, if the step up voltage ($\Delta$Vpgm) of the write pulse is 0.2 V, the distribution width of each threshold can in principle be controlled to 0.2 V. A reduction in the rate of the step-up voltage enables the distribution width of the threshold to be reduced. However, in this case, more write pulses are required, disadvantageously resulting in a longer write time.

On the other hand, miniaturized NAND flash memories have contributed to reducing the distance between flash memory cells. Thus, a disadvantageous variation in the threshold of the flash memory cell has been prominent which results from the capacitive coupling between the adjacent floating gates. This may reduce the difference in threshold between the flash memories (read margin).

As a method for avoiding this problem, a quick pass write (hereinafter referred to as QPW) operation has been proposed (see, for example, Jpn. Pat. Appln. KOKAI Publication No. 2003-196988). In the proposed QPW operation, for example, first, a write voltage and a write control voltage are supplied to a memory cell to write data to the memory cell. Then, if the threshold of the memory cell reaches a first write state, the supply state of the write control voltage is changed to allow data to be repeatedly written to the memory cell. Then, if the threshold of the memory cell reaches a second write state, the supply state of the write control voltage is further changed to inhibit writes to the memory cell. That is, the QPW operation enables the threshold distribution width resulting from the write to be reduced with an increase in write time suppressed.

However, miniaturized NAND flash memories have disadvantageously contributed to increasing the amount of leakage current from bit lines. For example, in the QPW operation, the potential level of a bit line connected to a non-write flash memory cell is fixed to a voltage VDDSA before application of a write pulse. Then, the potential level of the bit line is brought into a floating state. A possible leakage current may reduce the potential level of the bit line during application of the write pulse. This increases the magnitude of the electric field (potential difference) between a channel region and the floating gate in the corresponding flash memory cell. That is, a decrease in the potential level of the bit line during application of the write pulse may vary the threshold of the flash memory cell. Thus, in the conventional QPW operation, an increase in the amount of leakage current may cause program disturbance (miswrites).

BRIEF DESCRIPTION OF THE DRAWINGS

FIG. 4 is a sectional view showing the column-wise structure of the memory cell array in FIG. 2;

FIG. 7 is a circuit diagram showing a configuration example of a sense amplifier in the sense amplifier circuit in FIG. 6;

FIG. 10 is a waveform diagram illustrating a write pulse during the program operation in the multilevel flash memory in FIG. 1;

FIG. 11 is a diagram illustrating a data write/verify operation (verify write) during the program operation in the multilevel flash memory in FIG. 1;

FIG. 12, FIG. 13A, and FIG. 13B are diagrams illustrating a QPW operation (verify sense) during the program operation in the multilevel flash memory in FIG. 1;

FIG. 15 is a flowchart illustrating the flow of the QPW operation during the program operation according to the first embodiment;

FIG. 16 is a timing flowchart illustrating the flow of the QPW operation during the program operation according to the first embodiment;

FIG. 17 to FIG. 19 are circuit diagrams illustrating the operation of the sense amplifier during the QPW operation according to the first embodiment;

FIG. 20 is a sectional view illustrating a data write operation during the QPW operation in the example of the memory cell array shown in FIG. 4;

FIG. 23 is a circuit diagram showing another configuration example of the sense amplifier according to the first embodiment;

FIG. 26 to FIG. 30 are circuit diagrams illustrating the operation of the sense amplifier during the QPW operation according to the second embodiment;

FIG. 32 is a circuit diagram showing a configuration example of a sense amplifier according to a third embodiment;

FIG. 34 to FIG. 39 are circuit diagrams illustrating the operation of the sense amplifier during the QPW operation according to the third embodiment;

DETAILED DESCRIPTION

Figure 1:
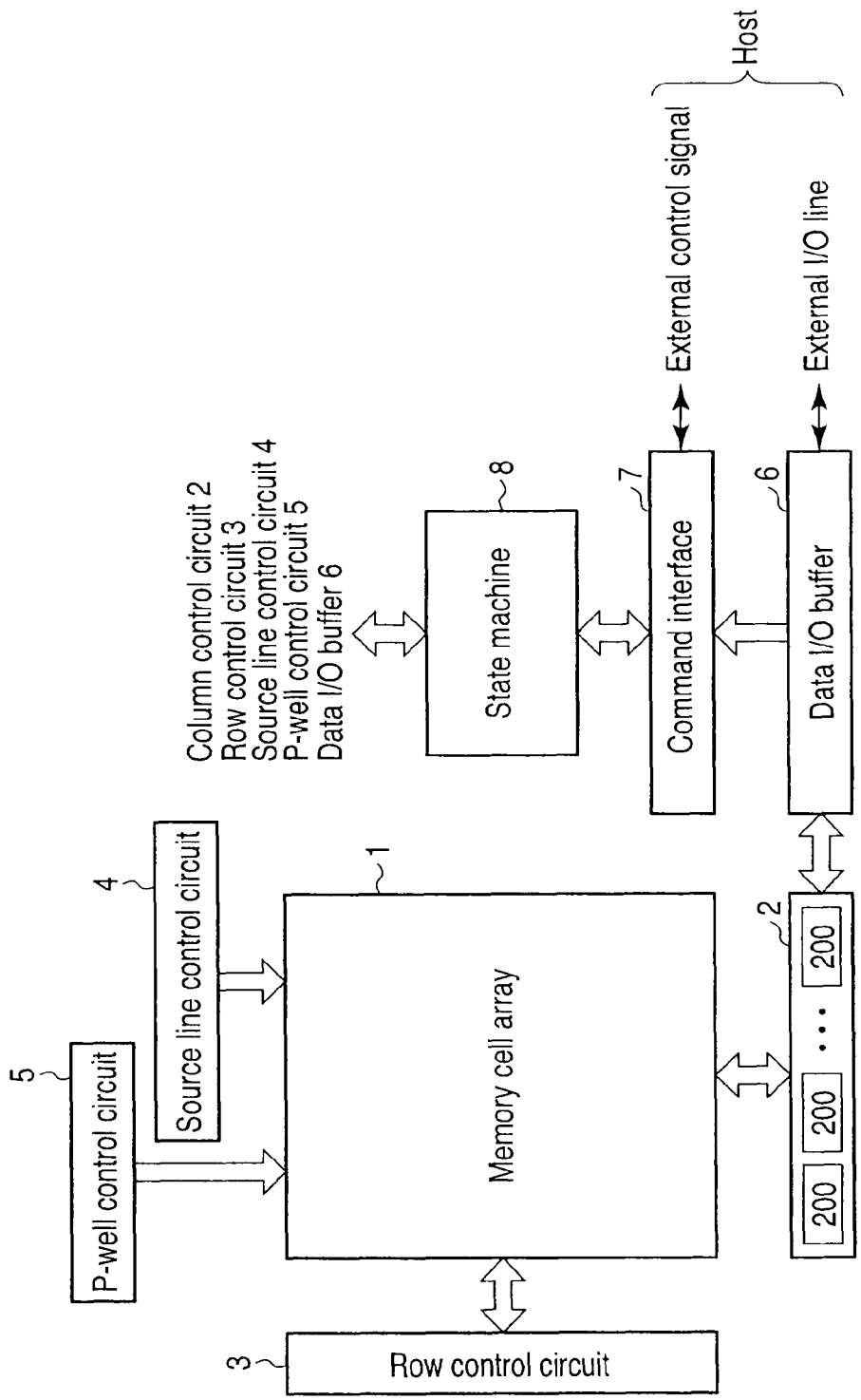
FIG. 1 is a block diagram showing a configuration example of a nonvolatile semiconductor memory device (NAND multilevel flash memory) according to a first embodiment.

In general, according to one embodiment, a nonvolatile semiconductor memory device includes a plurality of nonvolatile memory cells, a plurality of bit lines, a write circuit, and a plurality of sense amplifiers. In the plurality of nonvolatile memory cells, data can be rewritten. The plurality of bit lines are connected to the plurality of nonvolatile memory cells. The write circuit controls write voltages provided to the plurality of nonvolatile memory cells to write data to a selected memory cell. The plurality of sense amplifiers are configured to bias the bit line to which the selected memory cell is connected, to a first voltage until the threshold of the selected memory cell reaches the value of a first write state. Then, when the threshold of the selected memory cell reaches the value of the first write state, the bit line to which the selected memory cell is connected is biased to a second voltage higher than the first voltage. When the threshold of the selected memory cell reaches the value of a second write state, the bit line to which the selected memory cell is connected is continuously biased to a third voltage higher than the second voltage. Bit lines connected to unselected memory cells corresponding to the memory cells other than the selected one are continuously biased to the third voltage.

Embodiments of the present invention will be described below in detail with reference to the drawings. However, the drawings are schematic, and it should be noted that dimensions and scales in the drawings are different from actual ones. Furthermore, of course, dimensional relationships and/or scales may vary among the drawings. In particular, several embodiments shown below illustrate devices and methods for embodying the technical concepts of the present invention. The technical concepts of the present invention are not determined by the shapes, structures, or arrangements of components. Various changes may be made to the technical concepts of the present invention without departing from the spirit of the present invention.

(First Embodiment)

FIG. 1 shows a configuration example of a nonvolatile semiconductor memory device (NAND flash memory) according to a first embodiment. The first embodiment will be described taking, as an example, a multilevel flash memory capable of performing a QPW operation.

In FIG. 1, a plurality of flash memory cells (NAND cells), a plurality of bit lines, and a plurality of word lines are provided in a memory cell array 1. The plurality of flash memory cells are nonvolatile memory elements and are arranged, for example, in a matrix.

A column control circuit 2 is provided adjacent to the memory cell array 1. The column control circuit 2 controls the bit lines in the memory cell array 1 to erase data from the flash memory cells, write data to the flash memory cells, and read data from the flash memory cells. A plurality of sense amplifier circuits 200 are provided in the column control circuit 2.

A row control circuit 3 is provided adjacent to the memory cell array 1. The row control circuit 3 selects word lines in the memory cell array 1 and supplies a voltage required for erase, write, or read to selected/unselected word lines.

Furthermore, a source line control circuit 4 and a P well control circuit 5 are provided near the memory cell array 1; the source line control circuit 4 controls the source lines in the memory cell array 1, and the P well control circuit 5 controls a p-type well in which the memory cell array 1 is formed.

A data I/O buffer 6 is connected to a host (not shown in the drawings) via an external I/O line. The data I/O buffer 6 receives write data from the host, outputs read data to the host, and receives address data and command data from the host. The write data received by the data I/O buffer 6 is transmitted to the column control circuit 2. Furthermore, the data I/O buffer 6 receives the read data read from inside the memory cell array 1 via the column control circuit 2.

To allow any flash memory cell in the memory cell array 1 to be selected, the address data received from the host by the data I/O buffer 6 is transmitted to the column control circuit 2 and a row control circuit 3 via a command interface 7 and a state machine 8.

Furthermore, the command data received from the host by the data I/O buffer 6 is transmitted to a command interface 7. The command interface 7 receives an external control signal from the host to determine whether write data, command data, or address data has been input to the data I/O buffer 6. If command data has been input, the command interface 7 receives and transfers the data to the state machine 8 as a command signal.

The state machine 8 manages the whole flash memory. In response to command signals from the command interface 7, the state machine 8 performs read, write, and erase operations and manages data inputs and outputs.

Figure 2:
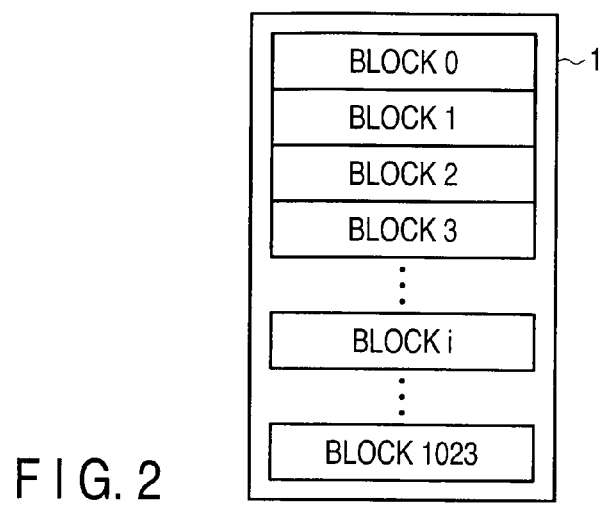
FIG. 2 is a block diagram showing a configuration example of a memory cell array in the multilevel flash memory in FIG. 1.
Figure 3:
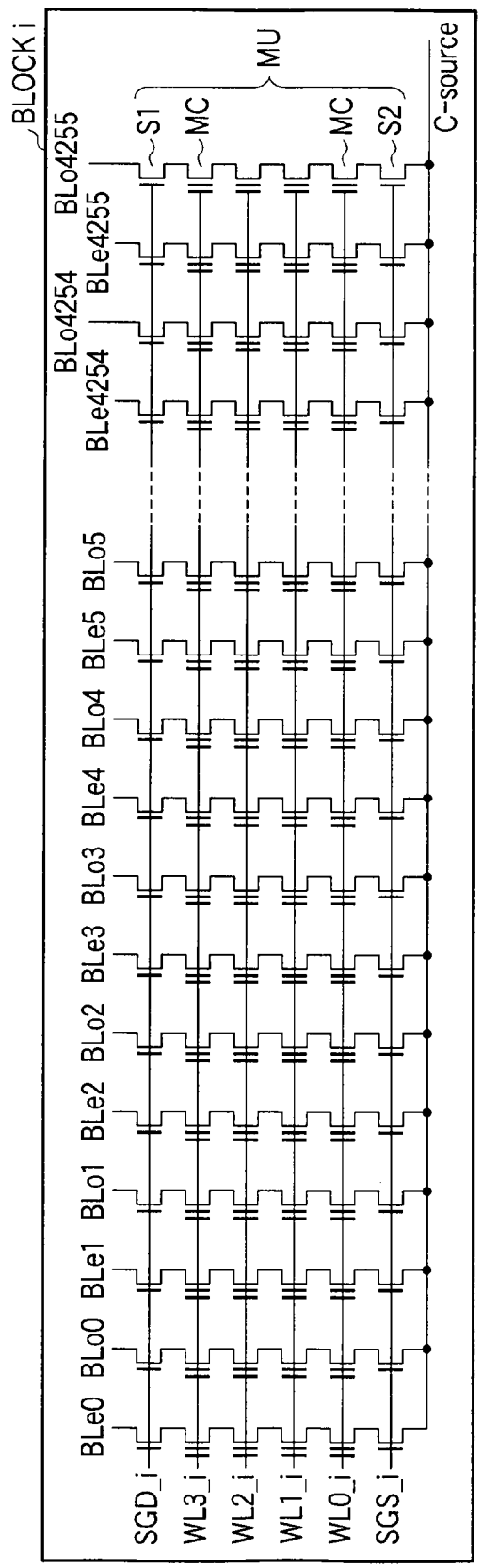
FIG. 3 is a circuit diagram showing a configuration example of a block in the memory cell array in FIG. 2.

FIG. 2 shows a configuration example of the above-described memory cell array 1. The inside of the memory cell array 1 is divided into a plurality of blocks BLOCK (in the present example, BLOCK0 to BLOCK1023). The block BLOCK is a minimum erase unit. A plurality of (for example, 8,512) NAND memory units MU are provided in each block BLOCK as shown in FIG. 3.

For example, four flash memory cells MC connected together in series are provided in each NAND memory cell unit MU. The flash memory cell MC located at one end of the NAND memory unit MU is connected to a corresponding bit line BL (one of BLe0 to BLe4255 and BLo0 to BLo4255) via a select gate S1 connected to a select gate line SGD_i. The flash memory cell MC located at the other end is connected to a common source line C-source via a select gate S2 connected to a select gate line SGS_i.

Each of the flash memory cells MC comprises a control gate, a floating gate (charge accumulation layer), a source, and a drain. The control gates of the four flash memory cells MC are connected to corresponding word lines WL (WL0_1 to WL3_i).

For example, an even numbered bit line from the end of the memory unit is defined as a bit line BLe. An odd numbered bit line from the end of the memory unit is defined as a bit line BLo. A data write and a data read are carried out independently on the bit line BLe and on the bit line BLo. For example, of the 8,512 flash memory cells MC with the respective control gates all connected to one word line WL, 4,256 flash memory cells MC connected to the bit lines BLe are simultaneously subjected to data write or data read. If 1-bit data is stored in each of the flash memory cells MC, 4,256-bit data stored in the 4,256 flash memory cells forms a unit called a page. Thus, if 2-bit data is stored in each flash memory cell, two pages of data are stored in the 4,256 flash memory cells MC. Thus, the 4,256 flash memory cells MC connected to the bit lines BLo form another page. Data write or data read is carried out simultaneously on the 4,256 flash memory cells MC in the same page.

FIG. 4 shows the column-wise (the direction along the bit lines BL) sectional structure of the memory cell array 1. An n-type well 11 is formed on a p-type substrate 10. A p-type well 12 is formed in the n-type well 11. Each of the flash memory cells MC comprises a source and a drain both formed of an n-type diffusion layer 13, a floating gate FG formed on a channel region between the source and the drain via a tunnel oxide film, and a control gate CG provided on the floating gate FG via an insulating film and serving as the word line WL.

Each select gate S1 comprises a source and a drain both formed of the n-type diffusion layer 13, and a gate electrode SG of a double stack structure. The gate electrode SG is connected to the select gate line SGD_i. The select gate line SGD_i and the word line WL are both connected to the row control circuit 3 in FIG. 1 and controlled in accordance with output signals from the row control circuit 3.

Each select gate S2 comprises a source and a drain both formed of the n-type diffusion layer 13, and the gate electrode SG of a double stack structure. The gate electrode SG is connected to the select gate line SGS_i. The select gate line SGS_i and the word line WL are both connected to the row control circuit 3 in FIG. 1 and controlled in accordance with output signals from the row control circuit 3.

The adjacent flash memory cells MC share the source/drain. The flash memory cell MC located at the end of the memory unit MU share the source/drain with one of the select gates S1 and S2. Furthermore, the adjacent memory units MU share the source/drain of the select gate S1 or S2.

One end of the NAND memory unit MU (a drain of the select gate S1) comprising the four flash memory cells MC and the select gates S1 and S2 is connected to a metal wiring layer M0 in the first layer via a contact hole electrode CB1. The metal wiring layer M0 is connected, via a via hole electrode V1, to a metal wiring layer M1 in the second layer which serves as the bit line BL. The bit line BL is connected to the column control circuit 2 in FIG. 2.

The other end of the NAND memory unit MU (a source of the select gate S2)) is connected, via a contact hole electrode CB2, to a metal wiring layer M2 in the first layer which serves as the common source line C-source. The common source line C-source is connected to the source line control circuit 4 in FIG. 4.

An n-type diffusion layer 14 is formed on the surface of the n-type well 11. A p-type diffusion layer 15 is formed on the surface of the p-type well 12. The n-type diffusion layer 14 and the p-type diffusion layer 15 are both connected the a metal wiring layer M3 in the first layer which serves as a well line C-p-well, via contact hole electrodes CB3 and CB4, respectively. The well line C-p-well is connected to the P well control circuit 5 in FIG. 1.

Figure 5:
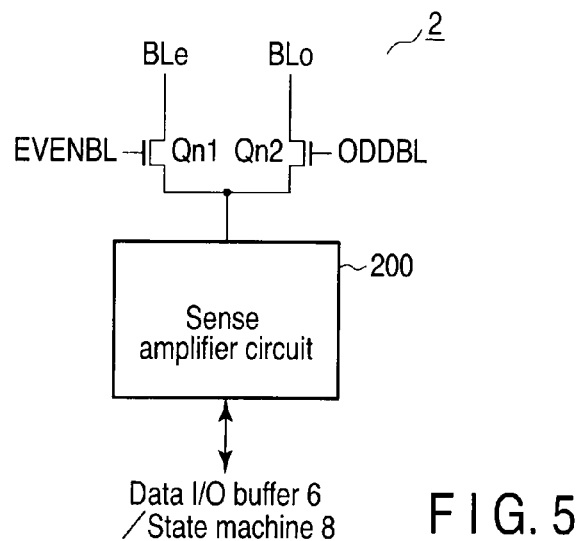
FIG. 5 is a block diagram showing a configuration example of a column control circuit in the multilevel flash memory in FIG. 1.

FIG. 5 shows a configuration example of the above-described column control circuit 2. In the present embodiment, in the column control circuit 2, a sense amplifier circuit 200 is provided for every two bit lines BL corresponding to the same column number and comprising the bit lines BLe and BLo.

An n-channel MOS transistor Qn1 for column selection is connected to between the sense amplifier circuit 200 and the bit line BLe. An n-channel MOS transistor Qn2 for column selection is connected to between the sense amplifier circuit 200 and the bit line BLo. A signal EVENBL is provided to a gate of the n-channel MOS transistor Qn1 by, for example, the state machine 8. A signal ODDBL is provided to a gate of the n-channel MOS transistor Qn2 by, for example, the state machine 8.

One of the bit line BLe and the bit line BLo is selected by the n-channel MOS transistors Qn1 and Qn2 and connected to the corresponding sense amplifier circuit 200. The selected bit line BLe or BLo is then controlled for data write or read. That is, when the signal EVENBL is at a high level (H) and the signal ODDBL is at a low level (L), the n-channel MOS transistor Qn1 is made electrically continuous to select the bit line BLe, which is then connected to the sense amplifier circuit 200. When the signal EVENBL is at the L level and the signal ODDBL is at the H level, the n-channel MOS transistor Qn2 is made electrically continuous to select the bit line BLo, which is then connected to the sense amplifier circuit 200. The signal EVENBL is supplied to all the n-channel MOS transistors Qn1 for column selection connected to the bit line BLe. The signal ODDBL is supplied to all the n-channel MOS transistors Qn2 for column selection connected to the bit line BLo. Unselected bit lines BL (BLe and BLo) are controlled by another circuit (not shown in the drawings).

Figure 6:
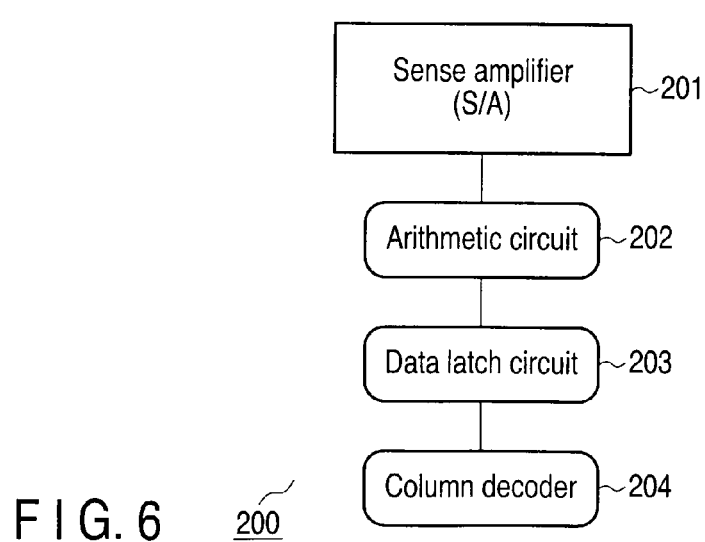
FIG. 6 is a block diagram showing a configuration example of a sense amplifier circuit in the column control circuit in FIG. 5.

FIG. 6 shows a configuration example of the sense amplifier circuit 200. The sense amplifier circuit 200 comprises a sense amplifier (S/A) 201 configured to write data to the flash memory cell MC and read data from the flash memory cell MC. An arithmetic circuit 202 is connected to the sense amplifier 201. A data (Data) latch circuit 203 is connected to the arithmetic circuit 202. A column decoder 204 is connected to the data latch circuit 203.

The column decoder 204 decodes address data from the state machine 8. The column decoder 204 then outputs write data from the data I/O buffer 6 to the data latch circuit 203 in accordance with the result of the decoding, that is, outputs the write data corresponding to the address to the data latch circuit 203. Furthermore, the column decoder 204 retrieves read data read from inside the memory cell array 1 via the sense amplifier 201 and the arithmetic circuit 202 and then stored in the data latch circuit 203. The column decoder 204 then outputs the read data to the data I/O buffer 6.

The data latch circuit 203 comprises a plurality of external data latches (not shown in the drawings). For example, external data latches 1 and 2 are configured to store the result of what is called a write verify, in which the threshold of the flash memory cell MC is checked after write. Furthermore, an external data latch 3 is configured to temporarily store write data input by the host or read data output to the host.

The arithmetic circuit 202 controls the operation of the sense amplifier 201 and biases (forces) the corresponding bit line BL to a voltage required for an operation. For example, during a QPW operation, the arithmetic circuit 202 controls the sense amplifier 201 in accordance with the result of the write verify operation stored in the external data latches 1 and 2 of the data latch circuit 203.

The sense amplifier 201 applies a voltage corresponding to an operation to the corresponding bit line BL. The sense amplifier 201 provides a function to bias the bit line BL to one of three types of required voltage values (for example, VDDSA, VSS, and Vbl (sometimes referred to as VQPW)) for the QPW operation. The voltages VDDSA, VSS, and Vbl are in the relationship "VSS<Vbl<VDDSA".

FIG. 7 shows a configuration example of the sense amplifier 201. The sense amplifier 201 comprises an internal latch circuit 201a. The internal latch circuit 201a comprises p-channel MOS transistors Qp11, Qp12, and Qp13 and n-channel MOS transistors Qn11, Qn12, and Qn13. One end of a current passage in the p-channel MOS transistor Qp11 is connected to the power supply voltage VDDSA of the sense amplifier 201. The other end of the current passage in the p-channel MOS transistor Qp11 is connected to one end of a current passage in the n-channel MOS transistor Qn11. The other end of the current passage in the n-channel MOS transistor Qn11 is grounded (connected to the voltage VSS). One end of a current passage in the p-channel MOS transistor Qp12 is connected to the power supply voltage VDDSA. The other end of the current passage in the p-channel MOS transistor Qp12 is connected to one end of a current passage in the n-channel MOS transistor Qp13. The other end of the current passage in the n-channel MOS transistor Qp13 is connected to one end of a current passage in the n-channel MOS transistor Qn12. The other end of the current passage in the n-channel MOS transistor Qn12 is connected to one end of a current passage in the n-channel MOS transistor Qn13. The other end of the current passage in the n-channel MOS transistor Qn13 is grounded.

Gates of the p-channel MOS transistor Qp11 and the n-channel MOS transistor Qn11 are both connected to the connection point between the other end of the current passage in the p-channel MOS transistor QP13 and the one end of the current passage in the n-channel MOS transistor Qn12. A signal INV (the potential of a node INV) is provided to the gates of the p-channel MOS transistor Qp11 and the n-channel MOS transistor Qn11.

Gates of the p-channel MOS transistor Qp13 and the n-channel MOS transistor Qn12 are both connected to the connection point between the other end of the current passage in the p-channel MOS transistor Qp11 and the one end of the current passage in the n-channel MOS transistor Qn11. A signal LAT (the potential of a node LAT which is in reverse phase to the signal INV) is provided to the gates of the p-channel MOS transistor Qp11 and the n-channel MOS transistor Qn11. A signal RST_PCO is provided to a gate of the p-channel MOS transistor Qp12. A signal STBn is provided to a gate of the p-channel MOS transistor Qn13.

Furthermore, the gates of the p-channel MOS transistor Qp11 and the n-channel MOS transistor Qn11 are both connected to the connection point between one end of a current passage in a p-channel MOS transistor Qp21 and one end of a current passage in an n-channel MOS transistor Qn21. The other end of the current passage in the p-channel MOS transistor Qp21 is connected to the power supply voltage VDDSA of the sense amplifier 201 via a p-channel MOS transistor Qp22. The other end of the current passage in the re-channel MOS transistor Qn21 is connected to one end of a current passage in the n-channel MOS transistor Qn22 and to the arithmetic circuit 202. During the QPW operation, the arithmetic circuit 202 provides the result of the write verify operation (signal BUS) stored in the data latches 1 and 2 of the data latch circuit 203, via the BUS line, to the other end of the current passage in the n-channel MOS transistor Qn21 and to the one end of the current passage in n-channel MOS transistor Qn22. A signal RST_NCO is provided to a gate of the n-channel MOS transistor Qn21. A signal STBn is provided to a gate of the p-channel MOS transistor Qp22. One of the electrodes of a capacitor (for example, 25 fF) Ca is connected to a gate of the p-channel MOS transistor Qp21 and provided with a signal SEN (the potential of a node SEN). A signal CLK is provided to the other electrode of the capacitor Ca.

The other end of the current passage in the re-channel MOS transistor Qn22 is connected to one end (node COM) of a current path in each of n-channel MOS transistors Qn23 and Qn24. The other end of the current passage in the n-channel MOS transistor Qn23 is connected to the gate of the p-channel MOS transistor Qp21 and to one end of a current passage in an re-channel MOS transistor Qn25. The one end of the current passage in the p-channel MOS transistor Qp23 is connected both to the other end of the current passage in the n-channel MOS transistor Qn25 and to the other end of the current passage in the n-channel MOS transistor Qn24. The other end of the current passage in the p-channel MOS transistor Qp23 is connected to the power supply voltage VDDSA of the sense amplifier 201. A signal SET is provided to the gate of the re-channel MOS transistor Qn22. A signal XXL is provided to the gate of the n-channel MOS transistor Qn23. A signal BLX is provided to the gate of the n-channel MOS transistor Qn24. A signal HLL is provided to the gate of the n-channel MOS transistor Qn25. The signal INV is provided to the gate of the p-channel MOS transistor Qp23.

Furthermore, the one end of the current passage in the p-channel MOS transistor Qp24 and one end of a current passage in an n-channel MOS transistor Qn26 connected together in parallel are connected both to the one end of the current passage in the n-channel MOS transistor Qn23 and to the one end of the current passage in the n-channel MOS transistor Qn24. A signal QPWn is provided to a gate of the n-channel MOS transistor Qn26. The signal BUS is provided to the gate of the p-channel MOS transistor Qp24.

One end of a current passage in an n-channel MOS transistor Qn27 is connected to the common connection point between the other end of the current passage in the p-channel MOS transistor Qp24 and the other end of the current passage in the n-channel MOS transistor Qn26. A signal BLC is provided to a gate of the re-channel MOS transistor Qn27. Furthermore, one end of a current passage in an n-channel MOS transistor Qn28 and one end of a current passage in an n-channel MOS transistor Qn29 connected together in parallel are connected to the common connection point between the other end of the current passage in the p-channel MOS transistor Qp24 and the other end of the current passage in the n-channel MOS transistor Qn26. The other ends (common connection point) of the current passages in the n-channel MOS transistors Qn28 and Qn29 are connected to the power supply voltage VDDSA of the sense amplifier 201 via an n-channel MOS transistor Qn30. The signal QPWn is provided to a gate of the n-channel MOS transistor Qn28. The signal LAT is provided to a gate of the transistor Qn29. A signal BLN is provided to a gate of the n-channel MOS transistor Qn30.

The other end (node BL1) of the current passage in the n-channel MOS transistor Qn27 is connected to the common source line C-source (SRCGND=VSS) via n-channel MOS transistors Qn31 and Qn32. A signal GRS is provided to a gate of the n-channel MOS transistor Qn31. The signal INV is provided to a gate of the n-channel MOS transistor Qn32. Furthermore, the other end of the current passage in the n-channel MOS transistor Qn27 is connected to the bit line BL via a high-voltage transistor HQn33 of an n-channel MOS structure. The signal BLS is provided to a gate of the high-voltage transistor HQn33.

The above-described signals are provided by the arithmetic circuit 202 of the state machine 8 shown in FIG. 1.

In the sense amplifier 201 configured as described above, the n-channel MOS transistors Qn26 and Qn28 are turned on when the QPW operation is not performed. That is, a voltage VTH (about 4.5 V) is applied to the gates as the signal QPWn at all times other than during the QPW operation. This ensures that the sense amplifier 201 operates in the same manner as that in which conventional sense amplifiers operate. Furthermore, during the QPW operation, the voltage VSS is applied to the gates of the n-channel MOS transistors Qn26 and Qn28 as the signal QPWn. The potential of the node LAT of the internal latch circuit 201*a* is provided to the gate of the n-channel MOS transistor Qn29 as the signal LAT. The n-channel MOS transistor Qn29 is switched on and off in accordance with the signal LAT. The gate of the p-channel MOS transistor Qp24 is provided with the result of the write verify operation provided by the arithmetic circuit 202 and stored in the external data latches 1 and 2 of the data latch circuit 203, as the signal BUS. The p-channel MOS transistor Qp24 is switched on and off in accordance with the signal BUS.

The sense amplifier 201 configured as described above allows the potential level of the bit line BL to be biased to any one of the voltage VDDSA, the voltage VSS, and the voltage Vbl in accordance with the threshold of the flash memory cell MC to be controlled. In particular, during the QPW operation, the potential level of the bit line BL (hereinafter also referred to as the non-write BL) connected to a non-write flash memory cell (unselected memory cell, to which "1" data is to be written) MC can be maintained at the voltage VDDSA.

Now, a QPW operation performed during a program operation using the sense amplifier 201 configured as described above will be described.

Here, before description of the present embodiment, a QPW operation already used for multilevel flash memories will be described in brief. The QPW operation performed during the program operation allows the distribution width of the threshold resulting from write to be reduced with an increase in write time suppressed.

Figure 8:
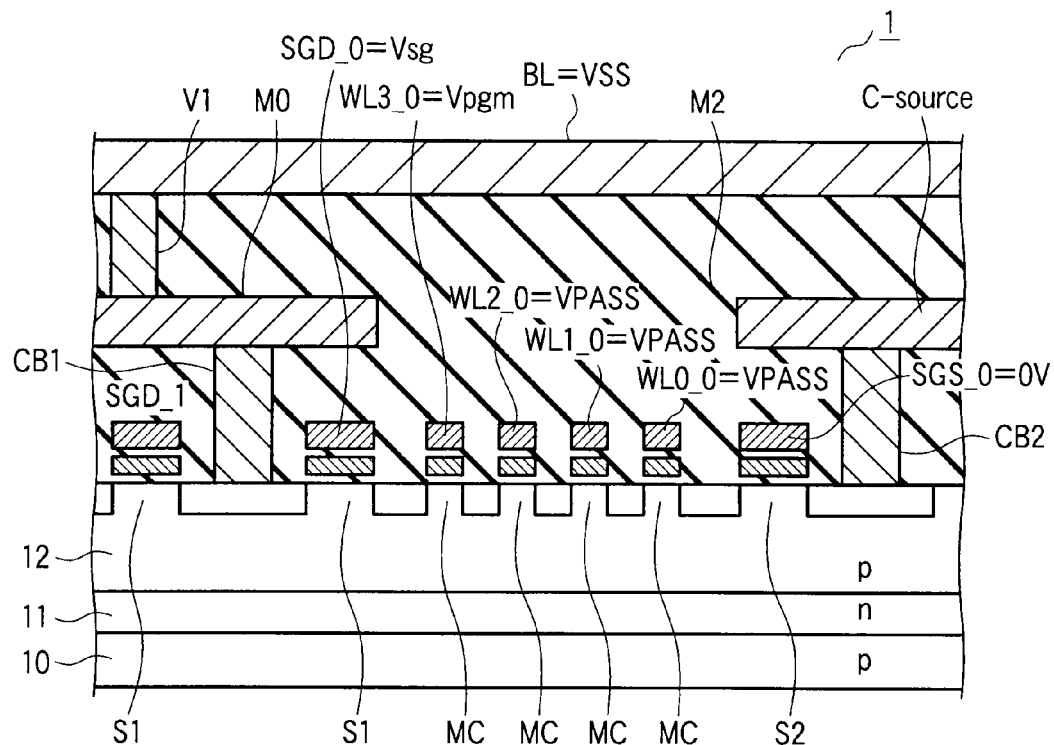
FIG. 8 is a sectional diagram illustrating a data write operation during a program operation in the example of the memory cell array shown in FIG. 4.

That is, during the program operation of the multilevel flash memory, data write is carried out in page units as described above. First, for example, as shown in FIG. 8, a high voltage (write voltage Vpgm) is applied to the word line WL3_0 of the selected memory cell (the flash memory cell to which "0" data is to be written) MC (the voltage VPASS is applied to the word lines WL0_0, WL1_0, and WL2_0 of the other, unselected memory cells). In this case, for the selected memory cell MC to which data is to be written, the potential level of the corresponding bit line BL (also referred to as the write BL) is biased to the voltage VSS. Furthermore, the select gate S1 is turned on (select gate line SGD_0=Vsg) to set the channel region to the voltage VSS (0 V; select gate line SGS_0=0). Thus, in the flash memory cell MC on which write is to be carried out, a high electric field is applied to between the floating gate FG and the channel region. Electrons from the channel region are injected into the floating gate FG. Then, "0" data is written to the selected memory cell MC.

Figure 9:
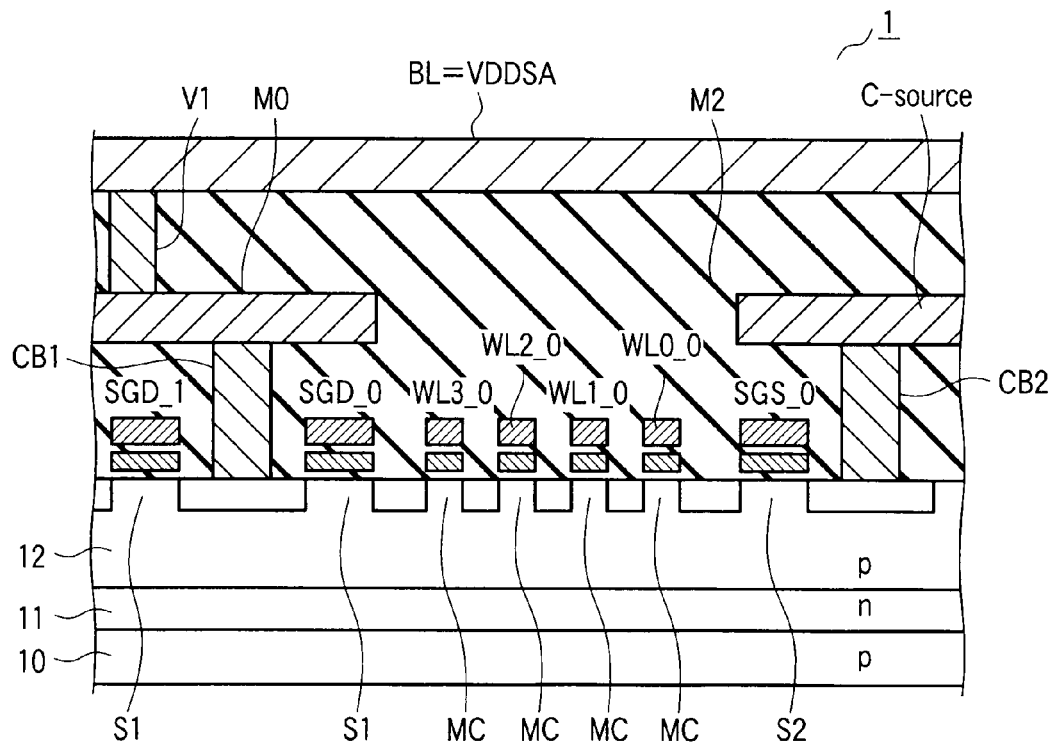
FIG. 9 is a sectional view illustrating a data non-write operation during the program operation in the example of the memory cell array shown in FIG. 4.

For the non-write flash memory cells MC, for example, as shown in FIG. 9, the potential level of the bit line BL is biased to the voltage VDDSA, and the select gates S1 and S2 are cut off. Then, the channel region is brought into a floating (Vinhibit) state. This avoids applying the high electric field to between the floating gate FG and the channel region, thus preventing "0" data from being written to the unselected memory cells MC.

The program operation in the NAND flash memory is normally accomplished by the repeated operation of applying a write pulse PP to the selected word line WL to write data to the selected memory cell MC and then carrying out verification by applying a verify pulse VP to the selected word line WL. That is, during a verify operation following write, the threshold of the selected memory cell MC may be lower than a verify level (verify voltage) VL (verify fail). In this case, also during the next period (step or cycle), the potential level of the bit line BL is biased to the voltage VSS to perform an additional write. At this time, the write voltage Vpgm of the write pulse PP is stepped up at a given rate (ΔVpgm). Thus, the threshold of the selected memory cell MC is gradually shifted as shown in FIG. 11. Then, if the threshold of the selected memory cell MC becomes higher than the verify level VL (verify pass), during the next period the bit line BL connected to the selected memory cell MC is charged by the voltage VDDSA so as to increase its potential level. This prevents a further write to the selected memory cell MC, which has passed the verification. The above-described operation is called "verify write". Execution of the "verify write" allows the foot (distribution width) of the threshold distribution of the selected memory cell MC subjected to the write to be made narrower than in the case where the "verify write" is avoided.

To further reduce the distribution width of threshold of the selected memory cell MC subjected to the write, it is possible to reduce the step-up voltage ΔVpgm shown in FIG. 10 while increasing the number of write steps (write pulses). However, an increase in step number may increase the time required for write for a program operation.

Figure 13A:
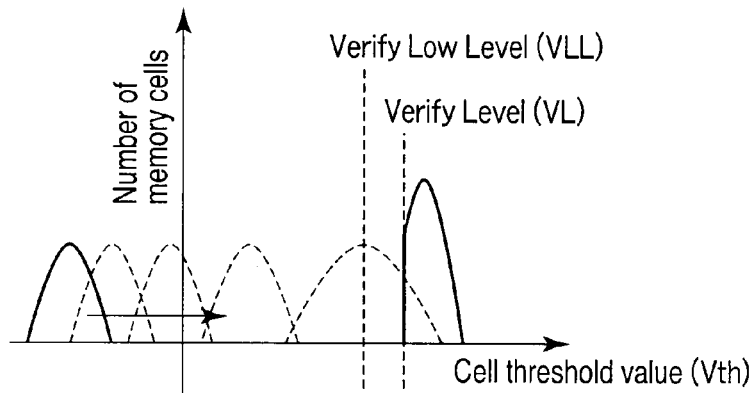
Figure 13B:
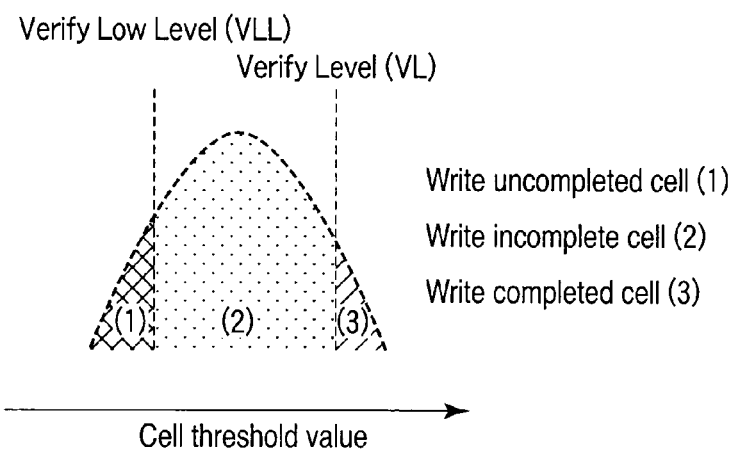

On the other hand, during the verify operation in the QPW operation, sensing is performed (sense1/sense2) at two levels, the verify level VL and a verify low level VLL lower than the verify level VL, for example, as shown in FIG. 12, FIG. 13A, and FIG. 13B. For a selected memory cell (write uncompleted cell (1)) with a threshold lower than the verify low level VLL, a normal write operation (additional write) is performed during the next period. In contrast, for a selected memory cell (write incomplete cell (2)) having passed the verify low level VLL but failing to have passed the verify level VL, the potential level of the bit line BL is biased to the voltage Vbl (VSS<Vbl<VDDSA). Thus, the channel region is charged by the voltage Vbl to allow an electric field having a lower potential than an additional write to be applied to between the floating gate FG and the channel region. As a result, the distribution width of the threshold is reduced. Similarly, for a selected memory cell (write complete cell (3)) with a threshold higher than the verify level VL, no additional write is performed during the next period.

Thus, the above-described QPW operation enables the distribution width of the threshold resulting from write to be reduced, with the step-up voltage ΔVpgm (step number) unchanged to suppress an increase in write time.

The potential level of the bit line BL during the QPW operation is controlled by the three types of voltages VDDSA, Vbl, and VSS provided by the sense amplifier 201. The sense amplifier 201 can also continue to bias the potential level of the bit line BL to the voltage VDDSA. Hence, even if the amount of leakage current from the bit line increases as a result of miniaturization of the memory cells MC, the potential level of the non-write BL can be maintained at the voltage VDDSA. That is, in the QPW operation, possible miswrites resulting from an increase in the amount of leakage current associated with miniaturization can be prevented.

Now, the operation of the multilevel flash memory according to the present embodiment will be described in brief. In the description of the present embodiment, 2-bit data, that is, 4 levels, are stored in one flash memory cell as multi-level data.

Figure 14:
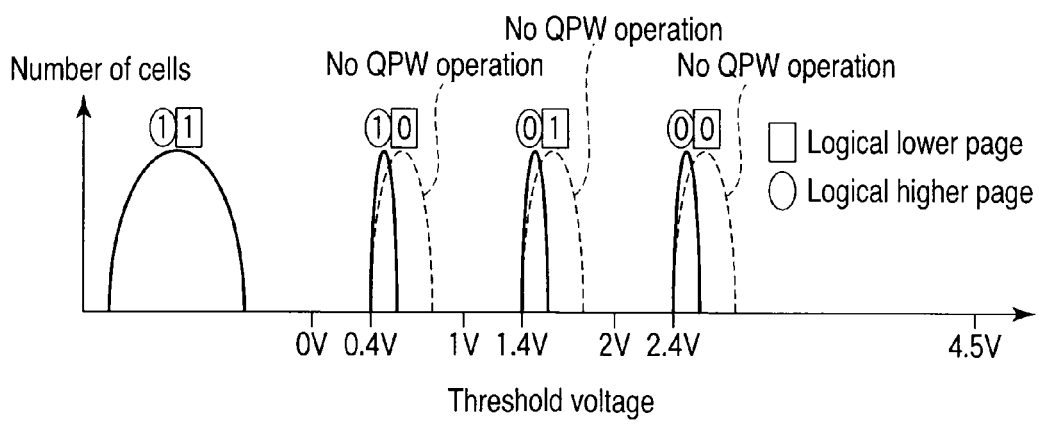
FIG. 14 is a diagram showing the relationship between 2-bit data and a threshold voltage in the multilevel flash memory in FIG. 1.

FIG. 14 shows the relationship between 2-bit data and the threshold voltage of the flash memory cell MC in the multilevel flash memory. The 2-bit data has four levels, "11", "10", "01", and "00". The two bits in each data belong to different row addresses (different pages of the indicated "Logical lower page" and "Logical higher page").

As shown in FIG. 14, the 2-bit data is stored in the flash memory cell MC as a difference in threshold voltage. In the present embodiment, the lowest threshold of the flash memory cell MC (for example, the threshold voltage is negative) corresponds to the "11" data. The second lowest threshold of the flash memory cell MC (for example, the threshold voltage is positive) corresponds to the "10" data. The third lowest threshold of the flash memory cell MC (for example, the threshold voltage is positive) corresponds to the "01" data. The highest threshold of the flash memory cell MC (for example, the threshold voltage is positive) corresponds to the "00" data.

After data erase, the data in the flash memory cell MC is "11". When lower page write data to the flash memory cell MC is "0", a write allows the flash memory cell MC to change from an "11" data state to a "10" data state. When "1" data is written, the data in the flash memory cell MC remains "11".

After the lower page data is written, the higher page data is written to the flash memory cell MC. If the write data is "1", the flash memory cell MA is maintained in the "11" data state or the "10" data state. If the write data is "0", a write allows the "11" data state and the "10" data state to shift to a "01" data state and a "00" data state, respectively.

After the write, data is read from the flash memory cell MC subjected to the write. Then, what is called a write verify operation is carried out to determine whether or not the write is sufficient. That is, the data read by the sense amplifier 201 is determined to be, for example, "11" if the threshold voltage is at most 0 V. Furthermore, if the threshold voltage is at least 0 V and at most 1 V, then the data is determined to be "10". Additionally, if the threshold voltage is at least 1 V and at most 2 V, then the data is determined to be "01". Moreover, if the threshold voltage is at least 2 V, then the data is determined to be "00".

As described above, the multilevel flash memory in which 2-bit data is stored in one flash memory cell MC uses the 4-level threshold. In an actual device (memory chip), the characteristics of the flash memory cell MC vary among the flash memory cells MC, and thus the threshold voltage varies among the flash memory cell MC. If the variation is prominent, the data cannot be distinguished from one another. As a result, incorrect data is likely to be read.

In the multilevel flash memory according to the embodiment, the QPW operation can be used to suppress such a prominent variation in threshold voltage (an increase in distribution width) as shown by a dashed line the figure (No QPW operation), so as to reduce the distribution width as shown by a solid line in the figure. That is, a read margin (threshold difference) can be increased. Thus, the present embodiment is preferable not only for storing 2-bit data but also for storing data of more bits.

Now, the operation of the sense amplifier 201 in the QPW operation during the program operation in the multilevel flash memory configured as described above will be specifically described.

FIG. 15 and FIG. 16 illustrate the flow of processing in the QPW operation. FIG. 15 is a flowchart showing a program sequence. FIG. 16 is a timing chart showing the program sequence.

First, "Inhibit scan (a scan operation performed before the program operation)" is performed to set, to "H (HIGH)", the value of the signal INV in the sense amplifier 201 corresponding to the write bit line BL (also referred to as the "0" data write BL, the normal write BL, 0-prog. BL, or 0_BL) connected to the selected memory cell MC. Furthermore, the value of the signal INV in the sense amplifier 201 corresponding to the non-write bit line BL (also referred to as the "1" data write BL, the inhibit BL, 1-prog. BL, or 1_BL) connected to the unselected memory cell MC is set to "L (LOW)" (sep ST01 in FIG. 15 and (a) in FIG. 16). For example, in an initial set flow, first, the data in the internal latch circuits 201a in each of all the sense amplifiers 201 is reset (INV="H"). Thereafter, the arithmetic circuit 202 sets the value of the signal RST_NCO to "H" to turn on the n-channel MOS transistor Qn21. Thus, in accordance with the write data (external data) stored in the external data latch 3 in the data latch circuit 203, the value of the signal BUS in the sense amplifier 201 connected to the write bit line BL is set to "H". The value of the signal BUS in the sense amplifier 201 connected to the non-write bit line BL is set to "L". Thus, the external data is transferred to the internal latch circuit 201a in the sense amplifier 201 to set the signal INV to a value that is in reverse phase to the signal LAT.

Figure 17:
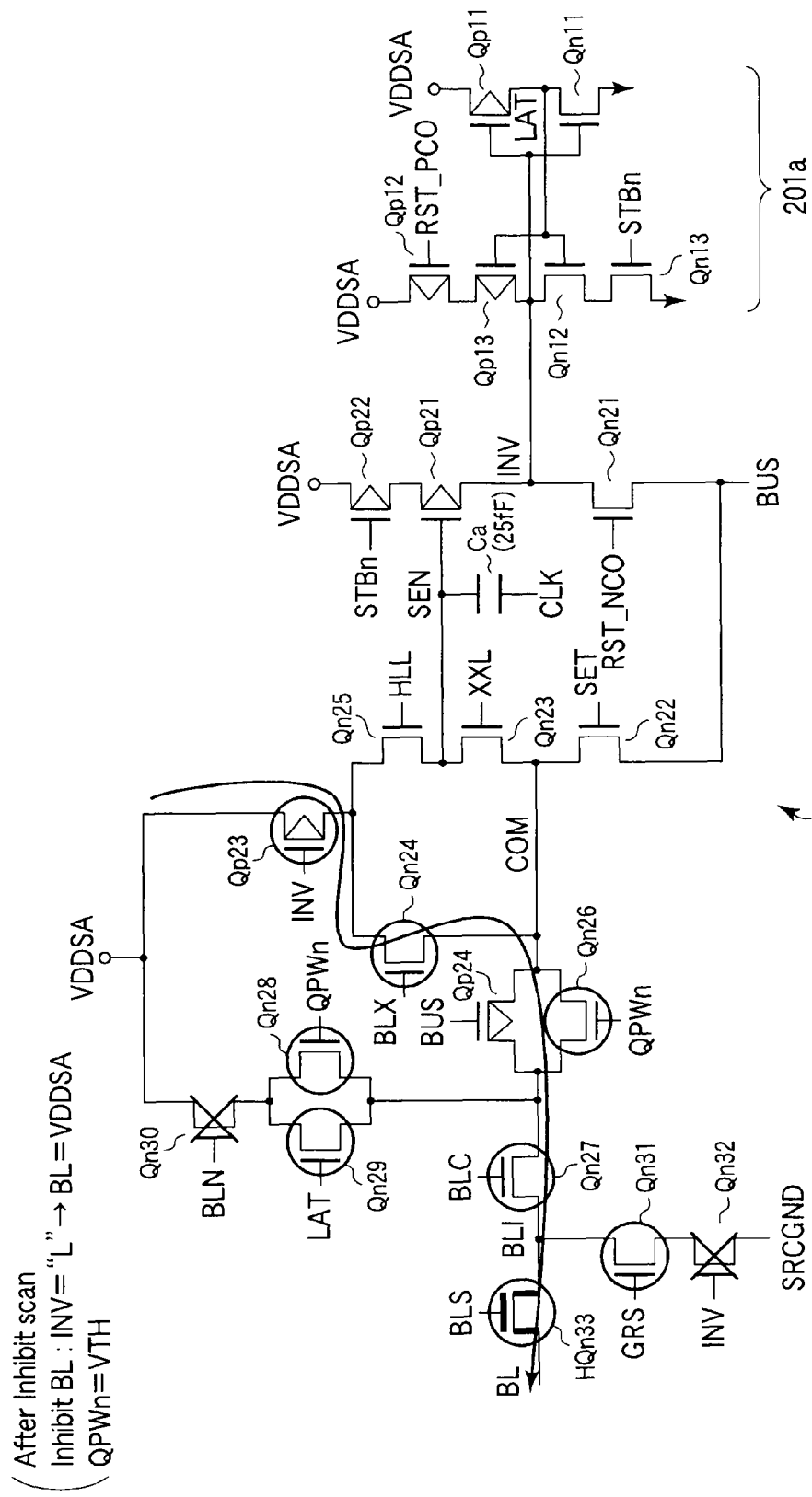

Then, in "BL pre-charge (After inhibit scan) & program" (steps ST02 and ST03 in FIG. 15 and (b) and (c) in FIG. 16), for example, as shown in FIG. 17, the arithmetic circuit 202 sets the value of the signal BLN to "L" to turn off the n-channel MOS transistor Qn30. The arithmetic circuit 202 further sets the values of the signals BLX, BLC, and BLS to "H" to turn on the re-channel MOS transistors Qn24, Qn27, and HQn33. For the non-write bit line BL, the value of the signal INV to the corresponding sense amplifier 201 is set to "L". Thus, the p-channel MOS transistor Qp23 is turned on, and the n-channel MOS transistor Qn32 is turned off. Consequently, this bit line BL is charged via a path shown by an arrow in the figure so that the potential level increases up to the voltage VDDSA (when the values of the signals LAT and GRS are set to "H", the n-channel MOS transistors QN29 and Qn31 are turned on to set the voltage of the signal QPWn to the voltage VTH (about 4.5 V), thus turning on the n-channel MOS transistors Qn26 and Qn28).

That is, if after "Inhibit scan", the non-write bit line BL is charged to increase the potential level of the bit line BL up to the voltage VDDSA, the signals are set as follows: QPWn=about 4.5 V, BLN=VSS, BLX=about 4.5 V, BLC=about 4.5 V, BLS=about 8 V, and GRS=VDD. That is, the execution of "Inhibit scan" sets the value of the signal INV to "L" (signal LAT="H"), allowing the non-write bit line BL to be charged up to the voltage VDDSA. Thus, for example, as shown in FIG. 9, when the potential level of the non-write bit line BL is biased to the voltage VDDSA, the channel region in the unselected memory cell MC is maintained in a floating state. This prevents "0" data from being written.

For the write bit line BL, for example, as shown in FIG. 18, even though the value of the signal BLN is set to "L" and the values of the signals QPWn, BLX, BLC, BLS, and GRS are set to "H", the value of the signal INV is set to "H" (signal LAT="L"). Thus, this bit line BL is not charged and is maintained at the voltage VSS. That is, the p-channel MOS transistor Qp23 is turned off, and the n-channel MOS transistors Qn31, Qn32, and HQn33 are turned on. Thus, the potential level of the write bit line BL is biased to a source line voltage SRCGND (0 V) via a path (shown by an arrow in the figure) connected to the common source line C-source.

That is, if after "Inhibit scan", the write bit line BL is discharged to reduce the potential level of the write bit line BL down to the voltage VSS, the signals are set as follows as is the case with the non-write bit line BL: QPWn=about 4.5 V, BLN=VSS, BLX=about 4.5 V, BLC=about 4.5 V, BLS=about 8 V, and GRS=VDD. However, execution of "Inhibit scan" sets the value of the signal INV to "H" (signal LAT="L"). Thus, the path via which the write bit line BL is charged up to the voltage VDDSA is cut off. The write bit line BL is discharged via the path connected to the source line voltage SRCGND (in this case, the voltage VSS). Hence, for example, as shown in FIG. 8, the voltage of the channel region in the selected memory cell MC is set to the voltage VSS to allow "0" data to be written to the selected memory cell MC.

Then, "program verify" is carried out (steps ST04 to ST11 in FIG. 15, (c) in FIG. 16). In the program verify operation, a sense operation is performed at the two levels (VL/VLL) as described above (see FIG. 12). That is, if the threshold of the selected memory cell MC subjected to the data write fails the verify low level VLL (steps ST04 and ST05 in FIG. 15), the data LAT="H" is transferred to the external data latch 2 in the data larch circuit 203 as the value of the signal BUS (step ST06 in FIG. 15). When the threshold passes the verify low level VLL, the data LAT="L" is transferred to the external data latch 2 as the value of the signal BUS (step ST07 in FIG. 15).

Moreover, when the threshold of the selected memory cell MC subjected to the data write passes not only the verify low level VLL but also the verify level VL (steps ST08 and ST09 in FIG. 15), the data LAT="L" is transferred to the external data latch 1 in the data larch circuit 203 as the value of the signal BUS (step ST10 in FIG. 15). When the threshold passes the verify low level VLL but fails the verify level VL, the data LAT="H" is transferred to the external data latch 1 as the value of the signal BUS (step ST11 in FIG. 15).

Then, "QPW scan" is carried out to change, from "H" to "L", the value of the signal INV to each of those of the sense amplifiers 201 corresponding to the write bit lines BL connected to the selected memory cells MC which have thresholds having passed the verify low level VLL (step ST12 in FIG. 15 and (d) in FIG. 16). For example, the arithmetic circuit 202 transfers the data (the result of the write verify) in the external data latch 2 in the data latch circuit 203, as the signal BUS, to the sense amplifier 201 corresponding to the bit line BL (QPW BL) connected to the selected memory cell MC with a threshold having passed the verify low level VLL.

That is, the data "L" in the external data latch 2 is output, as the value of the signal BUS, to the sense amplifier 201 for the selected memory cell MC with a threshold having passed the verify low level VLL. Thus, the value of the signal INV is set to "L".

Thereafter, the arithmetic circuit 202 sets the value of the signal RST_NCO to the corresponding sense amplifier 201 to "H" to turn on the n-channel MOS transistor Qn21.

Then, "Inhibit scan 2" is carried out to set, to "H", the value of the signal INV in the sense amplifier 201 corresponding to the write bit line BL connected to the selected memory cell MC. Then, the value of the signal INV in the sense amplifier 201 corresponding to the non-write bit line BL connected to the unselected memory cell MC is set to "L" (ST13 in FIG. 15 and (e) in FIG. 16). For example, in accordance with the data (the result of the write verify operation) stored in the external data latch 1 in the data latch circuit 203, the arithmetic circuit 202 sets the value of the signal BUS in the sense amplifier 201 for the write bit line BL to "H". The arithmetic circuit 202 also sets the value of the signal BUS in the sense amplifier 201 for the non-write bit line BL to "L". Thus, the signal INV is set to the above-described value.

Then, in "BL pre-charge (After QPW scan)" (step ST14 in FIG. 15 and (f) in FIG. 16), for example, as shown in FIG. 19, the arithmetic circuit 202 controls the signal BLN to change the gate voltage of the n-channel MOS transistor Qn30 from VTH (about 4.5 V) to Vbl+Vtn (Vtn denotes the threshold voltage of the re-channel MOS transistor Qn30).

At this time, the arithmetic circuit 202 sets the values of the signals BLX, BLC, BLS, and GRS to "H" to turn on the n-channel MOS transistors Qn24, Qn27, HQn33, and Qn31. Furthermore, the arithmetic circuit 202 sets the value of the signal QPWn to "L" to turn off the n-channel MOS transistors QN26 and Qn28.

Thus, for the write bit line BL having passed the verify low level VLL, since the signal INV to the corresponding sense amplifier 201 is set to "L", the p-channel MOS transistor Qp23 is turned on, and the re-channel MOS transistor Qn32 is turned off. Furthermore, since the values of the signals LAT and BUS are set to "H", the n-channel MOS transistor Qn29 is turned on, and the p-channel MOS transistor Qp24 is turned off. Thus, this bit line BL is charged to increase the potential level of the bit line BL to the voltage Vbl (the potential clamped by the n-channel MOS transistor Qn30). As a result, for example, as shown in FIG. 20, when the potential of the bit line BL is biased to the voltage Vbl (=VQPW), the channel region in the selected memory cell (write incomplete cell) MC with a threshold having passed the verify low level VLL is charged up to the voltage Vbl so that an electric field having a lower potential than an additional write is applied to between the floating gate FG and the channel region.

That is, after "QPW scan", if the bit line BL having passed the verify low level VLL is biased to the voltage Vbl, the value of the signal bus BUS is set to "L". Thus, the value of the signal INV changes from "H" to "L". Thereafter, with the value of the signal RST_NCO set to "H", "Inhibit scan 2" is carried out to set the value of the signal BUS to "H". At this time, the signals are set as follows: QPWn=VSS, BLN=Vbl+Vtn, BLX=about 4.5 V, BLC=about 4.5 V, BLS=about 8 V, and GRS=VDD. Thus, when the signal INV="L" (that is, the signal LAT="H" and the signal BUS="H"), the bit line BL is charged along the path shown in the figure. Hence, the bit line BL is biased to the voltage Vbl clamped by the n-channel MOS transistor Qn30.

Figure 21:
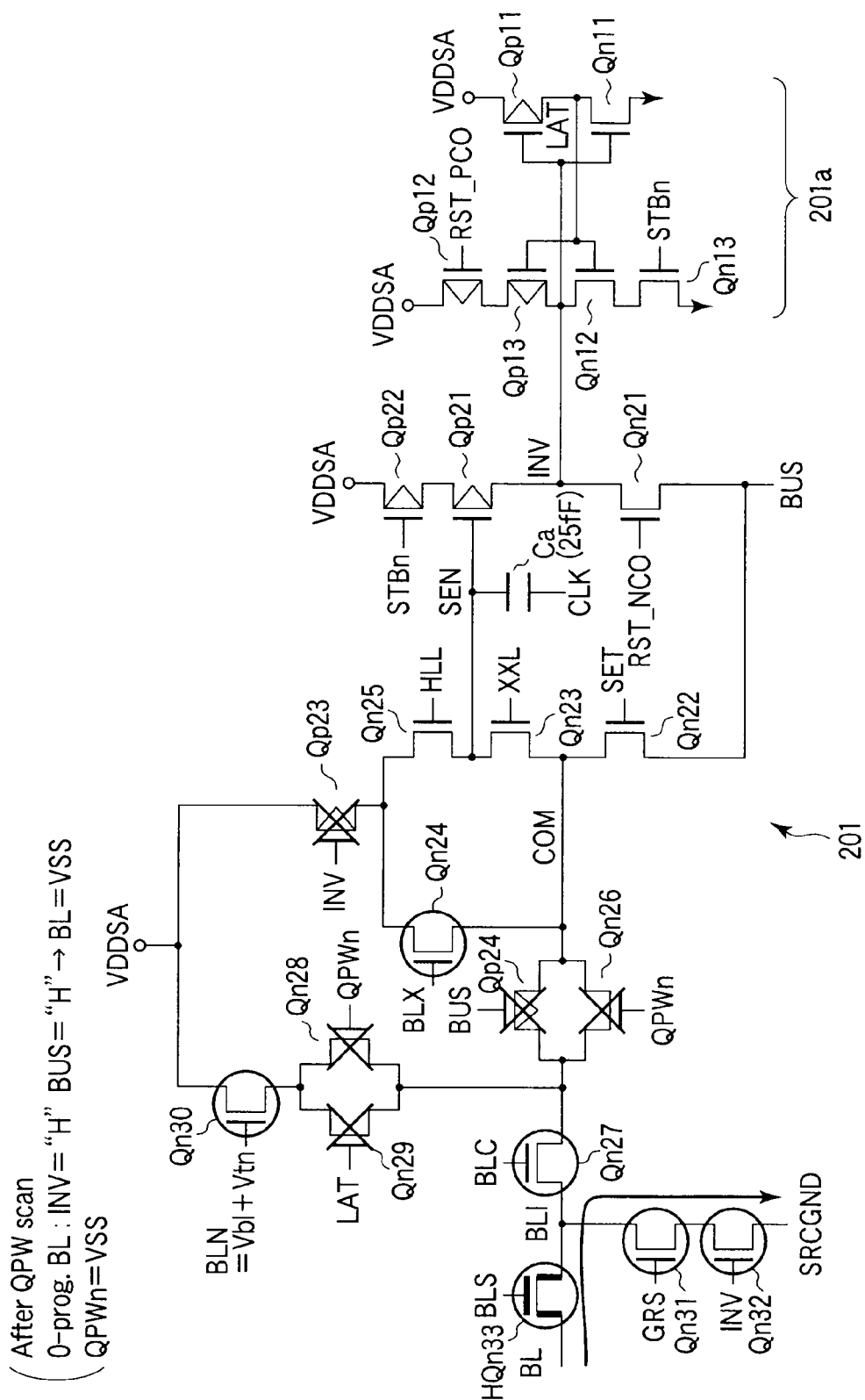
FIG. 21 and FIG. 22 are circuit diagrams illustrating the operation of the sense amplifier during the QPW operation according to the first embodiment.

In contrast, for the bit line BL connected to the write uncompleted cell MC with a threshold having failed the verify low level VLL, for example, as shown in FIG. 21, the value of the signal INV remains at "H" (signal LAT="L"). Thus, the potential level of this bit line BL is maintained at the voltage VSS. That is, the value of the signal BUS is set to "H" in accordance with the data in the external data latch 1. Hence, the value of the signal INV remains at "H". Therefore, at this time, when the arithmetic circuit 202 sets the values of the signals BLX, BLC, BLS, and GRS to "H", while setting the value of the signal QPWn to "L", the value of the signal BUS is set to "H", and the value of the signal LAT is set to "L". Thus, the potential level of the bit line BL having failed the verify low level VLL is biased to the source line voltage SRCGND (VSS) via the path (shown by an arrow in the figure) connected to the common source line C-source.

That is, after "QPW scan", if the write bit line BL (which has failed the verify low level VLL) is biased to the voltage VSS, the value of the signal bus BUS is set to "H". Thus, the value of the signal INV remains at "H". Thereafter, even when "Inhibit scan 2" is carried out with the value of the signal RST_NCO set to "H", the value of the signal BUS remains at "H" as is the case with "QPW scan". At this time, the signals are set as follows: QPWn=VSS, BLN=Vbl+Vtn, BLX=about 4.5 V, BLC=about 4.5 V, BLS=about 8 V, and GRS=VDD. Thus, when the signal INV="H" (that is, the signal LAT="L" and the signal BUS="H"), the path via which the bit line BL is charged up to the voltage VDDSA is cut off, and a discharge path is connected to the bit line BL. As a result, the bit line BL is biased to the voltage VSS.

Figure 22:
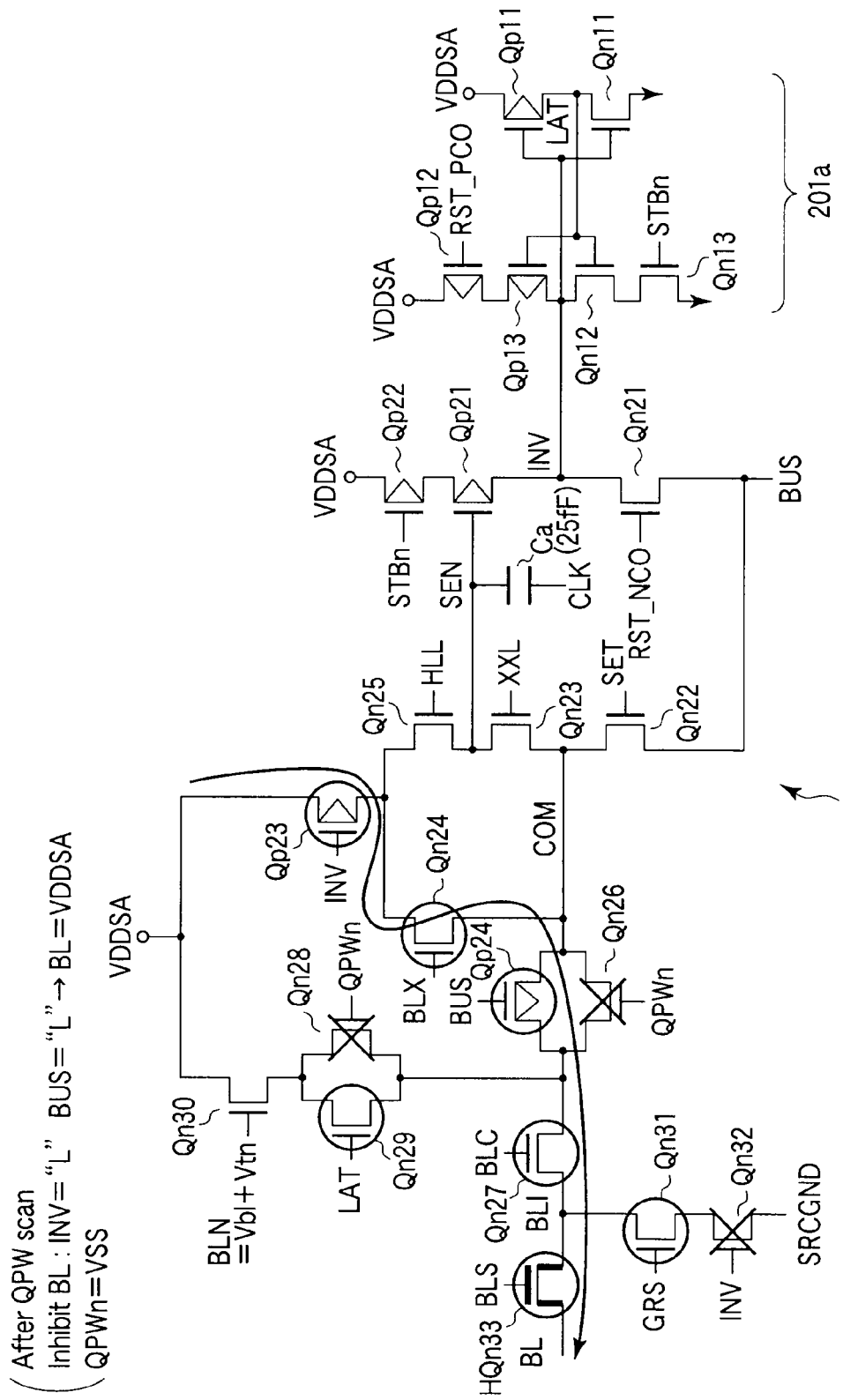

On the other hand, for the non-write bit line BL, for example, as shown in FIG. 22, the value of the signal BUS is set to "L" in accordance with the data in the external data latch 1. Thus, the value of the signal INV remains at "L". Therefore, when the arithmetic circuit 202 sets the values of the signals BLX, BLC, BLS, and GRS to "H", while setting the value of the signal QPWn to "L", the value of the signal BUS is set to "L", and the value of the signal LAT is set to "H". Thus, the non-write bit line BL is charged to increase the potential level of the non-write bit line BL to the voltage VDDSA via a path shown by an arrow in the figure. Thus, for the non-write memory cell MC, during the QPW operation, the voltage VDDSA can be continuously applied to between the floating gate FG and the channel region.

That is, after "QPW scan", if the non-write bit line BL is biased to the voltage VDDSA, the value of the signal bus BUS is set to "L". Thus, the value of the signal INV remains at "L". Thereafter, even when "Inhibit scan 2" is carried out with the value of the signal RST_NCO set to "H", the value of the signal BUS remains at "L" as is the case with "QPW scan". At this time, the signals are set as follows: QPWn=VSS, BLN=Vbl+Vtn, BLX=about 4.5 V, BLC=about 4.5 V, BLS=about 8 V, and GRS=VDD. Thus, when the signal INV="L" (that is, the signal LAT="H" and the signal BUS="L"), the bit line is charged via the path shown in the figure. As a result, the bit line BL is biased to the voltage VDDSA.

The bit line BL connected to the write completed flash memory cell MC with a threshold having passed the verify level VL is controlled similarly to the non-write bit line BL.

The above-described operation results as follows. The non-write bit line BL and the bit line connected to the write completed cell MC with a threshold having exceeded the verify level VL to pass the verification are maintained at the voltage VDDSA (for example, 2.2 V). The write bit line BL with a threshold having failed the verify low level VLL to fail the verification is maintained at the voltage VSS (0 V). The write bit line BL with a threshold having exceeded the verify low level VLL to pass the verification is maintained at the voltage Vbl (for example, 0.6 V).

Thereafter, the processing returns to step ST03 to repeat the above-described program operation (QPW operation) and verify operation until the appropriate data is written to all the selected memory cells MC (the thresholds of all the selected memory cells MC pass the verify level VL).

Table 1 shown below shows, in an easy-to-understand manner, the relationship between the bit line BL and the value of the signal BUS in the sense amplifier 201 during "Inhibit scan" and "QPW scan".

TABLE 1

|  | Inhibit scan | QPW scan |
| --- | --- | --- |
| Non-write BL | L | L |
| Write BL (having passed verify low level) | H | L |
| Write BL (having failed verify low level) | H | H |

As described above, in the QPW operation enabling a reduction in the distribution width of threshold of cell data without increasing the write time, possible miswrites resulting from an increase in the amount of leakage current from, for example, the contact hole electrodes of the bit lines associated with miniaturization of the flash memory cells can be prevented. That is, the bit lines BL can be simultaneously biased to any one of the three types of voltage values (VSS, Vbl, and VDDSA) by the respective sense amplifiers. Thus, in the QPW operation, the potential level of each non-write bit line BL can be biased to the voltage VDDSA. Hence, even if the amount of leakage current from the bit lines increases as a result of miniaturization of the flash memory cells, the potential level of each non-write bit line BL can be maintained at the voltage VDDSA. This enables possible miswrites to be avoided even if the potential level of the non-write bit line BL in the floating state decreases toward Vbl with increasing amount of bit line leakage current.

Furthermore, the required configuration can be easily implemented simply by adding the p-channel MOS transistors Qp 24 and the n-channel MOS transistors Qn26, Qn28, and Qn29 to the existing (conventional) sense amplifiers.

(Modification of the First Embodiment)

FIG. 23 shows another configuration example of the sense amplifier applied to the nonvolatile semiconductor memory device (NAND multilevel flash memory) according to the first embodiment. The same components as those in the first embodiment are denoted by the same reference numerals, and only differences from the first embodiment will be described. The main configuration and effects of the present sense amplifier are similar to those of the sense amplifier 201 and will thus not be described in detail.

A sense amplifier 201-1 in the present example corresponds to the sense amplifier 201 shown in the first embodiment and in which the n-channel MOS transistors Qn26 and Qn28 are replaced with p-channel MOS transistors Qp31 and Qp32.

In the sense amplifier 201 according to the first embodiment, the voltage VTH (about 4.5 V) needs to be continuously applied to the gates of the n-channel MOS transistors Qn26 and Qn28 as the signal QPWn at all times other than during the QPW operation. As a result, the withstand voltages of the n-channel MOS transistors Qn26 and Qn28 may pose a problem.

Thus, the withstand voltage problem can be solved by using the p-channel MOS transistors Qp31 and Qp32 as in the sense amplifier 201-1 in the present example. That is, the p-channel MOS transistors Qp31 and Qp32 allow the voltage VSS to be applied to the gates as the signal QPWn at all times other than during the QPW operation. This prevents the possibility of the withstand voltage problem occurring.

In particular, appropriate layout allows the p-channel MOS transistors Qp31 and Qn24 to share a junction. This enables a reduction in layout area.

(Second Embodiment)

Figure 24:
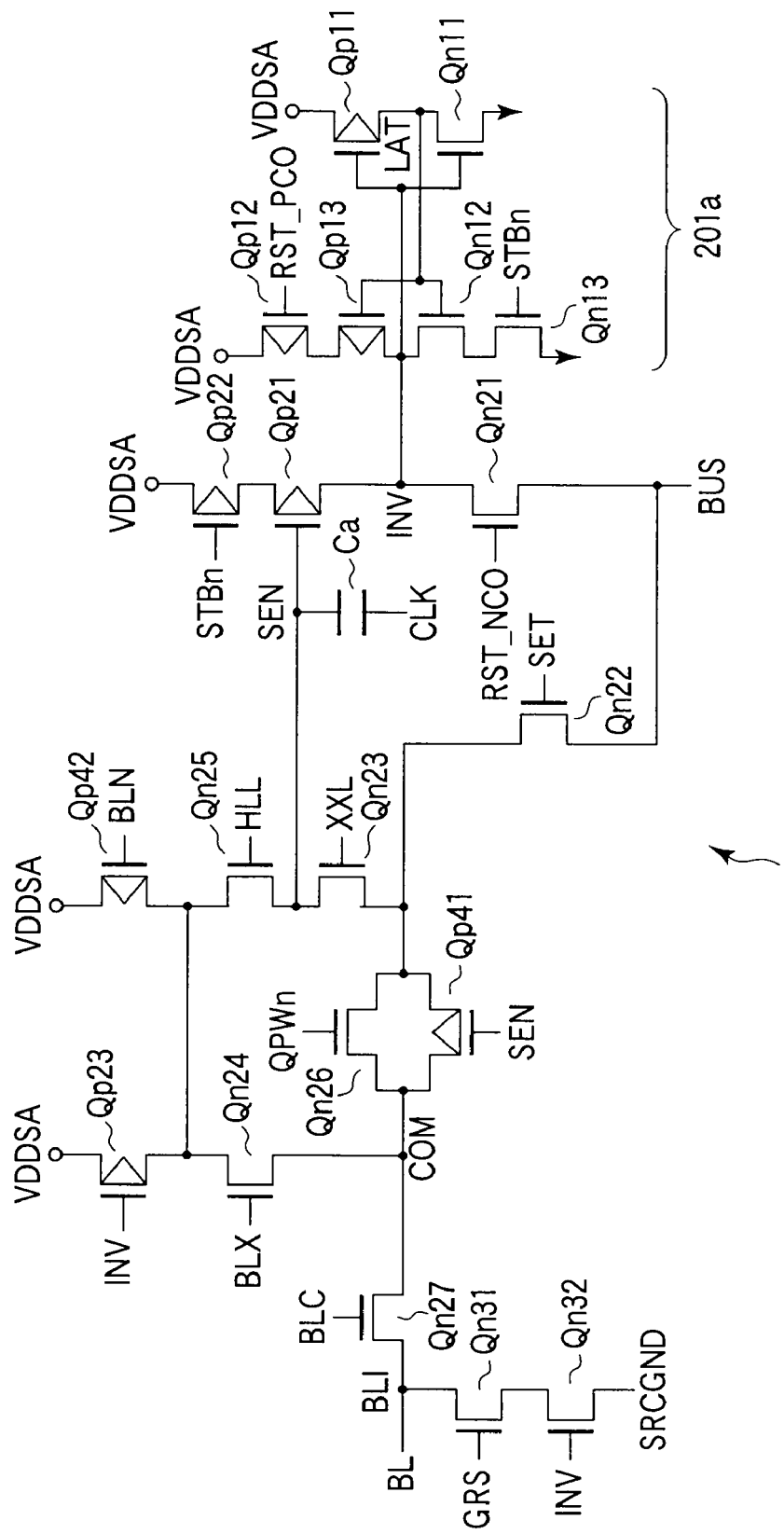
FIG. 24 is a circuit diagram showing a configuration example of a sense amplifier according to a second embodiment.

FIG. 24 shows a configuration example of a sense amplifier applied to a nonvolatile semiconductor memory device (NAND multilevel flash memory) according to a second embodiment. The same components as those in the first embodiment are denoted by the same reference numerals, and only differences from the first embodiment will be described. That is, the main configuration and effects of a sense amplifier 211 according to the second embodiment are similar to those of the sense amplifiers 201 and 201-1 and will thus not be described in detail.

As shown in FIG. 24, the sense amplifier 211 according to the second embodiment not only controls the data in a data latch circuit 203 (the result of the write verify operation stored in external data latches 1 and 2 and transmitted as the signal BUS) but also controls the potential level of a corresponding bit line BL based on the potential of a node SEN during a QPW operation. That is, depending on whether the corresponding bit line BL is a write bit line BL or a non-write bit line BL, the node SEN may be charged up to a voltage VDDSA or discharged down to a voltage VSS. Specifically, the connection point between current passages in p-channel MOS transistor Qn22 and Qn23 connects both to one end of a current passage in an re-channel MOS transistor Qn26 and to one end of a current passage in a p-channel MOS transistor Qp41; the n-channel MOS transistor Qn26 and the p-channel MOS transistor Qp41 are connected together in parallel. The connection point (node COM) between current passages in n-channel MOS transistors Qn24 and Qn27 connects both to the other end of the current passage in the n-channel MOS transistor Qn26 and to the other end of the current passage in the p-channel MOS transistor Qp41. A signal QPWn is provided to the gate of the n-channel MOS transistor Qn26. A signal SEN (the potential of the node SEN) is provided to the gate of the p-channel MOS transistor Qp41.

One end of the current passage in the p-channel MOS transistor Qp23 and one end of a current passage in a p-channel MOS transistor QP42 are connected both to the other end of a current passage in an n-channel MOS transistor Qn25 and to the other end of the current passage in the n-channel MOS transistor Qn24. The other end of the current passage in the p-channel MOS transistor Qp42 is connected to the power supply voltage VDDSA of the sense amplifier 211. A signal BLN is provided to the gate of the p-channel MOS transistor Qp42.

Furthermore, the other end (node BL1) of the current passage in the n-channel MOS transistor Qn27 is connected directly to the bit line BL.

In the sense amplifier 211 according to the second embodiment, the n-channel MOS transistor Qn26 is turned off only during the QPW operation. That is, a voltage VTH is applied to the gate of the n-channel MOS transistor Qn26 as a signal QPWn at all times other than during the QPW operation. Thus, the n-channel MOS transistor Qn26 is always electrically continuous. On the other hand, p-channel MOS transistor Qp41 is turned on and off depending on the potential of the node SEN.

As described above, the configuration that uses only the two MOS transistors Qn26 and Qp41 is also expected to exert effects almost similar to those of the sense amplifiers 201 and 201-1 according to the first embodiment.

Figure 25:
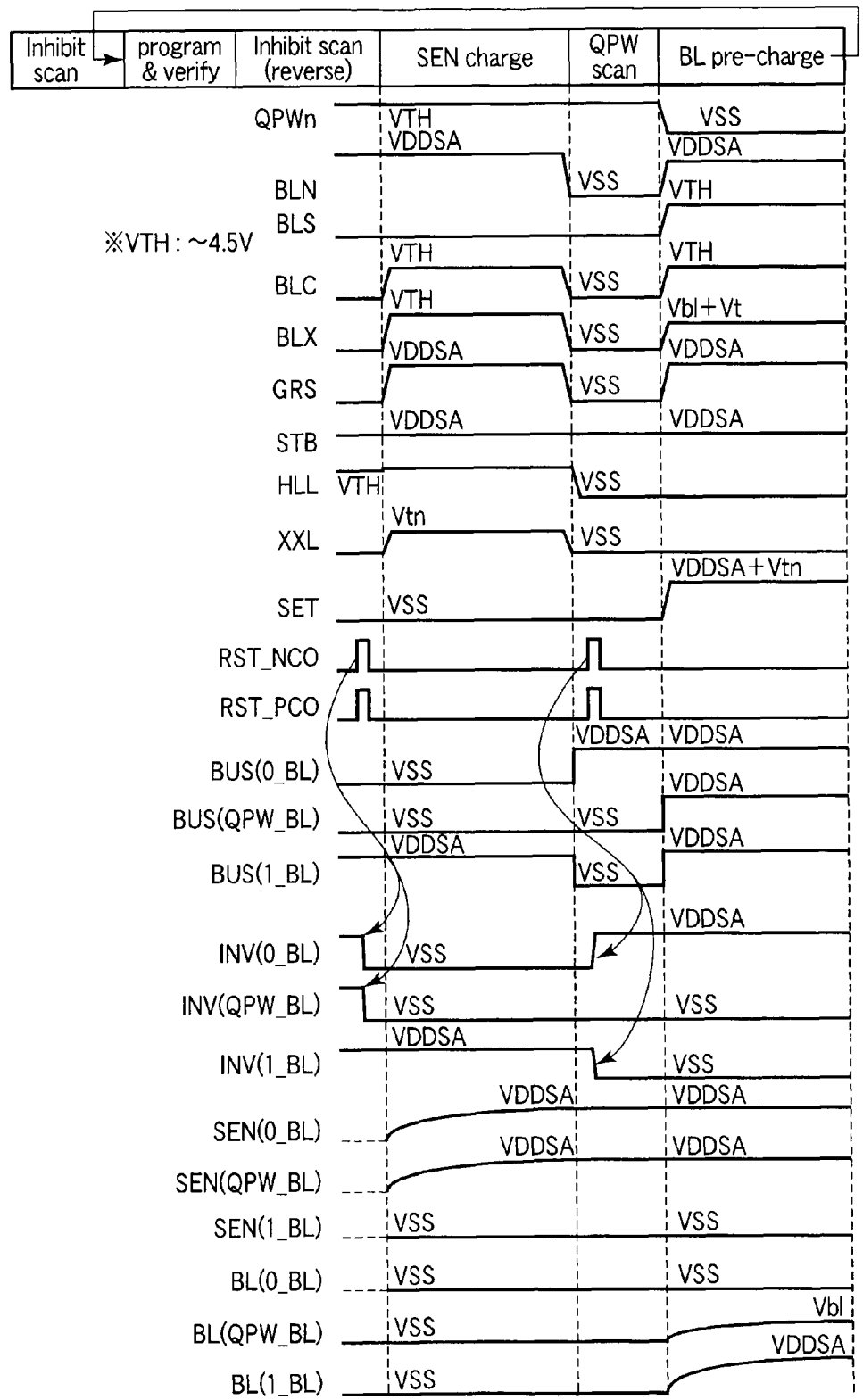
FIG. 25 is a timing flowchart illustrating the flow of a QPW operation during a program operation according to the second embodiment.

Now, the QPW operation during a program operation of the sense amplifier 211 configured as described above will be specifically described below, with reference to FIG. 25.

FIG. 26 shows a path via which after "Inhibit scan", the node SEN in the sense amplifier 211 corresponding to the non-write bit line BL is discharged to reduce the potential of the node SEN down to the voltage VSS. In this case, the arithmetic circuit 202 sets the signals as follows: QPWn=about 4.5 V, BLN=VDD, BLX=about 4.5 V, BLC=about 4.5 V, HLL=about 4.5 V, and GRS=VDD. Furthermore, the value of a signal INV is set to "H". The value of a signal XXL is set to "H". The value of a signal SET is set to "L". Thus, the n-channel MOS transistors Qn23, Qn24, Qn25, Qn26, and Qn27 and n-channel MOS transistors Qn31 and Qn32 are all turned on. The n-channel MOS transistor Qn22 and the p-channel MOS transistors Qp23 and Qp42 are turned off.

That is, execution of a normal "Inhibit scan" sets the signal INV in the sense amplifier corresponding to the non-write bit line BL to "L". However, the second embodiment uses inverted data for "Inhibit scan" to set the signal INV in the corresponding sense amplifier 211 to "H" (the value of the signal INV in the sense amplifier 211 corresponding to the write BL is set to "L"). Thus, the node SEN is discharged via the path shown by an arrow in the figure to reduce the potential of the node SEN down to the voltage VSS. That is, during the QPW operation, the voltage VSS is applied to the gate of the p-channel MOS transistor Qp41 in the corresponding sense amplifier 211 as the signal SEN to turn on the p-channel MOS transistor Qp41.

Figure 27:
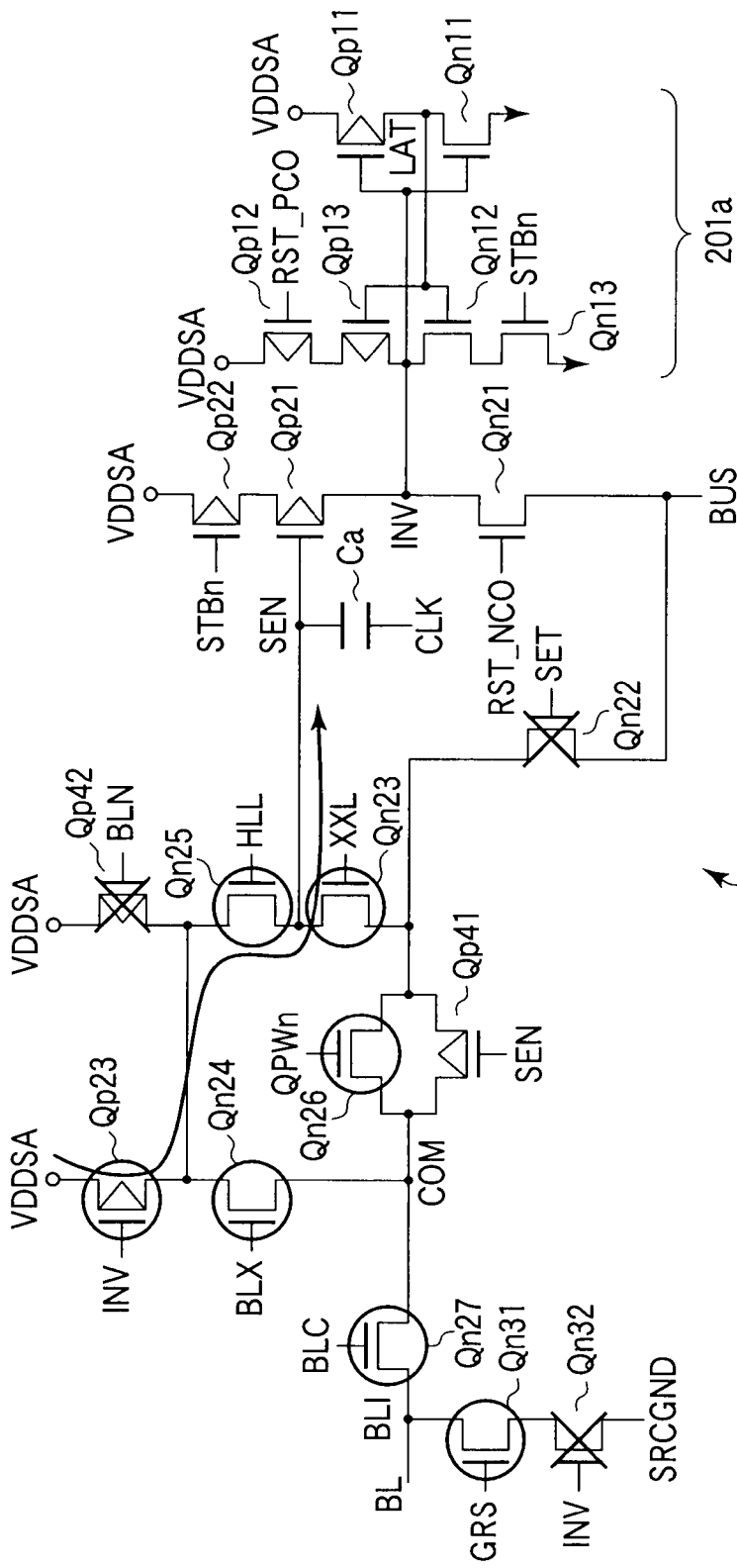

FIG. 27 shows a path via which after "Inhibit scan", the node SEN in the sense amplifier 211 corresponding to the write bit line BL is charged to increase the potential of the node SEN up to the voltage VDDSA. In this case, the arithmetic circuit 202 sets the signals as follows, as is the case with the non-write bit line BL: QPWn=about 4.5 V, BLN=VDD, BLX=about 4.5 V, BLC=about 4.5 V, HLL=about 4.5 V, and GRS=VDD. Furthermore, the value of the signal INV is set to "L". The value of the signal XXL is set to "H". The value of the signal SET is set to "L". Thus, the n-channel MOS transistors Qn23, Qn24, Qn25, Qn26, Qn27, and Qn31 are all turned on. The n-channel MOS transistors Qn22 and Qn32 and the p-channel MOS transistor Qp42 are turned off.

That is, execution of a normal "Inhibit scan" sets the signal INV in the sense amplifier corresponding to the write bit line BL to "H". However, the second embodiment uses inverted data for "Inhibit scan" to set the signal INV in the corresponding sense amplifier 211 to "L". Thus, the node SEN is charged via the path shown by an arrow in the figure to increase the potential of the node SEN up to the voltage VDDSA. That is, during the QPW operation, the voltage VDDSA is applied to the gate of the p-channel MOS transistor Qp41 in the corresponding sense amplifier 211. Thus, the p-channel MOS transistor Qp41 is turned off.

The above-described operation results as follows. The node SEN in the sense amplifier 211 corresponding to the non-write bit line BL is discharged to reduce the potential of the node SEN down to the voltage VSS. The node SEN in the sense amplifier 211 corresponding to each of the write bit lines BL (including the write bit lines BL each connected to the selected memory cell MC having passed the verify low level VLL) is charged to increase the potential of the node SEN up to the voltage VDDSA.

Now, the operation of the sense amplifier 211 will be described which is performed when the bit line BL is biased to each of the three different voltage values in accordance with the threshold of the cell data (the result of the write verify operation).

Figure 28:
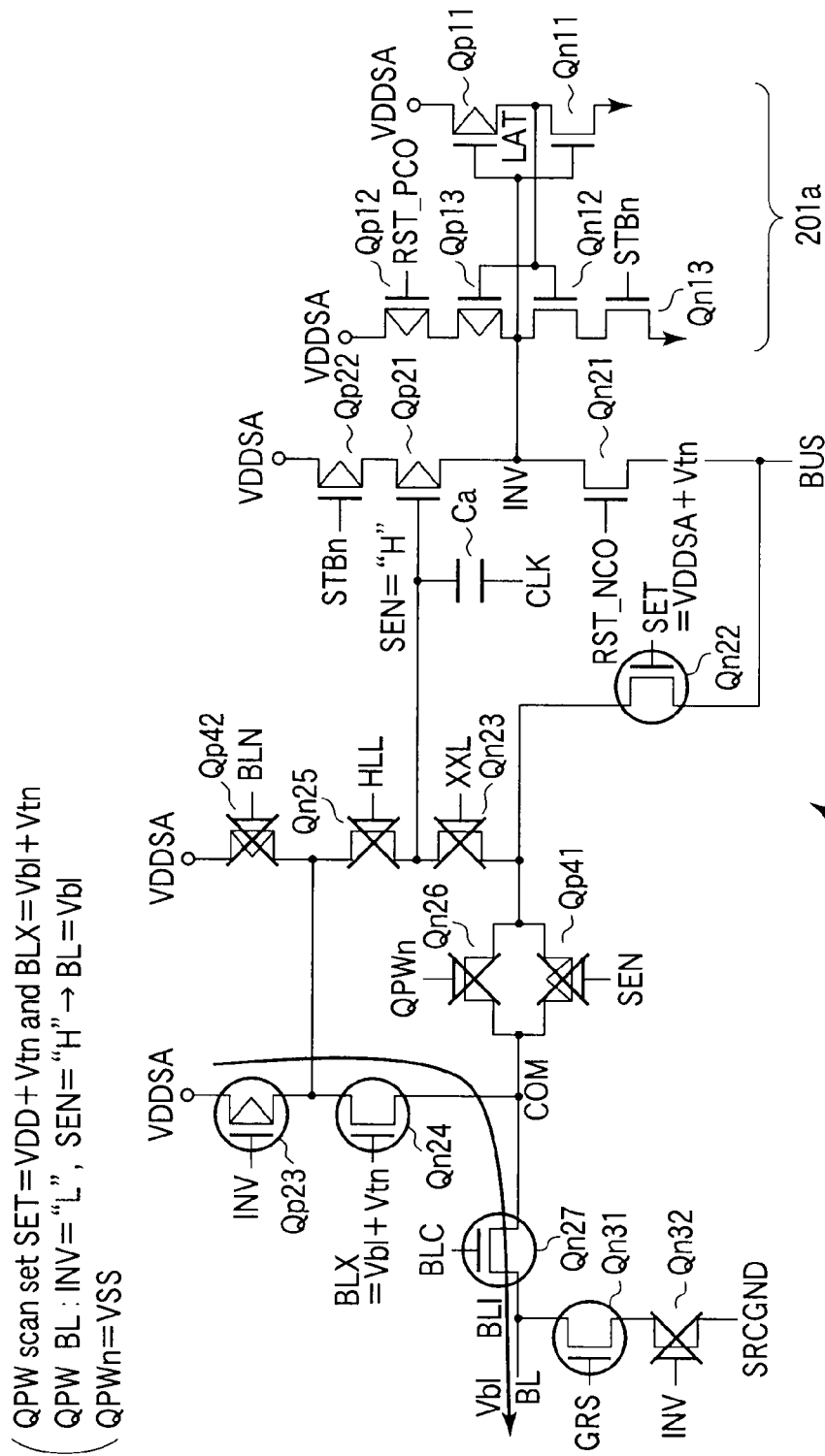

FIG. 28 shows a path in the sense amplifier 211 via which after "QPW scan", the potential level of the bit line BL having passed the verify low level VLL is biased to a voltage Vbl. When "QPW scan" is carried out, the arithmetic circuit 202 sets the value of the signal BUS in the corresponding sense amplifier 211 to "L" in accordance with the data stored in the external data latch 2 in the data latch circuit 203. Thus, the value of the signal INV is set to "L". Thereafter, the value of the signal BUS is set to "H (VDDSA)" in accordance with the data stored in the external data latch 1.

In this case, the arithmetic circuit 202 sets the signals as follows: QPWn=VSS, BLN=VDD, BLX=Vbl+Vtn, BLC=about 4.5 V, SET=VDD+Vtn, GRS=VDD, HLL=VSS, and XXL=VSS. Thus, when the signal INV="L" and the signal SEN="H", the bit line BL is charged along the path shown in the figure. Hence, the bit line BL is biased to the voltage Vbl clamped by the n-channel MOS transistor Qn24.

FIG. 29 shows a path in the sense amplifier 211 via which after "QPW scan", the potential level of the write bit line BL (which has failed the verify low level VLL) is biased to the voltage VSS. When "QPW scan" is carried out, the arithmetic circuit 202 sets the value of the signal BUS in the corresponding sense amplifier 211 to "H" in accordance with the data stored in the external data latch 2 in the data latch circuit 203. Thus, the value of the signal INV is set to "H". Thereafter, the value of the signal BUS is set to "H (VDDSA)" in accordance with the data stored in the external data latch 1.

In this case, the arithmetic circuit 202 sets the signals as follows: QPWn=VSS, BLN=VDD, BLX=Vbl+Vtn, BLC=about 4.5 V, SET=VDD+Vtn, GRS=VDD, HLL=VSS, and XXL=VSS. Thus, when the signal INV="H" and the signal SEN="H", the path via which the bit line BL is charged is cut off, and a discharge path is turned on. Hence, the bit line BL is biased to the voltage VSS (SRCGND).

Figure 30:
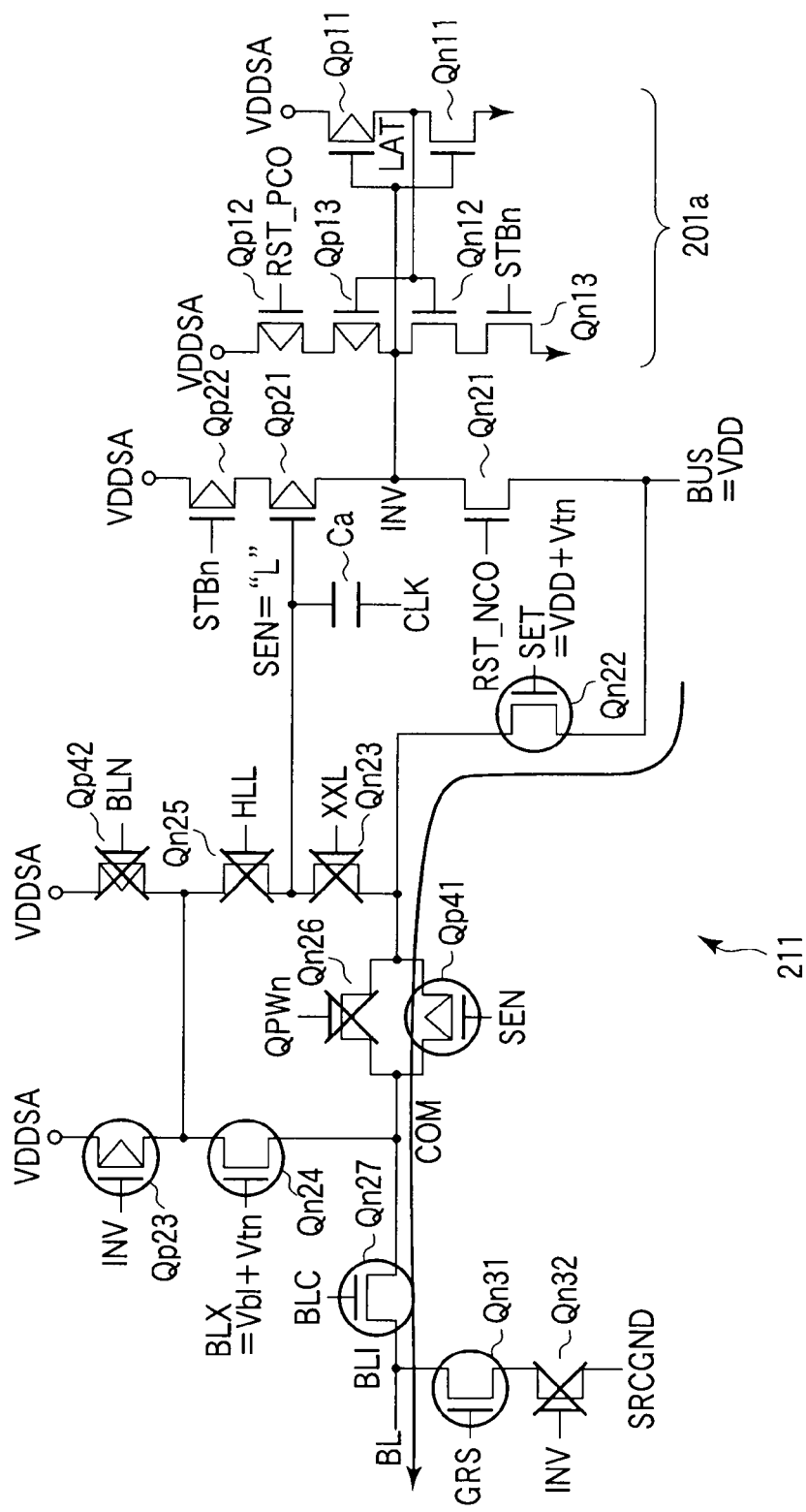

FIG. 30 shows a path in the sense amplifier 211 via which after "QPW scan", the non-write bit line BL is biased to the voltage VDDSA. When "QPW scan" is carried out, the arithmetic circuit 202 sets the value of the signal BUS in the corresponding sense amplifier 211 to "L" in accordance with the data stored in the external data latch 2 in the data latch circuit 203. Thus, the value of the signal INV is set to "L". Thereafter, the value of the signal BUS is set to "H (VDDSA)" in accordance with the data stored in the external data latch 1.

In this case, the arithmetic circuit 202 sets the signals as follows: QPWn=VSS, BLN=VDD, BLX=Vbl+Vtn, BLC=about 4.5 V, SET=VDD+Vtn, GRS=VDD, HLL=VSS, and XXL=VSS. Thus, when the signal INV="L" and the signal SEN="L", the bit line BL is charged via the path shown in the figure. Hence, the bit line BL is biased to the voltage VDDSA.

The bit line BL connected to the write completed flash memory cell MC with a threshold having passed the verify level VL is controlled similarly to the non-write bit line BL.

As described above, during the QPW operation, the sense amplifier 211 operates as follows. The non-write bit line and the write bit line BL connected to the write completed cell MC with a threshold having exceeded the verify level VL to pass the verification are maintained at the voltage VDDSA (for example, 2.2 V). The write bit line BL with a threshold having failed to exceed the verify low level VLL to fail the verification is maintained at the voltage VSS (0 V). The write bit line BL with a threshold having exceeded the verify low level VLL to pass the verification is maintained at the voltage Vbl (for example, 0.6 V).

Thus, as is the case with the first embodiment, in the QPW operation enabling a reduction in the distribution width of thresholds of cell data without increasing the write time, possible miswrites can be prevented which result from an increase in the amount of bit line leakage current associated with miniaturization of the flash memory cells.

This can also be accomplished by fewer MOS transistors than in the case of the sense amplifiers 201 and 201-1 according to the first embodiment.

In particular, the present embodiment enables the data latch circuit 203 to be shared by a plurality of (for example, eight) sense amplifiers 201, and is thus useful for reducing the area of the device.

(Modification of the Second Embodiment)

Figure 31:
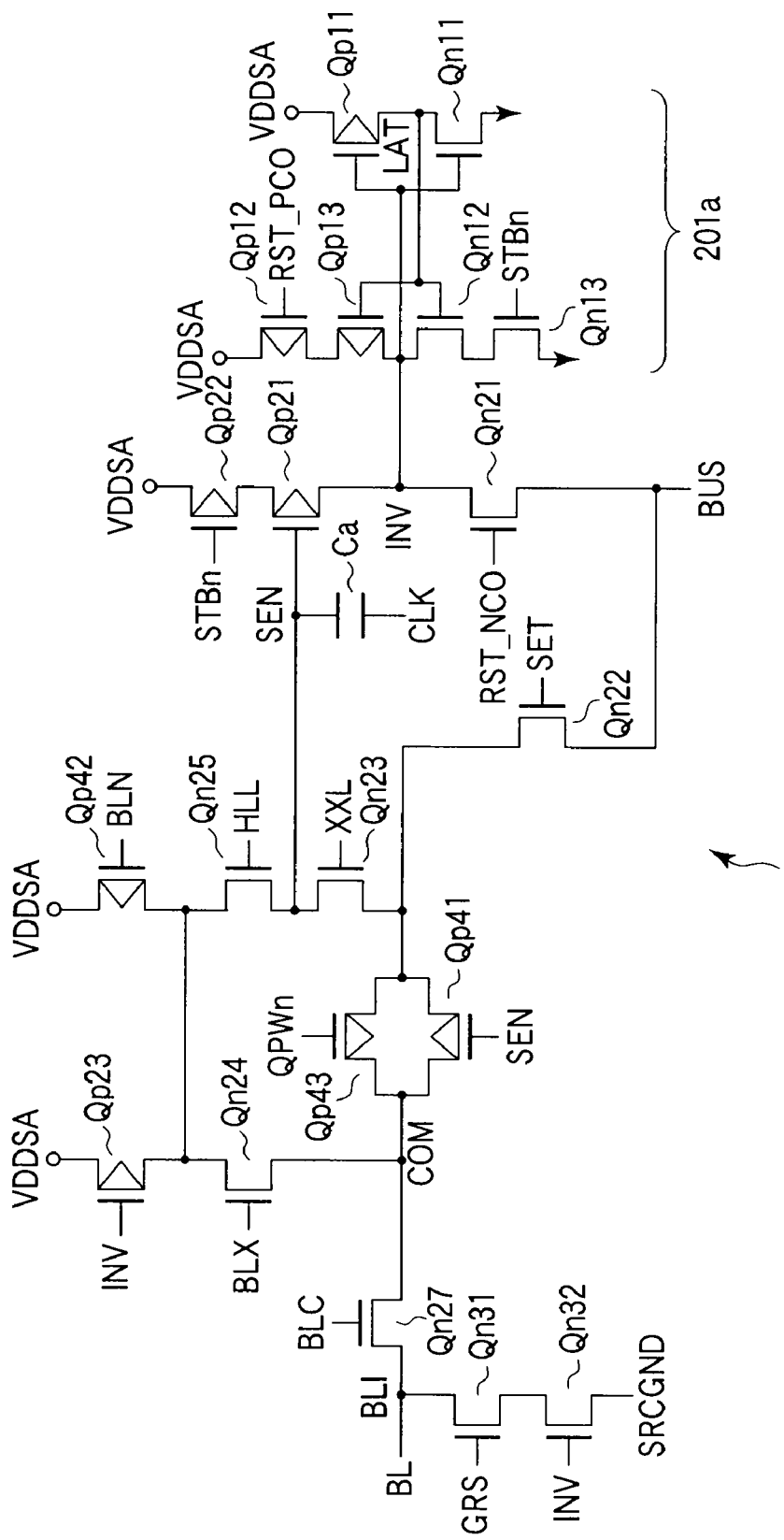
FIG. 31 is a circuit diagram showing another configuration example of the sense amplifier according to the second embodiment.

FIG. 31 shows another configuration example of the sense amplifier according to the second embodiment. The same components as those in the second embodiment are denoted by the same reference numerals, and only differences from the second embodiment will be described. The main configuration and effects of the present sense amplifier are similar to those of the sense amplifier 211 and will thus not be described in detail.

A sense amplifier 211-1 in the present example corresponds to the sense amplifier 211 shown in the second embodiment and in which the n-channel MOS transistor Qn26 is replaced with a p-channel MOS transistor Qp43.

In the sense amplifier 211 according to the second embodiment, the voltage VTH (about 4.5 V) needs to be continuously applied to the gates of the n-channel MOS transistor Qn26 as the signal QPWn at all times other than during the QPW operation. As a result, the withstand voltage of the n-channel MOS transistor Qn26 may pose a problem.

Thus, the withstand voltage problem can be solved by using the p-channel MOS transistor Qp43 as in the sense amplifier 211-1 in the present example. That is, the p-channel MOS transistor Qp43 allows the voltage VSS to be applied to the gate of each sense amplifier 211-1 as the signal QPWn at all times other than during the QPW operation. This prevents the possibility of the withstand voltage problem occurring.

In particular, appropriate layout allows the p-channel MOS transistor Qp43 to share a junction with a p-channel MOS transistor Qp41. This enables a reduction in layout area. (Third Embodiment)

FIG. 32 shows a configuration example of a sense amplifier applied to a nonvolatile semiconductor memory device (NAND multilevel flash memory) according to a third embodiment. A sense amplifier 212 according to the third embodiment controls the connection between a corresponding bit line BL and a common source line C-source in accordance with the potential of a node SEN during a QPW operation. The same components as those of the sense amplifiers 211 and 211-1 in the second embodiment are denoted by the same reference numerals, and only differences from the second embodiment will be described.

As shown in FIG. 32, in the sense amplifier 212 according to the third embodiment, n-channel MOS transistors Qn31 and Qn32 are connected together in series between a node COM and the common source line C-source. The node COM connects to current passages in n-channel MOS transistors Qn22, Qn23, Qn24, and Qn27 (a p-channel MOS transistor Qp41 and an n-channel MOS transistor Qn26 or a p-channel MOS transistor Qp43 are not present).

Moreover, n-channel MOS transistors Qn42 and Qn43 are connected together in series between the node COM and the connection point between current passages in the n-channel MOS transistors Qn31 and Qn32. That is, the n-channel MOS transistors Qn42 and Qn43 are connected in parallel with the n-channel MOS transistor Qn31. A signal QSW is provided to the gate of the n-channel MOS transistor Qn42. A signal SEN (the potential of a node SEN) is provided to the gate of the n-channel MOS transistor Qn43.

In the sense amplifier 212 according to the third embodiment, during the QPW operation, the n-channel MOS transistor Qn42 is turned on by setting the value of the signal QSW to "H". The n-channel MOS transistor Qn43 is turned on by setting the value of the signal SEN to "H", that is, charging the node SEL so as to increase the potential of the node SEN to a voltage VDDSA. That is, during the QPW operation (the value of the signal QSW is "H"), when the value of the signal INV is set to "H" and the value of the signal SEN is set to "H", the n-channel MOS transistors Qn32, Qn42, and Qn43 are turned on to make the bit line BL and the common source line C-source electrically continuous. Otherwise, the path connecting the bit line BL to the common source line C-source is blocked.

Figure 33:
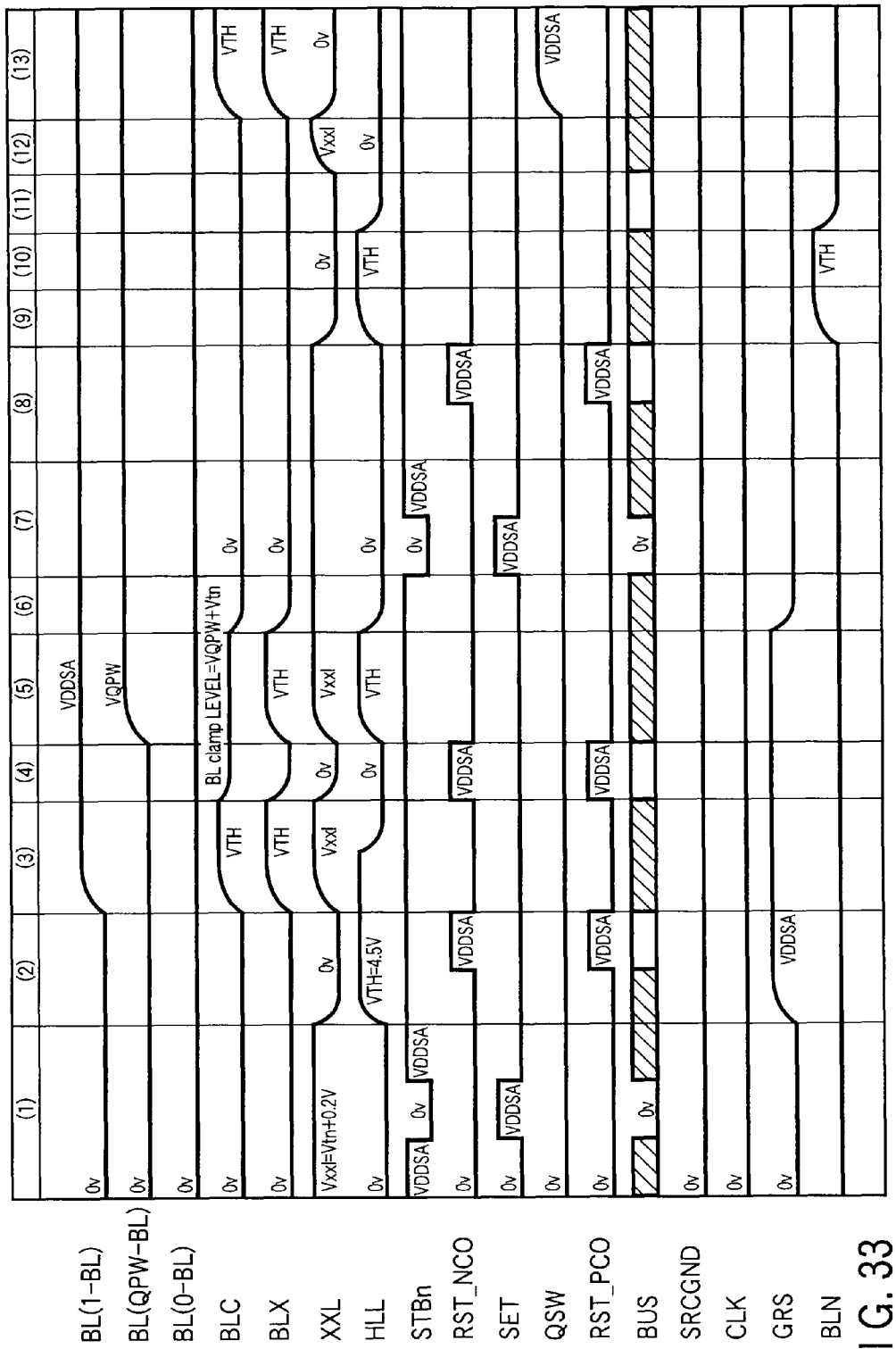
FIG. 33 is a timing flowchart illustrating the flow of a QPW operation during a program operation according to the third embodiment.

Now, the operation of the sense amplifier 212 configured as described above, which operation is performed when the bit line BL is biased to each of the three different voltage values, will be specifically described with reference to FIG. 33.

First, before a write pulse PP is applied to a word line WL (control gate CG), an arithmetic circuit 202 resets data in an internal latch circuit 201a in each of all the sense amplifiers 212 (signal INV="H"). Then, a signal RTS_NCO is set to "H" to turn on an n-channel MOS transistor Qn21. Thus, write data "1" or non-write data "0" from the data latch circuit 203 is loaded as a signal BUS and stored in the internal latch circuit 201a (Inhibit scan).

That is, as shown below in Table 2, for data write (0-BL or QPW-BL), the value of the signal INV in the corresponding sense amplifier 212 remains at "H". For data non-write (1-BL), the value of the signal INV is inverted to "L". Thus, for example, as shown in FIG. 34, the potential level of the bit line BL connected to the selected memory cell MC is biased to a voltage VSS (SRCGND). The potential level of the bit line BL connected to the unselected memory cell MC is biased to the power supply voltage VDDSA of the sense amplifier 212 ("BL pre-charge" (see (1), (2), and (3) in FIG. 33).

TABLE 2

|  | INV | BL | Force | BUS |
| --- | --- | --- | --- | --- |
| 0-BL | H | VSS | ○ | VDD |
| QPW-BL | H | VSS | ○ | VDD |
| 1-BL | H→L | VDDSA | ○ | VSS |

Figure 35:
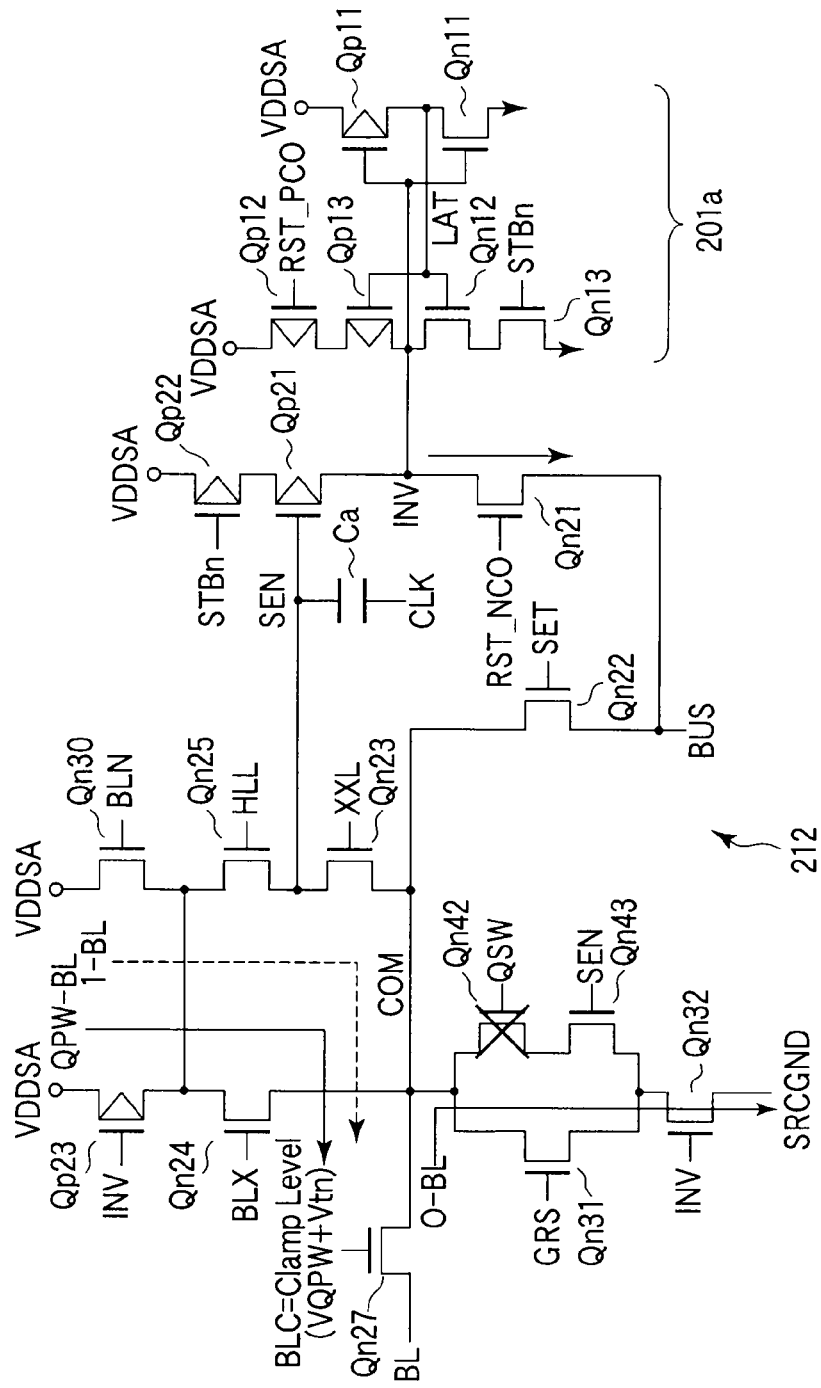

Thereafter, "QPW scan" is carried out to set the value of the signal INV in each sense amplifier 212 in accordance with the threshold of the cell data as shown below in Table 3. At the same time, a signal BLC provided to the gate of the n-channel MOS transistor Qn27 is set to VQPW+Vtn (Clamp Level). Thus, for example, as shown in FIG. 35, the potential level of a bit line QPW-BL having passed the verify low level VLL and being subjected to the QPW operation is biased to a voltage VQPW (=Vbl). A write bit line 0-BL is biased to the voltage VSS. Furthermore, a non-write bit line 1-BL is brought into a floating state for the following reason: since the potential of the node COM is set to the voltage VDDSA and the potential level of the non-write bit line 1-BL is set to the voltage VDDSA, the re-channel MOS transistor Qn27 is cut off (see (4) and (5) in FIG. 33).

TABLE 3

|  | INV | BL | Force | BUS |
| --- | --- | --- | --- | --- |
| 0-BL | H | VSS | ○ | VDD |
| QPW-BL | H→L | VQPW | ○ | VSS |
| 1-BL | L | VDDSA | FL | VSS |

Thus, the desired voltages (VSS/VQPW/VDDSA) are applied to all the bit lines BL in accordance with the thresholds of the cell data. In this case, the node SEN in each of all the sense amplifiers 212 is charged up to the voltage VDDSA.

Then, as shown below in Table 4, the values of signals BLC, BLX, HLL, and GRS are set to "L", and the value of a signal XXL is set to "H". Thus, only in the sense amplifiers 212 with the value of the signal INV set to "H", that is, the sense amplifiers 212 corresponding to the selected memory cell MC and unselected memory cell MC being subjected to the QPW operation, is the potential of the node SEM set equivalent to that of the node COM. Thus, for example, as shown in FIG. 36, the node SEN can be selectively discharged to reduce the potential of the node SEN by providing the voltage VSS as the signal BUS and setting the value of the signal SET to "H" (see (6), (7), and (8) in FIG. 33).

TABLE 4

|  | INV | BL | Force | SEN | BUS |
| --- | --- | --- | --- | --- | --- |
| 0-BL | H | VSS | FL | VSS | VDD |
| QPW-BL | H | VQPW | FL | VSS | VDD |
| 1-BL | H→L | VDDSA | FL | VSS | VSS |

Thereafter, for example, as shown in FIG. 37, the value of the signal XXL is set to "L", and the value of the signal HLL is set to "H". This allows the node SEN in each of all the sense amplifiers 212 to be charged to increase the potential of the node SEN (see Table 5 and (9) and (10) in FIG. 33).

TABLE 5

|  | INV | BL | Force | SEN |
| --- | --- | --- | --- | --- |
| 0-BL | H | VSS | FL | VDDSA |
| QPW-BL | H | VQPW | FL | VDDSA |
| 1-BL | L | VDDSA | FL | VDDSA |

Thereafter, for example, as shown in FIG. 38, the value of the signal HLL is set to "L", and the value of the signal XXL is set to "H". Then, in the corresponding sense amplifier 212, the potential levels of the bit line QPW-BL and non-write bit line 1-BL being subjected to the QPW operation are biased to the voltage VSS (see Table 6 and (11) and (12) in FIG. 33).

TABLE 6

|  | INV | BL | Force | SEN | BUS |
| --- | --- | --- | --- | --- | --- |
| 0-BL | H | VSS | FL | VDDSA | VDD |
| QPW-BL | H | VQPW | FL | VSS | VSS |
| 1-BL | L | VDDSA | FL | VSS | VSS |

Figure 39:
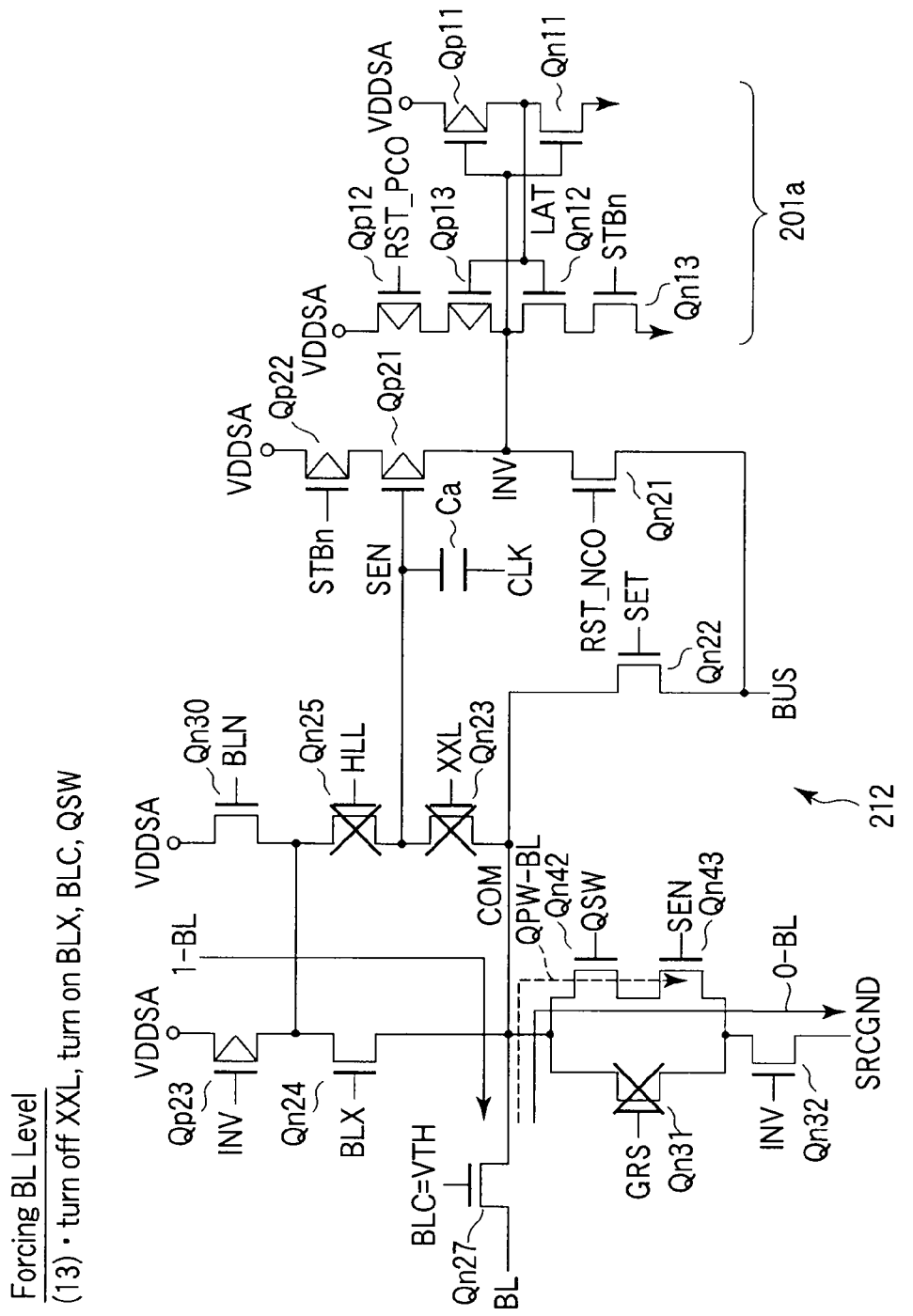

Then, for example, as shown in FIG. 39, the value of the signal XXL is set to "L", the values of the signals BLX and QSW are set to "H", and the signal BLC is set to the voltage VTH. Thus, the non-write bit line 1-BL is biased to the power supply voltage VDDSA because the potential of the node SEN is set to the voltage VSS. The write bit line 0-BL is made electrically continuous with the common source line C-source (=VSS) because the potential of the node SEN in the corresponding sense amplifier 212 is set to the voltage VDDSA. Furthermore, the bit line QPW-BL being subjected to the QPW operation is set to the floating state because the potential of the node SEN is set to the voltage VSS to block the path between the bit line QPW-BL and the common source line C-source ("Forcing BL Level) (see Table 7 and (13) in FIG. 33).

TABLE 7

|  | INV | BL | Force | SEN |
|---|---|---|---|---|
| 0-BL | H | VSS | ○ | VDDSA |
| QPW-BL | H | VQPW | FL | VSS |
| 1-BL | L | VDDSA | ○ | VSS |

As described above, the write pulse PP can be applied to the word line WL with the potential level of the bit line BL biased to VSS/VQPW/VDD in accordance with the result of the write verify operation, without the need for clock-up (CLK up). That is, the sense amplifier 212 according to the third embodiment enables the pre-biased potential level of the bit line BL to be maintained at the voltage VDDSA during the QPW operation.

Furthermore, the n-channel MOS transistor Qn43 with its gate controlled by the signal SEN is used to bias the potential level of the bit line BL to the voltage VSS. For example, if any n-channel MOS transistor is used to bias the potential level of the bit line BL to the voltage VDDSA, the potential of the node SEN needs to be raised by a signal CLK. In this case, since the potential of the node SEN increases, the withstand voltage of and possible leakage from the n-channel MOS transistor used needs to be taken into account.

In particular, in the configuration according to the third embodiment, if the node SEN fails to be charged or even if the node SEL is discharged, the bit line BL otherwise biased to the voltage VSS is brought into the floating state. This enables reliable prevention of a possible decrease in the voltage of the non-write bit line resulting from an increase in the amount of leakage current from bit line contacts (contact hole electrodes CB1 and CB2), which may cause miswrites.

(Modification of the Third Embodiment)

Figure 40:
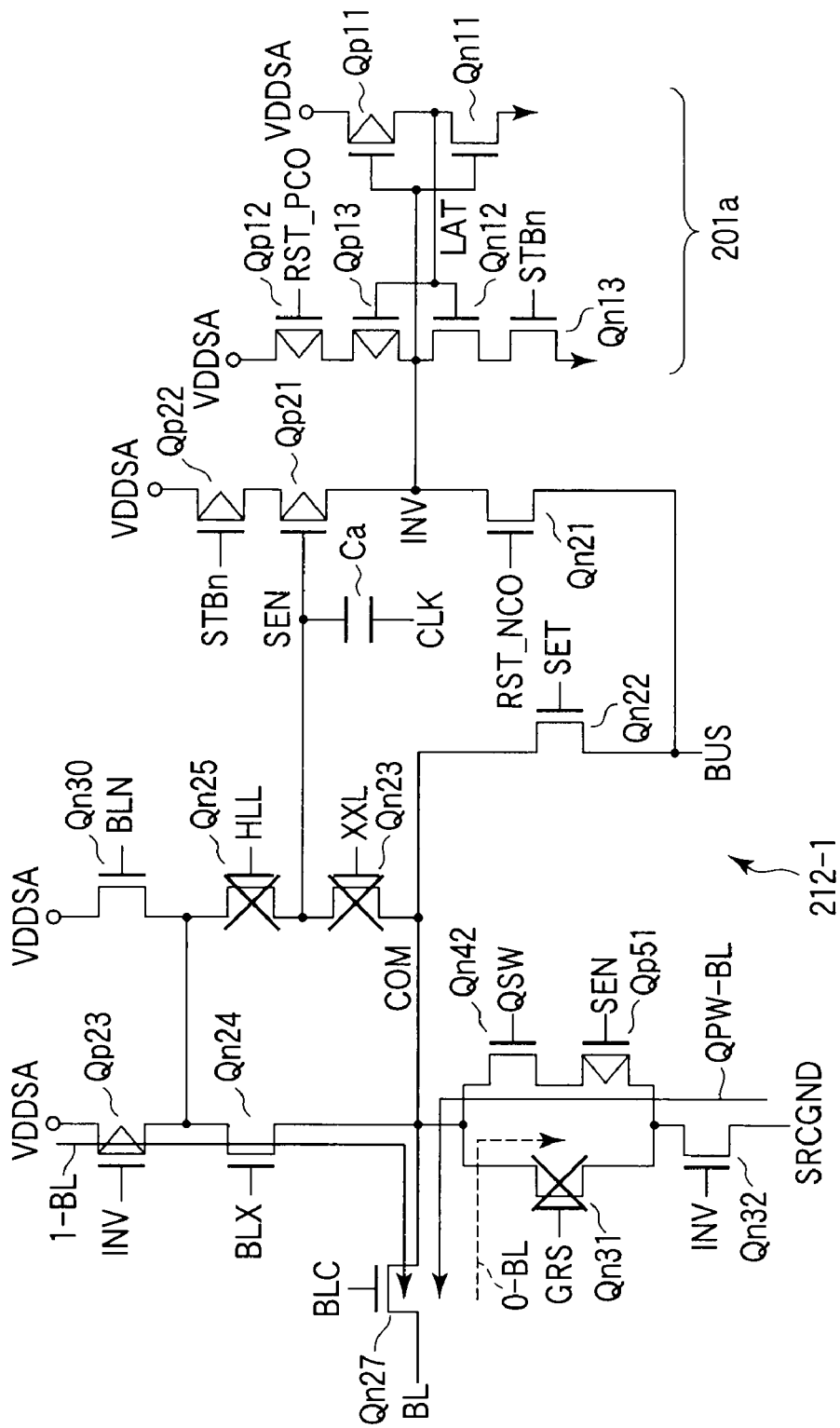
FIG. 40 is a circuit diagram showing another configuration example of the sense amplifier according to the third embodiment.
Figure 41:
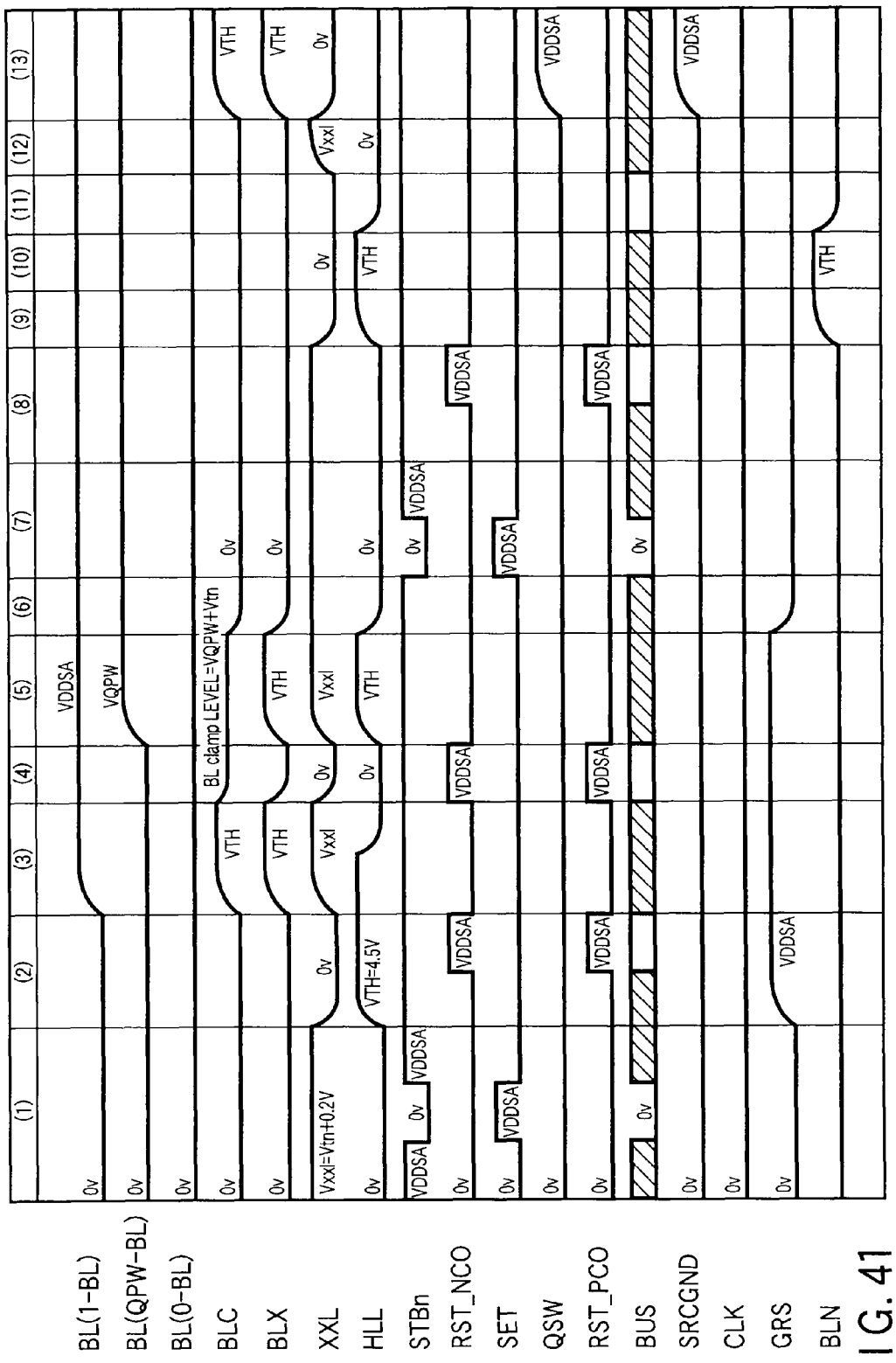
FIG. 41 is a timing flowchart illustrating the flow of the QPW operation during the program operation in the sense amplifier shown in FIG. 40.

FIG. 40 shows another configuration example of the sense amplifier according to the third embodiment. The same components as those in the third embodiment are denoted by the same reference numerals, and only differences from the third embodiment will be described. The main configuration and effects of the present sense amplifier are similar to those of the sense amplifier 212 and will thus not be described in detail.

A sense amplifier 212-1 in the present example corresponds to the sense amplifier 212 shown in the third embodiment and in which the n-channel MOS transistor Qn43 is replaced with a p-channel MOS transistor Qp51. Even in this configuration, the potential of the node SEN and the signal INV can be set in exactly the same order as that in the above-described third embodiment.

That is, if the potential level of the bit line BL is biased immediately before the write pulse PP is applied to the word line WL, the signal SEN is provided to the gate of a p-channel MOS transistor Qp51. However, as shown below in Table 8, in the sense amplifier 212-1 corresponding to the write bit line 0-BL, the potential of the node SEN is set to the voltage VDDSA. Thus, the path connecting the bit line BL to the common source line C-source is blocked.

Furthermore, the bit line QPW-BL having passed the verify low level VLL and being subjected to the QPW operation is made electrically continuous with the common source line C-source. Thus, the bit line QPW-BL can be biased to the voltage VQPW by setting the potential (SRCGND) of the common source line C-source to the voltage VDDSA and setting the signal QSW to VQPW+Vtn.

TABLE 8

|  | INV | BL | Force | SEN |
|---|---|---|---|---|
| 0-BL | H | VSS | ○ | VDDSA |
| QPW-BL | H | VQPW | FL | VSS |
| 1-BL | L | VDDSA | ○ | VSS |

That is, in the sense amplifier 212-1 connected to the non-write bit line 1-BL (and the bit line QPW-BL having passed the verify level VL and being subjected to the QPW operation), the potential SRCGND of the common source line C-source is allowed to be selectively set to the voltage VDDSA during the QPW operation. This enables the corresponding bit line 1-BL to be biased to the voltage VDDSA.

In any of the above-described embodiments, for example, as shown in FIG. 5, the NAND flash memory is arranged such that the two bit lines BLe and BLo share one sense amplifier circuit 200. Furthermore, by way of example, what is called a bit line shield scheme is used, in which a sense operation is performed separately for the bit line BLe and for the bit line BLo. However, the embodiment is not limited to this configuration. That is, the embodiment is also applicable to what is called an ABL (All Bit Line) scheme, in which one sense amplifier circuit is placed in association with each bit line and in which the sense operation is performed on all the bit lines at a time regardless of whether the bit line is even numbered or odd numbered.

If the sense amplifier is placed for each bit line, the sense operation can be performed separately for the even numbered bit lines and for the odd numbered bit lines. In particular, in the sense amplifiers 201, 201-1, 211, 2111-1, 212, and 212-1 configured as shown in the above-described embodiments, a read from the even numbered bit lines BLe and a read from the odd numbered bit lines BLo can be alternately carried out by controlling the n-channel MOS transistor Qn27 with its gate provided with the signal BLC, the p-channel MOS transistor Qp12 with its gate provided with the signal RST_PCO, the n-channel MOS transistor Qn21 provided with the signal RST_NCO, and the like, individually for the even numbered bit lines BLe and for the odd numbered bit lines BLo.

For example, the sense amplifier 201 configured as shown in FIG. 7 will be described by way of example. To allow a read from the even numbered bit lines BLe to be carried out, the sense amplifiers 201 connected to the even numbered bit lines BLe precharge the respective even numbered bit lines BLe, whereas the sense amplifiers 201 connected to the odd numbered bit lines BLo discharge the respective odd numbered bit lines BLo. In contrast, to allow a read from the odd numbered bit lines BLo to be carried out, the sense amplifiers 201 connected to the odd numbered bit lines BLo precharge the respective odd numbered bit lines BLo, whereas the sense amplifiers 201 connected to the even numbered bit lines BLe discharge the respective even numbered bit lines BLe.

More specifically, first, the value of the signal INV in each of all the sense amplifiers 201 is set to "H" (that is, the value of the signal SET is set to "H" to turn on the n-channel MOS transistor Qn22, thus allowing the node SEN to be discharged to reduce the potential of the node SEN. The value of the signal STBn is then set to "H" to turn on the n-channel MOS transistor Qn13. The p-channel MOS transistor Qp12 with its gate provided with the signal RST_PCO remains off).

Then, the values of the signals RST_NCO and RST_PCO are both set to "H" to turn on the n-channel MOS transistor Qn21 with its gate provided with the signal RST_NCO, while turning off the p-channel MOS transistor Qp12 with its gate provided with the signal RST_PCO. In this case, the value of the signal BUS is set to "VSS". Hence, only the value of the signal INV in each of the sense amplifiers 201 connected to the even numbered bit lines BLe changes from "H" to "L".

In this state, when prescribed potentials are provided which correspond to the values of the signals BLX, BLC, and BLS, respectively, since the value of the signal INV is "L", the even numbered bit lines BLe are charged up to a voltage determined by the potential of the n-channel MOS transistor Qn27 with its gate provided with the signal BLC.

On the other hand, for the odd numbered bit lines BLo, when the value of the signal INV in each of all the sense amplifiers 201 is set to "H", the n-channel MOS transistor Qn21 with its gate provided with the signal RST_NCO is turned off.

Then, the values of the signals RST_NCO and RST_PCO are both maintained at "L". Thus, the re-channel MOS transistor Qn21 with its gate provided with the signal RST_NCO remains off. The p-channel MOS transistor Qp12 with its gate provided with the signal RST_PCO remains on. In this case, the value of the signal INV in the sense amplifier 201 connected to the odd numbered bit line BLo is maintained at "H".

Therefore, in this state, even when the prescribed potentials are provided which correspond to the values of the signals BLX, BLC, and BLS, respectively, since the value of the signal INV is "H", the odd numbered bit line BLo is discharged to reduce the potential level of the odd numbered bit line to the voltage VSS.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device comprising:
 a plurality of nonvolatile memory cells configured to enable data to be rewritten;
 a plurality of bit lines connected to the plurality of nonvolatile memory cells;
 a write circuit configured to control write voltages provided to the plurality of nonvolatile memory cells to write data to a selected memory cell; and
 a plurality of sense amplifiers configured to bias the bit line to which the selected memory cell is connected, to a first voltage until a threshold of the selected memory cell reaches the value of a first write state, and when the threshold of the selected memory cell reaches the value of the first write state, to bias the bit line to which the selected memory cell is connected, to a second voltage higher than the first voltage, and when the threshold of the selected memory cell reaches the value of a second write state, to continuously bias the bit line to which the selected memory cell is connected, to a third voltage higher than the second voltage, while continuously biasing bit lines connected to unselected memory cells corresponding to the memory cells other than the selected one, to the third voltage.

2. The device according to claim 1, wherein the write circuit repeats the write of the data while gradually increasing the write voltage.

3. The device according to claim 1, further comprising an external latch circuit configured to store information indicating whether or not the threshold of the selected memory cell has reached the value of the first write state,
 wherein each of the plurality of sense amplifiers comprises an internal latch circuit, a first n-channel MOS transistor configured to be turned off when latch data in the internal latch circuit is at a low level and to be turned on when the latch data in the internal latch circuit is at a high level, a first p-channel MOS transistor configured to be turned off when the latch data in the external latch circuit is at the high level and to be turned on when the latch data in the external latch circuit is at the low level, and a second n-channel MOS transistor and a third n-channel MOS transistor both configured to be turned on when the latch data in the external latch circuit is at the high level and to be turned off when the latch data in the external latch circuit is at the low level.

4. The device according to claim 3, wherein the first and second n-channel MOS transistors supply the second and third voltages to the bit line, and the first p-channel MOS transistor and the third n-channel MOS transistor transfer data from the bit line to the internal latch circuit.

5. The device according to claim 4, wherein the plurality of sense amplifiers are configured to turn off the first n-channel MOS transistor and turn on the second and third n-channel MOS transistors and the first p-channel MOS transistor in order to bias the bit line to which the selected memory cell is connected, to the first voltage,
 to turn on the first n-channel MOS transistor and turn off the second and third n-channel MOS transistors and the first p-channel MOS transistor in order to bias the bit line to which the selected memory cell is connected, to the second voltage, and
 to turn on the first, second, and third n-channel MOS transistors and the first p-channel MOS transistor in order to bias the bit line to which the selected memory cell is connected, to the third voltage.

6. The device according to claim 1, further comprising an external latch circuit configured to store information indicating whether or not the threshold of the selected memory cell has reached the value of the first write state,
 wherein each of the plurality of sense amplifiers comprises an internal latch circuit, a first n-channel MOS transistor configured to be turned off when latch data in the internal latch circuit is at a low level and to be turned on when the latch data in the internal latch circuit is at a high level, and a first p-channel MOS transistor, a second p-channel MOS transistor, and a third p-channel MOS transistor all configured to be turned off when the latch data in the internal latch circuit is at the high level and to be turned on when the latch data in the internal latch circuit is at the low level.

7. The device according to claim 6, wherein the first n-channel MOS transistor and the first p-channel MOS transistor supply the second and third voltages to the bit line, and the second and third p-channel MOS transistors transfer data from the bit line to the internal latch circuit.

8. The device according to claim 7, wherein the plurality of sense amplifiers are configured to turn off the first n-channel MOS transistor and turn on the first, second, and third p-channel MOS transistors in order to bias the bit line to which the selected memory cell is connected, to the first voltage,
- to turn on the first n-channel MOS transistor and turn off the first, second, and third p-channel MOS transistors in order to bias the bit line to which the selected memory cell is connected, to the second voltage, and
- to turn on the first n-channel MOS transistor and the first, second, and third p-channel MOS transistors in order to bias the bit line to which the selected memory cell is connected, to the third voltage.

9. The device according to claim 1, further comprising an external latch circuit configured to store information indicating whether or not the threshold of the selected memory cell has reached the value of the first write state,
- wherein each of the plurality of sense amplifiers comprises a first n-channel MOS transistor configured to be turned on when latch data in the external latch circuit is at a high level and to be turned off when the latch data in the external latch circuit is at a low level, and a first p-channel MOS transistor configured to be turned on when a first node is at the low level and to be turned off when the first node is at the high level, and
- the first node is set to the low level for write and to the high level for non-write.

10. The device according to claim 9, wherein the first n-channel MOS transistor and the first p-channel MOS transistor supply the third voltage to the bit line, and transfer data from the bit line to the first node.

11. The device according to claim 10, wherein the plurality of sense amplifiers are configured to turn off the first n-channel MOS transistor and the first p-channel MOS transistor in order to bias the bit line to which the selected memory cell is connected, to the first voltage,
- to turn off the first n-channel MOS transistor and the first p-channel MOS transistor in order to bias the bit line to which the selected memory cell is connected, to the second voltage, and
- to turn off the first n-channel MOS transistor and turn on the first p-channel MOS transistor in order to bias the bit line to which the selected memory cell is connected, to the third voltage.

12. The device according to claim 1, further comprising an external latch circuit configured to store information indicating whether or not the threshold of the selected memory cell has reached the value of the first write state,
- wherein each of the plurality of sense amplifiers comprises a first p-channel MOS transistor configured to be turned off when latch data in the external latch circuit is at a high level and to be turned on when the latch data in the external latch circuit is at a low level, and a second p-channel MOS transistor configured to be turned on when a first node configured to be set to the low level for write and to the high level for non-write is at the low level, and to be turned off when the first node is at the high level.

13. The device according to claim 12, wherein the first and second p-channel MOS transistors supply the third voltage to the bit line, and transfer data from the bit line to the first node.

14. The device according to claim 13, wherein the plurality of sense amplifiers are configured to turn off the first and second p-channel MOS transistors in order to bias the bit line to which the selected memory cell is connected, to the first voltage,
- to turn off the first and second p-channel MOS transistors in order to bias the bit line to which the selected memory cell is connected, to the second voltage, and
- to turn off the first p-channel MOS transistor and turn on the second p-channel MOS transistor in order to bias the bit line to which the selected memory cell is connected, to the third voltage.

15. The device according to claim 1, further comprising an external latch circuit configured to store information indicating whether or not the threshold of the selected memory cell has reached the value of the first write state,
- wherein each of the plurality of sense amplifiers comprises a first n-channel MOS transistor configured to be turned on when latch data in the external latch circuit is at a high level and to be turned off when the latch data in the external latch circuit is at a low level, and a second n-channel MOS transistor configured to be turned on when a first node configured to be set to the high level for write and to the low level for non-write is at the high level, and to be turned off when the first node is at the low level.

16. The device according to claim 15, wherein the first and second n-channel MOS transistors supply the first voltage to the bit line.

17. The device according to claim 16, wherein the plurality of sense amplifiers are configured to turn on the first and second n-channel MOS transistors in order to bias the bit line to which the selected memory cell is connected, to the first voltage,
- to turn on the first and second n-channel MOS transistors in order to bias the bit line to which the selected memory cell is connected, to the second voltage, and
- to turn off the first n-channel MOS transistor and turn on the second n-channel MOS transistor in order to bias the bit line to which the selected memory cell is connected, to the third voltage.

18. The device according to claim 1, further comprising an external latch circuit configured to store information indicating whether or not the threshold of the selected memory cell has reached the value of the first write state,
- wherein each of the plurality of sense amplifiers comprises a first n-channel MOS transistor configured to be turned on when latch data in the external latch circuit is at a high level and to be turned off when the latch data in the external latch circuit is at a low level, and a first p-channel MOS transistor configured to be turned on when a first node configured to be set to the low level for write and to the high level for non-write is at the low level, and to be turned off when the first node is at the high level.

19. The device according to claim 18, wherein the first n-channel MOS transistor and the first p-channel MOS transistor supply the first voltage to the bit line.

20. The device according to claim 19, wherein the plurality of sense amplifiers are configured to turn on the first n-channel MOS transistor and the first p-channel MOS transistor in order to bias the bit line to which the selected memory cell is connected, to the first voltage,
- to turn on the first n-channel MOS transistor and the first p-channel MOS transistor in order to bias the bit line to which the selected memory cell is connected, to the second voltage, and
- to turn off the first n-channel MOS transistor and turn on the first p-channel MOS transistor in order to bias the bit line to which the selected memory cell is connected, to the third voltage.

21. A write method for a nonvolatile semiconductor memory device, the method comprising:
- biasing a bit line to which a selected memory cell is connected, to a first voltage until a threshold of the selected memory cell reaches the value of a first write state;

when the threshold of the selected memory cell reaches the value of the first write state, biasing the bit line to which the selected memory cell is connected, to a second voltage higher than the first voltage; and when the threshold of the selected memory cell reaches the value of a second write state, continuously biasing the bit line to which the selected memory cell is connected, to a third voltage higher than the second voltage, while continuously biasing bit lines connected to unselected memory cells corresponding to the memory cells other than the selected one, to the third voltage.

* * * * *